(12) United States Patent
Itoh

(10) Patent No.: US 6,789,137 B2
(45) Date of Patent: Sep. 7, 2004

(54) SEMICONDUCTOR MEMORY DEVICE ALLOWING REDUCTION OF I/O TERMINALS

(75) Inventor: Takashi Itoh, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/364,328

(22) Filed: Feb. 12, 2003

(65) Prior Publication Data

US 2004/0047220 A1 Mar. 11, 2004

(30) Foreign Application Priority Data

Sep. 5, 2002  (JP) ........................................ 2002-260150

(51) Int. Cl.[7] .............................................. G06F 13/14
(52) U.S. Cl. .................. 710/14; 711/100; 711/101; 711/154; 711/170; 711/173
(58) Field of Search ............................ 710/14; 711/100, 711/101, 154, 170, 173

(56) References Cited

U.S. PATENT DOCUMENTS 4,873,669 A * 10/1989 Furutani et al. ....... 365/189.01
5,113,511 A * 5/1992 Nelson et al. ............... 711/104
6,181,613 B1 * 1/2001 Yoshida ...................... 365/191
6,249,837 B1 * 6/2001 Tsuchiya et al. ............ 711/100

FOREIGN PATENT DOCUMENTS

| JP | P2000-76848 A | 3/2000 |
|---|---|---|
| JP | P2000-100170 A | 4/2000 |

* cited by examiner

*Primary Examiner*—A. Elamin
(74) *Attorney, Agent, or Firm*—McDermott Will & Emery LLP

(57) ABSTRACT

A semiconductor memory device includes an address buffer, a clock buffer, a control signal buffer, a control circuit, a mode register, a memory cell array, a signal select circuit, a DLL, an I/O buffer and a QS buffer. The mode register provides a signal at H- or L-level to the signal select circuit. The signal select circuit selects a data strobe signal sent from an I/O terminal in accordance with the signal at L-level, and provides it to the QS buffer. The signal select circuit selects a clock sent from an I/O terminal in accordance with the signal at H-level, and provides it to the QS buffer.

16 Claims, 32 Drawing Sheets

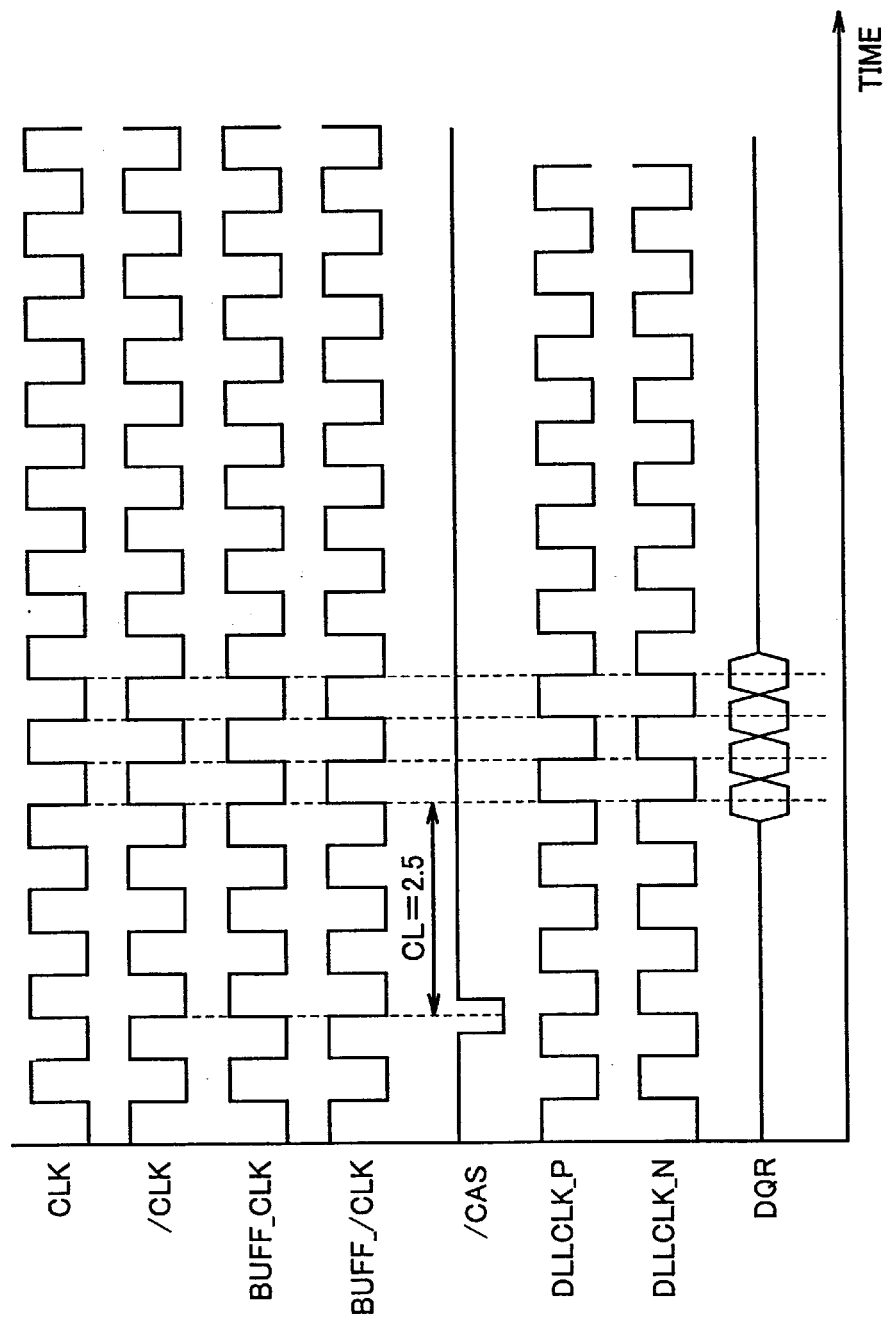

SEMICONDUCTOR MEMORY DEVICE ALLOWING REDUCTION OF I/O TERMINALS

BACKGROUND OF THE INVENTION

1. Field of the Invention

The present invention relates to a semiconductor memory device, and particularly to a semiconductor memory device allowing reduction of I/O terminals in a slow operation mode.

2. Description of the Background Art

A DDR-SDRAM (Double Data Rate Synchronous Dynamic Random Access Memory) is now available as a semiconductor memory device, which has a large capacity and can perform fast input/output of data.

Referring to FIG. 33, a DDR-SDRAM 200 includes an address buffer 210, a clock buffer 220, a control signal buffer 230, a control circuit 240, a mode register 250, a memory cell array 260, a DLL (Delay Locked Loop) 270, an I/O buffer 280, a QS buffer 290 and data buses BS1 and BS2.

Address buffer 210 externally receives addresses A0–A12 and bank addresses BA0 and BA1, and buffers received addresses A0–A12 and bank addresses BA0 and BA1. Address buffer 210 provides buffered addresses A0–A12 and bank addresses BA0 and BA1 to control circuit 240 in synchronization with clocks BUFF_CLK and BUFF_/CLK sent from clock buffer 220.

Clock buffer 220 externally receives clocks CLK and /CLK as well as a clock enable signal CKE, and buffers received clocks CLK and /CLK as well as received clock enable signal CKE with an internal reference voltage INTVREF. Reference voltage INTVREF has the same voltage as an externally received reference voltage VREF. Clock buffer 220 provides buffered clocks BUFF_CLK and BUFF_/CLK to control signal buffer 230, control circuit 240 and DLL 270, and provides buffered clock enable signal CKE to control circuit 240.

Control signal buffer 230 externally receives a chip select signal /CS, a row address strobe signal /RAS, a column address strobe signal /CAS, a write enable signal /WE and a data mask signal DM, and buffers the received control signals such as chip select signal /CS with reference voltage INTVREF. Control signal buffer 230 provides the buffered control signals such as chip select signal /CS to control circuit 240 in synchronization with clocks BUFF_CLK and BUFF_/CLK sent from clock buffer 220.

Control circuit 240 determines the next rising of clocks BUFF_CLK and BUFF_/CLK as valid if clock enable signal CKE was at an H (logical high) level at the time of rising of clocks BUFF_CLK and BUFF_/CLK received from clock buffer 220. If clock enable signal CKE was at an L (logical low) level at the time of rising of clocks BUFF_CLK and BUFF_/CLK, control circuit 240 determines the next rising of clocks BUFF_CLK and BUFF_/CLK as invalid.

When clocks BUFF_CLK and BUFF_/CLK are determined as valid, control circuit 240 controls semiconductor memory device 200 based on chip select signal /CS, row address strobe signal /RAS, column address strobe signal /CAS, write enable signal /WE and data mask signal DM received from control signal buffer 230.

More specifically, control circuit 240 recognizes the selection of semiconductor memory device 200 based on chip select signal ICS at L-level, and recognizes the nonselection of semiconductor memory device 200 based on chip select signal /CS at H-level. Control circuit 240 selects one of all of a plurality of banks included in memory cell array 260 based on bank addresses BA0 and BA1 sent from address buffer 210. Further, control circuit 240 determines addresses A0–A12, which are received from address buffer 210 in accordance with the timing of switching of row address strobe signal /RAS from H-level to L-level, as a row address, and provides the row address to memory cell array 260 in synchronization with clocks BUFF_CLK and BUFF_/CLK sent from clock buffer 220.

Further, control circuit 240 determines addresses A0–A12, which are received from address buffer 210 in accordance with the timing of switching of column address strobe signal /CAS from H-level to L-level, as a column address, and provides the column address to memory cell array 260 in synchronization with clocks BUFF_CLK and BUFF_/CLK sent from clock buffer 220.

Control circuit 240 recognizes the data write mode or data read mode based on write enable signal /WE. In the write mode, control circuit 240 controls I/O buffer 280 such that write data sent from I/O terminals DQ0–DQ7 may be provided to memory cell array 260 in synchronization with an internal data strobe signal INTDQS sent from QS buffer 290, and also controls QS buffer 290 such that internal data strobe signal INTDQS prepared by buffering an externally supplied data strobe signal DQS is provided to I/O buffer 280. In the read mode, control circuit 240 controls I/O buffer 280 such that the data read from memory cell array 260 via data bus BS2 is provided to I/O terminals DQ0–DQ7 in synchronization with period signal DLLCLK_P or DLLCLK_N sent from DLL 270, and also controls QS buffer 290 such that period signal DLLCLK_P or DLLCLK_N sent from DLL 270 is provided to an I/O terminal DQS.

Control circuit 240 controls I/O buffer 280 based on data mask signal DM. More specifically, control circuit 240 operates in the write mode to control I/O buffer 280 based on data mask signal DM at H-level such that the write data may not be written into memory cell array 260 while data mask signal DM is at H-level, and to control I/O buffer 280 based on data mask signal DM at L-level such that all the write data may be written into memory cell array 260. Further, control circuit 240 operates in the read mode to deactivate I/O buffer 280 based on data mask signal DM at H-level and to activate I/O buffer 280 based on data mask signal DM at L-level.

Further, control circuit 240 controls the timing for actually reading the data after instruction of the data read operation based on a CAS latency set by mode register 250, and activates or deactivates DLL 270 in accordance with the instruction sent from mode register 250.

Mode register 250 sets a CAS latency CL and provides it to control circuit 240. Mode register 250 instructs control circuit 240 to activate or deactivate DLL 270.

Memory cell array 260 includes the plurality of banks, and stores the data.

DLL 270 produces period signals DLLCLK_P and DLLCLK_N based on clocks BUFF_CLK and BUFF_/CLK sent from clock buffer 220, and provides these period signals DLLCLK_P and DLLCLK_N to I/O buffer 280 and QS buffer 290.

In the write mode, I/O buffer 280 writes the write data sent from I/O terminals DQ0–DQ7 into memory cell array 260 in synchronization with internal data strobe signal INTDQS sent from QS buffer 290. In the read mode, I/O buffer 280 provides the read data read from memory cell array 260 via data bus BS2 to I/O terminals DQ0–DQ7 in synchronization with period signals DLLCLK_P and DLLCLK_N sent from DLL 270.

In the write mode, QS buffer 290 buffers externally supplied data strobe signal DQS, and provides buffered internal data strobe signal INTDQS to I/O buffer 280. In the read mode, QS buffer 290 provides period signals DLLCLK_P and DLLCLK_N received from DLL 270 to I/O terminal DQS.

Data bus BS1 provides the control signals such as addresses A0–A12 and row address strobe signal /RAS, which are sent from control circuit 240, to memory cell array 260. Data bus BS2 transmits the write data and read data between memory cell array 260 and I/O buffer 280.

Referring to FIG. 34, description will now be given on the operation of writing data into memory cell array 260 in DDR-SDRAM 200. It is assumed that DDR-SDRAM 200 is externally supplied with reference voltage VREF, and clock buffer 220, control signal buffer 230 and QS buffer 290 receive internal reference voltage INTVREF having the same voltage level as reference voltage VREF.

When the write operation starts, clocks CLK and /CLK as well as clock enable signal CKE are externally supplied to DDR-SDRAM 200. Clock buffer 220 buffers clocks CLK and /CLK, and provides buffered clocks BUFF_CLK and BUFF_/CLK to address buffer 210, control signal buffer 230, control circuit 240 and DLL 270. Clock buffer 220 buffers clock enable signal CKE, and provides buffered clock enable signal CKE to control circuit 240.

DDR-SDRAM 200 is also externally supplied with chip select signal /CS at L-level. Control signal buffer 230 buffers chip select signal /CS at L-level with internal reference voltage INTVREF, and provides buffered chip select signal /CS at L-level to control circuit 240 in synchronization with clocks BUFF_CLK and BUFF_/CLK.

Control circuit 240 determines at certain rising of clock BUFF_CLK or BUFF_/CLK whether clock enable signal CKE is at H-level or L-level. When clock enable signal CKE is at H-level, control circuit 240 will determine chip select signal /CS at L-level as valid in response to the next rising of clock BUFF_CLK or BUFF_/CLK, and sets DDR-SDRAM 200 to the selected state.

Thereafter, DDR-SDRAM 200 is externally supplied with write enable signal /WE at L-level, row address strobe signal /RAS at H-level and column address strobe signal /CAS at L-level, and control signal buffer 230 buffers write enable signal /WE at L-level, row address strobe signal /RAS at H-level and column address strobe signal /CAS at L-level with internal reference voltage INTVREF. Control signal buffer 230 provides write enable signal /WE at L-level, row address strobe signal /RAS at H-level and column address strobe signal /CAS at L-level thus buffered to control circuit 240.

Control circuit 240 recognizes the data write mode in accordance with write enable signal /WE at L-level, row address strobe signal /RAS at H-level and column address strobe signal /CAS at L-level sent from control signal buffer 230.

In the write mode, mode register 250 instructs control circuit 240 to deactivate the output of DLL 270, and control circuit 240 deactivates the output of DLL 270 in accordance with the instruction of mode register 250.

Thereafter, DDR-SDRAM 200 is externally supplied with bank addresses BA0 and BA1. Address buffer 210 buffers bank addresses BA0 and BA1, and provides buffered bank addresses BA0 and BA1 to control circuit 240 in synchronization with clocks BUFF_CLK and BUFF_/CLK.

Control circuit 240 selects one bank from the plurality of banks included in memory cell array 260 based on bank addresses BA0 and BA1 sent from address buffer 210.

DDR-SDRAM 200 is externally supplied with addresses A0–A12. Address buffer 210 buffers addresses A0–A12, and provides buffered addresses A0–A12 to control circuit 240 in synchronization with clocks BUFF_CLK and BUFF_/CLK. Row address strobe signal /RAS at L-level is externally supplied to DDR-SDRAM 200, and control signal buffer 230 operates in the manner already described to buffer row address strobe signal /RAS at L-level and to provide buffered row address strobe signal /RAS at L-level to control circuit 240 in synchronization with clocks BUFF_CLK and BUFF_/CLK.

Control circuit 240 determines or regards addresses A0–A12 received from address buffer 210 as a row address in accordance with row address strobe signal /RAS at L-level, and provides the row address to memory cell array 260 in synchronization with clocks BUFF_CLK and BUFF_/CLK.

DDR-SDRAM 200 is externally supplied with column address strobe signal /CAS at L-level, and control signal buffer 230 buffers column address strobe signal /CAS at L-level with internal reference voltage INTVREF, and provides buffered column address strobe signal /CAS at L-level to control circuit 240 in synchronization with clocks BUFF_CLK and BUFF_/CLK.

Control circuit 240 determines or regards addresses A0–A12 sent from address buffer 210 as a column address in accordance with column address strobe signal /CAS at L-level, and provides the column address to memory cell array 260 in synchronization with clocks BUFF_CLK and BUFF_/CLK.

QS buffer 290 receives data strobe signal DQS from I/O terminal DQS, and buffers received data strobe signal DQS with internal reference voltage INTVREF. QS buffer 290 provides buffered internal data strobe signal INTDQS to I/O buffer 280.

I/O buffer 280 provides write data DQW received from I/O terminals DQ0–DQ7 in synchronization with the rising and falling of data strobe signal DQS, and buffers write data DQW thus received. I/O buffer 280 provides buffered write data DQW to memory cell array 260 in synchronization with the rising and falling of internal data strobe signal INTDQS sent from QS buffer 290.

In memory cell array 260, a row decoder (not shown) decodes the row address sent from control circuit 240, and activates the word line designated by the decoded row address. A column decoder (not shown) decodes the column address sent from control circuit 240, and activates a bit line pair designated by the decoded column address. Write data DQW is written into a memory cell designated by the active word line and the active bit line pair.

In DDR-SDRAM 200, as described above, write data DQW is supplied to DDR-SDRAM 200 in synchronization with the rising and falling of data strobe signal DQS, and is written into the memory cell in synchronization with the rising and falling of internal data strobe signal INTDQS.

Referring to FIG. 35, description will now be given on the operation of reading data from the memory cell in DDR-SDRAM 200. In the read operation, it is assumed that DDR-SDRAM 200 is externally supplied with reference voltage VREF, and clock buffer 220, control signal buffer 230 and QS buffer 290 are supplied with internal reference voltage INTVREF having the same voltage level as reference voltage VREF.

When the read operation starts, DDR-SDRAM 200 is externally supplied with clocks BUFF__CLK and BUFF__/CLK, clock enable signal CKE and chip select signal /CS at L-level. After the above start, the operations are performed in the same manner as those for the data writing until control circuit 240 sets DDR-SDRAM to the selected state.

When DDR-SDRAM 200 enters the selected state, DDR-SDRAM 200 is externally supplied with write enable signal /WE at H-level, row address strobe signal /RAS at H-level and column address strobe signal /CAS at L-level, and control signal buffer 230 buffers write enable signal /WE at H-level, row address strobe signal /RAS at H-level and column address strobe signal /CAS at L-level with internal reference voltage INTVREF. Control signal buffer 230 provides buffered write enable signal /WE at H-level, row address strobe signal /RAS at H-level and column address strobe signal /CAS at L-level to control circuit 240.

Thereby, control circuit 240 recognizes the data read mode in accordance with write enable signal /WE at H-level, row address strobe signal /RAS at H-level and column address strobe signal /CAS at L-level sent from control signal buffer 230.

In the read mode, mode register 250 instructs control circuit 240 to activate the output of DLL 270, and control circuit 240 activates the output of DLL 270 in accordance with the instruction sent from mode register 250. Mode register 250 sets CAS latency CL, and control circuit 240 controls I/O buffer 280 to provide externally the read data in accordance with CAS latency CL designated by mode register 250.

DLL 270 produces period signals DLLCLK__P and DLLCLK__N, which have predetermined phases with respect to clocks CLK and /CLK, based on clocks BUFF__CLK and BUFF__/CLK sent from clock buffer 220, and provides period signals DLLCLK__P and DLLCLK__N thus produced to I/O buffer 280 and QS buffer 290.

DDR-SDRAM 200 is externally supplied with bank addresses BA0 and BA1, and the bank is designated by bank addresses BA0 and BA1 in the same manner as the write operation.

DDR-SDRAM 200 is externally supplied with addresses A0–A12. Operations are performed in the same manner as those for the data writing so that the row and column addresses are supplied to memory cell array 260, and the memory cell activated by the row and column addresses is activated.

Data is read from the memory cell thus activated, and a sense amplifier (not shown) included in memory cell array 260 amplifies and provides read data DQR to I/O buffer 280 via data bus BS2.

Thereby, in accordance with timing determined by CAS latency CL (CAL=2.5 in the example illustrated in FIG. 35), which is set by mode register 250, I/O buffer 280 provides read data DQR to I/O terminals DQ0–DQ7 in synchronization with the rising of period signals DLLCLK__P and DLLCLK__N sent from DLL 270. QS buffer 290 provides period signals DLLCLK__P and DLLCLK__N received from DLL 270 to I/O terminal DQS.

In DDR-SDRAM 200, as described above, data is read from the memory cell in synchronization with clocks BUFF__CLK and BUFF__/CLK, and read data DQR is externally sent in synchronization with period signals DLLCLK__P and DLLCLK__N produced inside DDR-SDRAM 200.

However, the conventional DDR-SDRAM employs clock /CLK complementary to clock CLK as well as externally supplied reference voltage VREF and data strobe signal DQS for ensuring a fast operation margin. Therefore, in slow tester evaluation, a production test and a slow system, which do not require a fast operation margin, such a problem arises that the SDRAM has more pins that a usual SDRAM, and the number of DDR-SDRAMs, which can be tested simultaneously, is reduced.

SUMMARY OF THE INVENTION

Accordingly, an object of the invention is to provide a semiconductor memory device, which allows reduction of external pins in a slow operation mode.

According to the invention, a semiconductor memory device for operating either in a normal operation mode for periodically performing writing and reading of data or in a slow operation mode for periodically performing writing and reading of the data at a lower speed than that in the normal operation mode, includes a plurality of memory cells, a signal select circuit and a peripheral circuit.

The plurality of memory cells store the data. The signal select circuit selects either a first signal received from an I/O terminal used only in the normal operation mode or a second signal received from an I/O terminal used in both the slow and normal operation modes. The peripheral circuit performs the writing and/or reading of the data into and/or from the plurality of memory cells in the slow operation mode by using the second signal selected when the signal select circuit selects the second signal, and performs the writing and/or reading of the data into and/or from the plurality of memory cells in the normal operation mode by using the first signal when the signal select circuit selects the first signal. The signal select circuit selects the first signal in the normal operation mode, and selects the second signal in the slow operation mode.

According to the invention, therefore, the number of I/O terminals used in the slow operation mode can be smaller than that of I/O terminals used in the normal operation mode.

Consequently, it is possible in the slow tester evaluation, production test and slow system to increase the number of semiconductor memory devices, which can be tested simultaneously. Further, a user using the semiconductor memory device in the slow operation mode can reduce a cost.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 35 is a timing chart of signals for illustrating a data read operation of the DDR-SDRAM shown in FIG. 33.

DESCRIPTION OF THE PREFERRED EMBODIMENTS

Embodiments of the invention will now be described with reference to the drawings. In the figures, the same or corresponding portions bear the same reference numbers, and description thereof is not repeated.

First Embodiment

Figure 1:
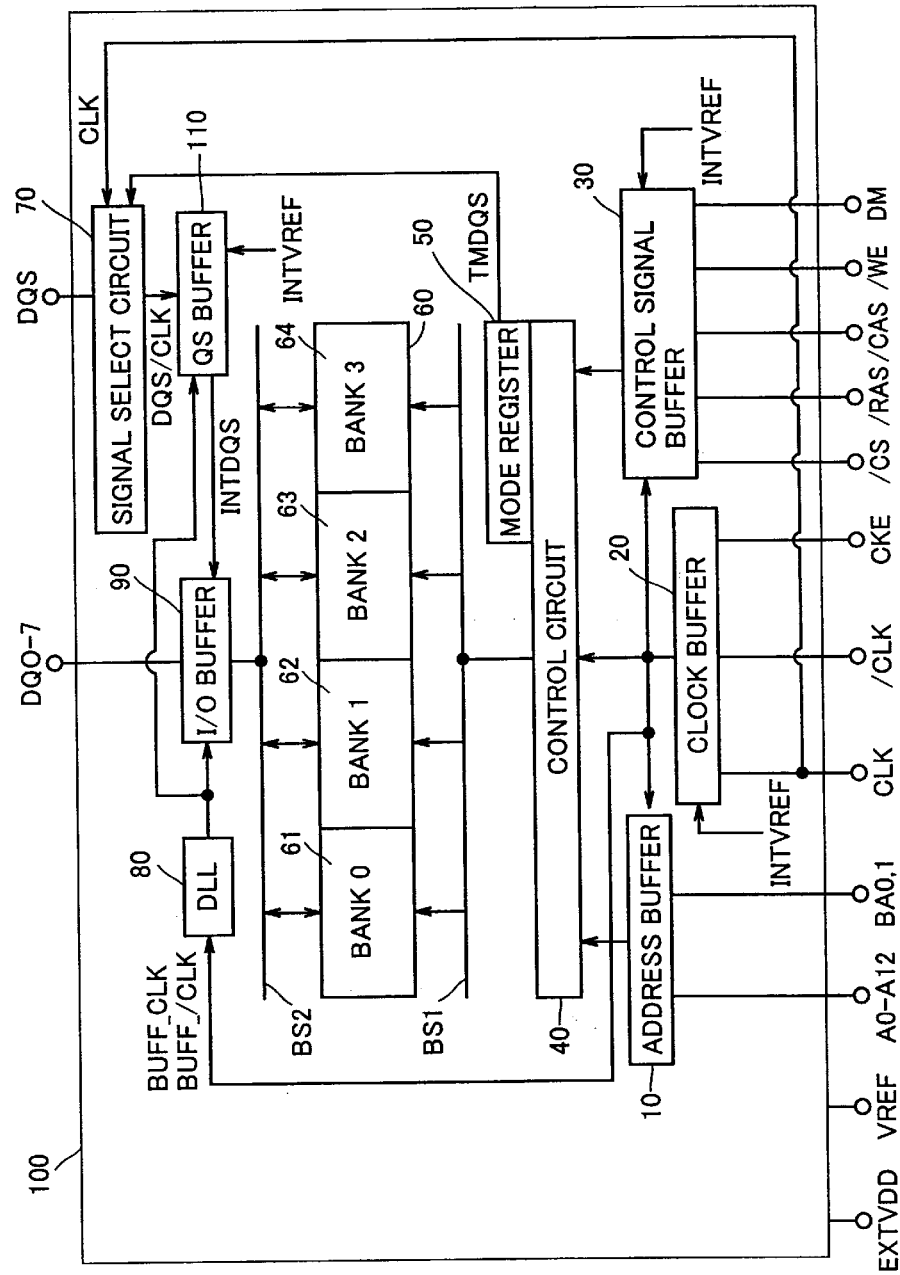
FIG. 1 is a schematic block diagram of a semiconductor memory device according to a first embodiment.

Referring to FIG. 1, a semiconductor memory device 100 according to a first embodiment includes an address buffer 10, a clock buffer 20, a control signal buffer 30, a control circuit 40, a mode register 50, a memory cell array 60, a signal select circuit 70, a DLL 80, an I/O buffer 90, a QS buffer 110 and data buses BS1 and BS2. Memory cell array 60 includes banks 61–64. Semiconductor memory device 100 is formed of a DDR-SDRAM.

Address buffer 10 receives addresses A0–A12 and bank addresses BA0 and BA1, and buffers received addresses A0–A12 and bank addresses BA0 and BA1. Address buffer 10 provides buffered addresses A0–A12 and bank addresses BA0 and BA1 to control circuit 40 in synchronization with clocks BUFF_CLK and BUFF_/CLK received from clock buffer 20.

Clock buffer 20 receives clocks CLK and /CLK as well as a clock enable signal CKE, and buffers received clocks CLK and /CLK as well as clock enable signal CKE with an internal reference voltage INTVREF. Clock buffer 20 provides buffered clocks BUFF_CLK and BUFF_/CLK to address buffer 10, control signal buffer 30, control circuit 40 and DLL 80, and provides buffered clock enable signal CKE to control circuit 40. Internal reference voltage INTVREF has the same voltage level as externally supplied reference voltage VREF.

Control signal buffer 30 externally receives a chip select signal /CS, a row address strobe signal /RAS, a column address strobe signal /CAS, a write enable signal /WE and a data mask signal DM, and buffers received chip select signal /CS, row address strobe signal /RAS, column address strobe signal /CAS, write enable signal /WE and data mask signal DM with internal reference voltage INTVREF, and provides the buffered control signals such as chip select signal /CS to control circuit 40 in synchronization with clocks BUFF_CLK and BUFF_/CLK.

If clock enable signal CKE is at H-level at the time of certain rising of clocks BUFF_CLK and BUFF_/CLK received from clock buffer 20, control circuit 40 determines the next rising of clocks BUFF_CLK and BUFF_/CLK as valid. If clock enable signal CKE is at L-level at the time of certain rising of clocks BUFF_CLK and BUFF_/CLK, control circuit 40 determines the next rising of clocks BUFF_CLK and BUFF_/CLK as invalid.

When control circuit 40 determines clocks BUFF_CLK and BUFF_/CLK as valid, it controls semiconductor memory device 100 based on chip select signal /CS, row address strobe signal /RAS, column address strobe signal /CAS, write enable signal /WE and data mask signal DM received from control signal buffer 30.

More specifically, control circuit 40 recognizes the selection of semiconductor memory device 100 based on chip select signal /CS at L-level, and recognizes the non-selection of semiconductor memory device 100 based on chip select signal /CS at H-level. Control circuit 40 selects one or all of banks 61–64 based on bank addresses BA0 and BA1 sent from address buffer 10. Further, control circuit 40 determines addresses A0–A12, which are received from address buffer 10 in accordance with the timing of switching of row address strobe signal /RAS from H-level to L-level, as a row address, and provides the row address thus determined to one or all of banks 61–64 in synchronization with clocks BUFF_CLK and BUFF_/CLK sent from clock buffer 20.

Control circuit 40 determines addresses A0–A12, which are received from address buffer 10 in accordance with the timing of switching of column address strobe signal /CAS from H-level to L-level, as a column address, and provides the column address thus determined to one or all of banks 61–64 in synchronization with clocks BUFF_CLK and BUFF_/CLK sent from clock buffer 20.

Further, control circuit 40 recognizes the data write mode or data read mode based on write enable signal /WE. Control circuit 40 controls I/O buffer 90 to provide the write data supplied from I/O terminals DQ0–DQ7 to banks 61–64 in synchronization with internal data strobe signal INTDQS sent from QS buffer 110. In the read mode, control circuit 40 controls I/O buffer 90 such that the read data read from banks 61–64 via data bus BS2 may be provided to I/O terminals DQ0–DQ7 in synchronization with period signals DLLCLK_P and DLLCLK_N sent from DLL 80, and also controls QS buffer 110 such that period signals DLLCLK_P and DLLCLK_N sent from DLL 80 may be provided to I/O terminal DQS.

Further, control circuit 40 controls I/O buffer 90 based on data mask signal DM as follows. In the write mode, control circuit 40 controls I/O buffer 90 based on data mask signal DM at H-level such that the write data provided during the H-level of data mask signal DM may not be written into banks 61–64, and controls I/O buffer 90 to write all the write data into banks 61–64 based on data mask signal DM at L-level. In the read mode, control circuit 40 deactivates I/O buffer 90 based on data mask signal DM at H-level, and activates I/O buffer 90 based on data mask signal DM at L-level.

Further, control circuit 40 controls the timing for actually reading out the data after receiving the instruction of data read operation based on CAS latency CL determined by mode register 50, and activates or deactivates DLL 80 in accordance with the instruction sent from mode register 50.

Mode register 50 determines CAS latency CL and provides it to control circuit 40. Mode register 50 instructs control circuit 40 to activate or deactivate DLL 80. Further, mode register 50 provides a signal TMDQS at H- or L-level, which is preset before shipping of semiconductor memory device 100, to signal select circuit 70.

Memory cell array 60 includes banks 61–64, and stores the data. Signal select circuit 70 receives data strobe signal DQS from I/O terminal DQS, and receives clock CLK from an I/O terminal CLK. In a manner, which will be described later, signal select circuit 70 selects data strobe signal DQS or clock CLK in accordance with the logical level of signal TMDQS, and provides the selected signal to QS buffer 110.

DLL 80 operates based on clocks BUFF_CLK and BUFF_/CLK sent from clock buffer 20 to produce period signals DLLCLK_P and DLLCLK_N, which have a predetermined phase with respect to clocks CLK and /CLK, and to provide produced period signals DLLCLK_P and DLLCLK_N to I/O buffer 90 and QS buffer 110.

In the write mode, I/O buffer 90 writes the write data, which is supplied from I/O terminals DQ0–DQ7, into banks 61–64 in synchronization with the rising and falling of internal data strobe signal INTDQS. In the read mode, I/O buffer 90 provides the read data, which is read from banks 61–64 via data bus BS2, to I/O terminals DQ0–DQ7 in synchronization with period signals DLLCLK_P and DLLCLK_N sent from DLL 80.

In the write mode, QS buffer 110 buffers data strobe signal DQS or clock CLK sent from signal select circuit 70 with internal reference voltage INTVREF, and provides the buffered signal to I/O buffer 90 as internal data strobe signal INTDQS. In the read mode, QS buffer 110 provides period signals DLLCLK_P and DLLCLK_N, which are received from DLL 80, directly to I/O terminal DQS.

Data bus BS1 transmits all addresses A0–A12, bank addresses BA0 and BA1, row address strobe signal /RAS and other control signals sent from control circuit 40 to one or all of banks 61–64. Data bus BS2 transmits the write or read data between one or all of banks 61–64 and I/O buffer 90.

Semiconductor memory device 100 externally receives an external power supply voltage EXTVDD. A power supply circuit (not shown) arranged within semiconductor memory device 100 generates various kinds of internal power supply voltages such as a precharge voltage VBL and a cell plate voltage based on external power supply voltage EXTVDD, and supplies the various internal power supply voltages thus generated to memory cell array 60.

Figure 2:
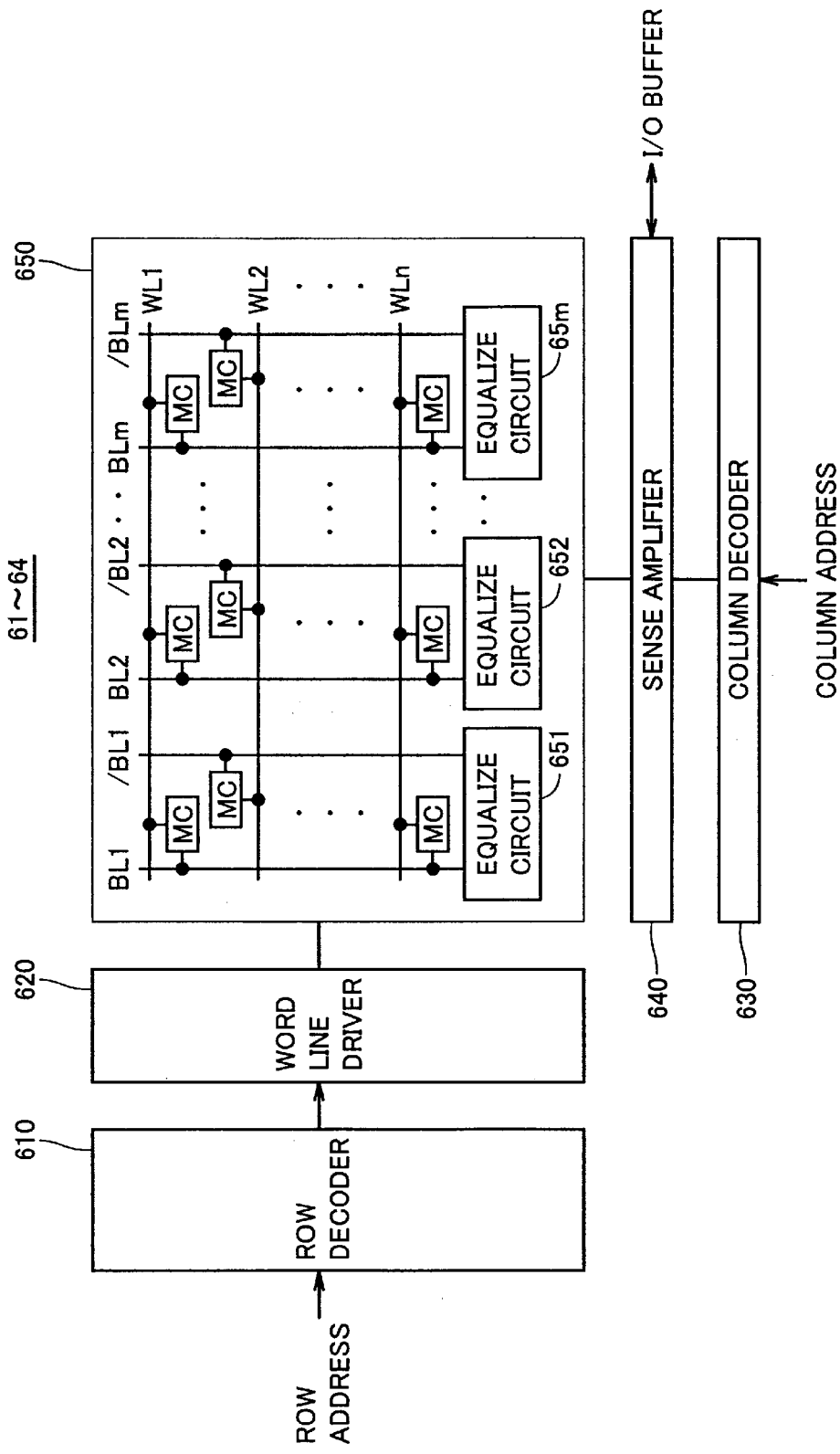
FIG. 2 is a block diagram of a memory cell array shown in FIG. 1.

Referring to FIG. 2, each of banks 61–64 includes a row decoder 610, a word line driver 620, a column decoder 630, a sense amplifier 640 and a memory array 650.

Row decoder 610 decodes the row address received from control circuit 40, and provides the decoded row address to word line driver 620. Word line driver 620 activates the word line (one of word lines WL1–WLn, where n is a natural number) designated by the row address received from row decoder 610.

Column decoder 630 decodes the column address received from control circuit 40, and activates the bit line pair (one of bit line pairs BL1 and /BL1–BLm and /BLm) designated by the decoded column address. In the write mode, sense amplifier 640 writes the write data, which is sent from I/O buffer 90, onto the activated bit line pair (one of bit line pairs BL1 and /BL1–BLm and /BLm). In the read mode, sense amplifier 640 amplifies the read data on the activated bit line pair (one of bit line pairs BL1 and /BL1–BLm and /BLm), and provides the amplified read data to I/O buffer 90.

Memory array 650 includes the plurality of bit line pairs BL1 and /BL1–BLm and /BLm, the plurality of word lines WL1–WLn, a plurality of equalize circuits 651–65$m$ and memory cells MC of (n×m) in number. The plurality of equalize circuits 651–65$m$ are provided corresponding to the plurality of bit line pairs BL1 and /BL1–BLm and /BLm, respectively. Each of equalize circuits 651–65$m$ precharges the corresponding bit line pair (one of bit line pairs BL1 and /BL1–BLm and /BLm) to a predetermined voltage VBL (=EXTVDD/2) before writing or reading the data into or from memory cell MC.

Each of (n×m) memory cells MC is arranged at a position where the bit line pair (one of bit line pairs BL1 and /BL1–BLm and /BLm) crosses the word line (one of word lines WL1–WLn).

In memory array 650, the data is provided into/from memory cell MC arranged at the point, where the active word line (one of word lines WL1–WLn) crosses the active bit line pair (one of bit line pairs BL1 and /BL1–BLm and /BLm).

Figure 3:
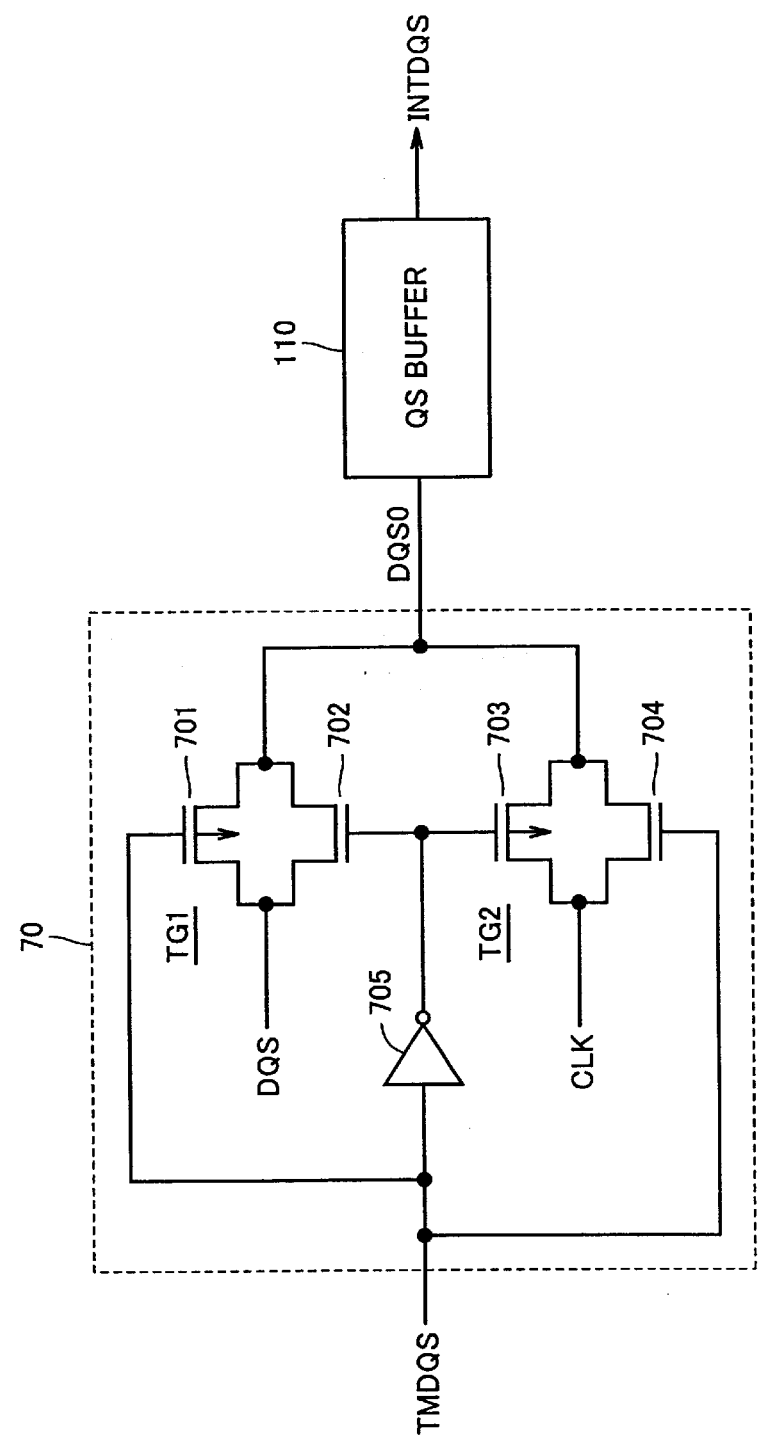
FIG. 3 is a circuit diagram of a signal select circuit shown in FIG. 1, and also shows a QS buffer in a block form.

Referring to FIG. 3, signal select circuit 70 includes P-channel MOS transistors 701 and 703, N-channel MOS transistors 702 and 704, and an inverter 705. P-channel MOS transistor 701 has source and drain terminals, which are connected to source and drain terminals of N-channel MOS transistor 702, respectively.

P-channel MOS transistor 703 has source and drain terminals, which are connected to source and drain terminals of N-channel MOS transistor 704, respectively.

Each of P- and N-channel MOS transistors 701 and 704 receives signal TMDQS sent from mode register 50 on its gate terminal.

P- and N-channel MOS transistors 701 and 702 form a transfer gate TG1. P- and N-channel MOS transistors 703 and 704 form a transfer gate TG2.

Inverter 705 receives signal TMDQS from mode register 50, and inverts received signal TMDQS to provide it to gate terminals of N- and P-channel MOS transistors 702 and 703.

When mode register 50 provides signal TMDQS at L-level to signal select circuit 70, inverter 705 inverts signal TMDQS at L-level to provide a signal at H-level to the gate terminals of N- and P-channel MOS transistors 702 and 703. P- and N-channel MOS transistors 701 and 704 receive signal TMDQS at L-level on their gate terminals.

Thereby, P- and N-channel MOS transistors 701 and 702 are turned on, and P- and N-channel MOS transistors 703 and 704 are turned off. Transfer gate TG1 provides data strobe signal DQS, which is received from I/O terminal DQS, as a signal DQS0 to QS buffer 110.

When mode register 50 provides signal TMDQS at H-level to signal select circuit 70, inverter 705 inverts signal TMDQS at H-level to provide a signal at L-level to the gate terminals of N- and P-channel MOS transistors 702 and 703. P- and N-channel MOS transistors 701 and 704 receive signal TMDQS at H-level on their gate terminals.

Thereby, P- and N-channel MOS transistors 701 and 702 are turned off, and P- and N-channel MOS transistors 703 and 704 are turned on. Transfer gate TG2 provides clock CLK, which is supplied from I/O terminal CLK, as signal DQS0 to QS buffer 110.

As described above, signal select circuit 70 selects data strobe signal DQS in accordance with signal TMDQS at L-level, and provides selected data strobe signal DQS to QS buffer 110. Also, signal select circuit 70 selects clock CLK in accordance with signal TMDQS at H-level, and provides selected clock CLK to QS buffer 110.

Figure 4:
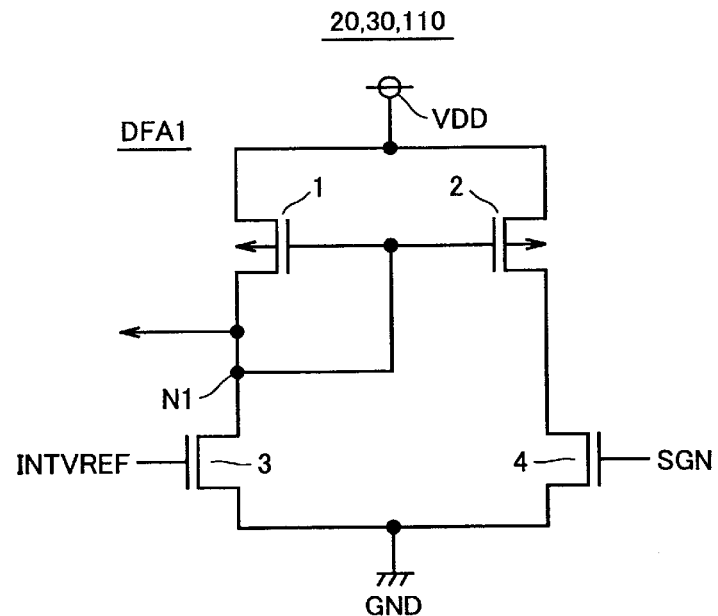
FIG. 4 is a circuit diagram of a differential amplifier circuit included in a clock buffer, a control signal buffer and the QS buffer shown in FIG. 1.

Referring to FIG. 4, each of clock buffer 20, control signal buffer 30 and QS buffer 110 includes a differential amplifier circuit DFA1. Differential amplifier circuit DFA1 includes P-channel MOS transistors 1 and 2 as well as N-channel MOS transistors 3 and 4. P- and N-channel MOS transistors 1 and 3 are connected in series between a power supply node VDD and a ground node GND.

P- and N-channel MOS transistors 2 and 4 are connected in series between power supply node VDD and ground node GND. P- and N-channel MOS transistors 1 and 3 are connected in parallel to P- and N-channel MOS transistors 2 and 4.

P-channel MOS transistors 1 and 2 receive on their gate terminals a voltage on a node N1. N-channel MOS transistor 3 receives internal reference voltage INTVREF on its gate terminal. N-channel MOS transistor 4 receives a signal SGN on its gate terminal.

In differential amplifier circuit DFA1 included in control signal buffer 30, signal SGN is a control signal such as chip select signal /CS. In differential amplifier circuit DFA1 included in QS buffer 110, signal SGN is data strobe signal DQS or clock CLK sent from signal select circuit 70.

Differential amplifier circuit DFA1 compares the voltage forming signal SGN with internal reference voltage INTVREF, and provides a signal, which has the logical level corresponding to results of the comparison, from node N1. More specifically, differential amplifier circuit DFA1 provides a signal at H-level from node N1 when the voltage forming signal SGN is higher than internal reference voltage INTVREF, and provides a signal at L-level from node N1 when the voltage forming signal SGN is equal to or lower than internal reference voltage INTVREF.

Figure 5:
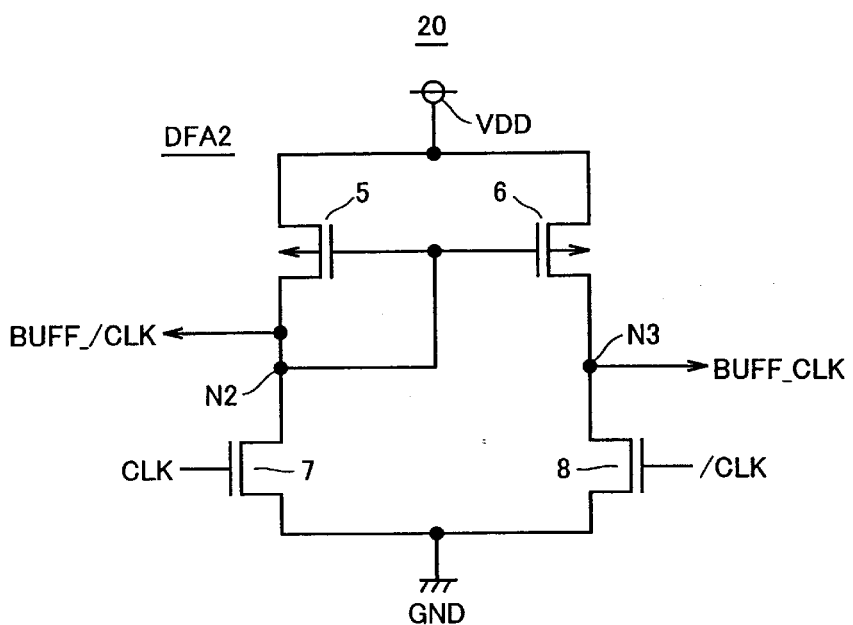
FIG. 5 is a circuit diagram of the differential amplifier circuit included in the clock buffer shown in FIG. 1.

Referring to FIG. 5, clock buffer 20 further includes a differential amplifier circuit DFA2. Differential amplifier circuit DFA2 includes P-channel MOS transistors 5 and 6, and N-channel MOS transistors 7 and 8. P- and N-channel MOS transistors 5 and 7 are connected in series between power supply node VDD and ground node GND.

P- and N-channel MOS transistors 6 and 8 are connected in series between power supply node VDD and ground node GND. P- and N-channel MOS transistors 5 and 7 are connected in parallel to P- and N-channel MOS transistors 6 and 8.

P-channel MOS transistors 5 and 6 receive on their gate terminals the voltage on a node N2. N-channel MOS transistor 7 receives clock CLK sent from I/O terminal CLK on its gate terminal. N-channel MOS transistor 8 receives clock /CLK sent from I/O terminal /CLK on its gate terminal.

Differential amplifier circuit DFA2 compares the voltage forming clock CLK with the voltage forming clock /CLK, and provides clocks BUFF_CLK and BUFF_/CLK formed of voltages corresponding to results of the comparison from its nodes N3 and N2, respectively.

Figure 6:
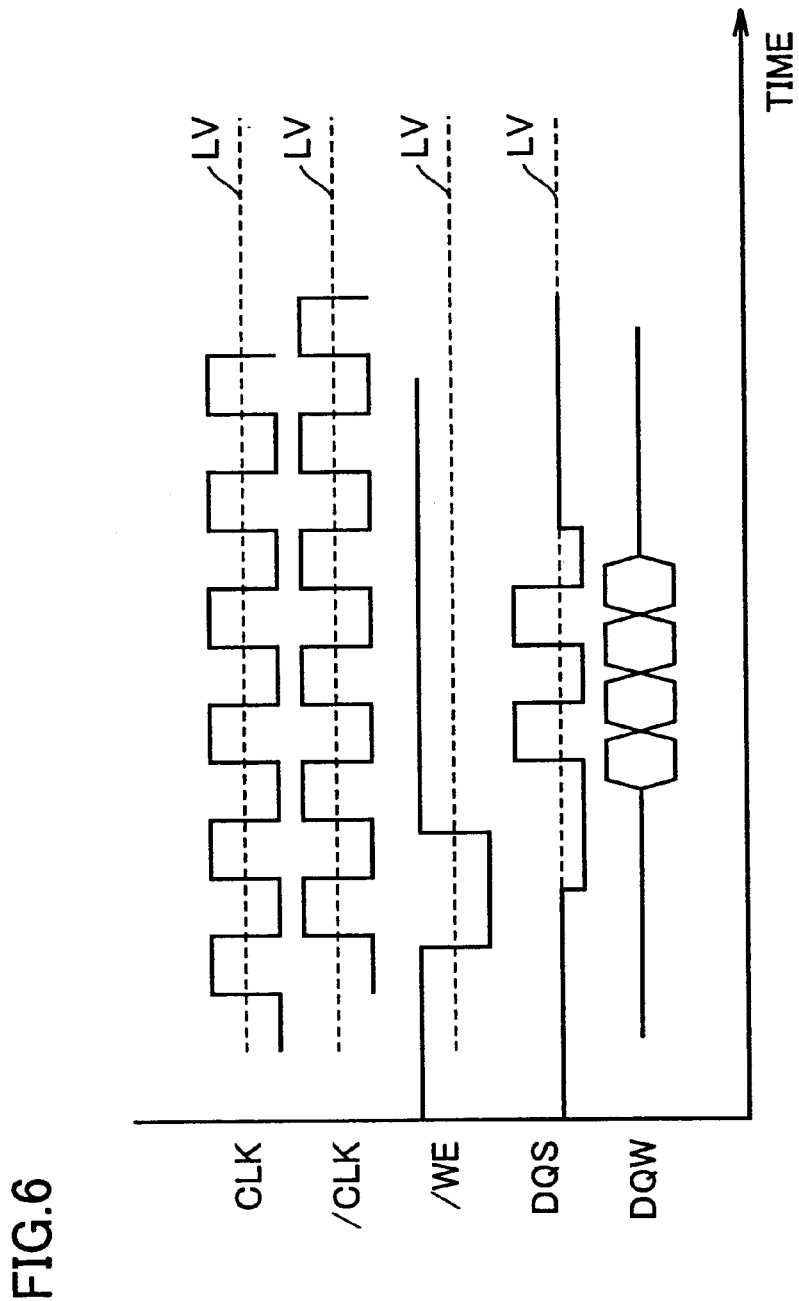
FIG. 6 is a timing chart of signals processed by the clock buffer, control signal buffer and QS buffer shown in FIG. 1.

Referring to FIG. 6, operations of differential amplifier circuits DFA1 and DFA2 will now be described in connection with specific signals. First, description will be given on the operation of differential amplifier circuit DFA1 forming control signal buffer 30 in connection with, e.g., write enable signal /WE. In differential amplifier circuit DFA1 forming control signal buffer 30, N-channel MOS transistor 4 receives write enable signal /WE on its gate terminal.

When N-channel MOS transistor 4 receives write enable signal /WE at H-level on its gate terminal, differential amplifier circuit DFA1 compares the voltage forming write enable signal /WE at H-level with internal reference voltage INTVREF, and provides write enable signal /WE formed of a voltage corresponding to results of the comparison from node N1.

In this case, differential amplifier circuit DFA1 provides write enable signal /WE at H-level from node N1 because write enable signal /WE at H-level is formed of a voltage higher than internal reference voltage INTVREF.

When N-channel MOS transistor 4 receives write enable signal /WE at L-level on its gate terminal, differential amplifier circuit DFA1 compares the voltage forming write enable signal /WE at L-level with internal reference voltage INTVREF, and provides write enable signal /WE formed of a voltage corresponding to results of the comparison from node N1.

In this case, differential amplifier circuit DFA1 provides write enable signal /WE at L-level from node N1 because write enable signal /WE at L-level is formed of a voltage not exceeding internal reference voltage INTVREF.

As described above, differential amplifier circuit DFA1 compares the voltage of write enable signal /WE supplied to a gate terminal of N-channel MOS transistor 4 with internal reference voltage INTVREF, and provides write enable signal /WE formed of a voltage corresponding to results of the comparison from node N1.

When N-channel MOS transistor 4 is supplied on its gate terminal with chip select signal /CS, row address strobe signal /RAS, column address strobe signal /CAS and data mask signal DM except for write enable signal /WE, differential amplifier circuit DFA1 performs the same operations as those in the case where write enable signal /WE is supplied to the gate terminal of N-channel MOS transistor 4.

Thereby, control signal buffer 30 buffers the control signals such as write enable signal /WE with internal reference voltage INTVREF.

Operations of differential amplifier circuit DFA1 included in QS buffer 110 will now be described in connection with data strobe signal DQS. In differential amplifier circuit DFA1 included in QS buffer 110, N-channel MOS transistor 4 receives data strobe signal DQS on its gate terminal.

When N-channel MOS transistor 4 receives data strobe signal DQS at L-level on its gate terminal, differential amplifier circuit DFA1 compares the voltage forming data strobe signal DQS at L-level with internal reference voltage INTVREF, and provides data strobe signal DQS formed of a voltage corresponding to results of the comparison from node N1.

In this case, differential amplifier circuit DFA1 provides internal data strobe signal INTDQS at L-level from node N1 because data strobe signal DQS at L-level is formed of a voltage not exceeding internal reference voltage INTVREF.

When N-channel MOS transistor 4 receives data strobe signal DQS at H-level on its gate terminal, differential amplifier circuit DFA1 compares the voltage forming data strobe signal DQS at H-level with internal reference voltage INTVREF, and provides internal data strobe signal INTDQS formed of a voltage corresponding to results of the comparison from node N1.

In this case, differential amplifier circuit DFA1 provides internal data strobe signal INTDQS at H-level from node N1 because data strobe signal DQS at H-level is formed of a voltage higher than internal reference voltage INTVREF.

As described above, differential amplifier circuit DFA1 compares the voltage of data strobe signal DQS supplied to the gate terminal of N-channel MOS transistor 4 with internal reference voltage INTVREF, and provides data strobe signal DQS formed of a voltage corresponding to results of the comparison from node N1. Write data DQW is supplied from I/O terminals DQ0–DQ7 to I/O buffer 90 in synchronization with the rising and falling of data strobe signal DQS.

When N-channel MOS transistor 4 is supplied on its gate terminal with clock CLK instead of data strobe signal DQS, differential amplifier circuit DFA1 performs the same operation as that in the case where N-channel MOS transistor 4 is supplied on its gate terminal with data strobe signal DQS.

Thereby, QS buffer 110 buffers data strobe signal DQS or clock CLK with internal reference voltage INTVREF.

In differential amplifier circuit DFA1 included in clock buffer 20, N-channel MOS transistor 4 receives clock enable signal CKE on its gate terminal. Differential amplifier circuit DFA1 buffers clock enable signal CKE in accordance with the operations already described.

Finally, description will now be given on the operations of differential amplifier circuit DFA2 forming clock buffer 20. N-channel MOS transistor 7 receives clock CLK on its gate terminal, and N-channel MOS transistor 8 receives clock /CLK complementary to clock CLK on its gate terminal.

Differential amplifier circuit DFA2 compares the voltage forming clock /CLK with the voltage forming clock CLK, and provides clocks BUFF_/CLK and BUFF_CLK formed of voltages corresponding to results of the comparison from nodes N2 and N3, respectively.

When N-channel MOS transistors 7 and 8 receive clock CLK at H-level and clock /CLK at L-level on their gate terminals, respectively, differential amplifier circuit DFA2 provides clock BUFF_/CLK at L-level and clock BUFF_CLK at H-level from nodes N2 and N3, respectively.

When N-channel MOS transistors 7 and 8 receive clock CLK at L-level and clock /CLK at H-level on their gate terminals, respectively, differential amplifier circuit DFA2 provides clock BUFF_/CLK at H-level and clock BUFF_CLK at L-level from nodes N2 and N3, respectively.

Differential amplifier circuit DFA2 compares the voltage forming clock /CLK with the voltage forming clock CLK, and the logical level formed of the voltage, which corresponds to results of the comparison, is determined based on internal reference voltage INTVREF.

As described above, differential amplifier circuit DFA2 buffers clocks CLK and /CLK in accordance with the foregoing operations based on internal reference voltage INTVREF, and provides buffered clocks BUFF_CLK and BUFF_/CLK.

Therefore, a level LV shown in FIG. 6 provides a reference for determining whether the signals prepared by buffering the various signals already described are at H-level or L-level, and is formed of internal reference voltage INTVREF.

Figure 7:
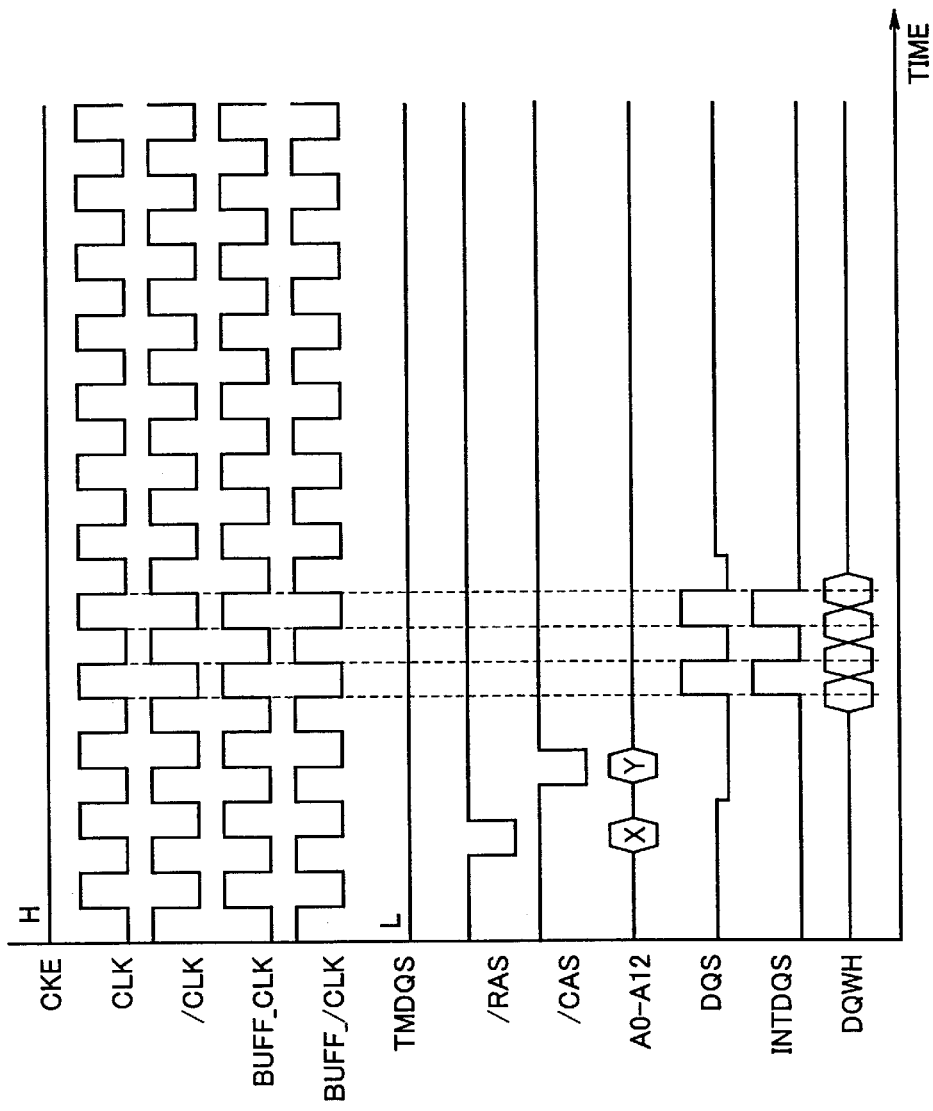
FIG. 7 is a timing chart of signals for illustrating a data write operation in a normal operation mode of the semiconductor memory device shown in FIG. 1.
Figure 8:
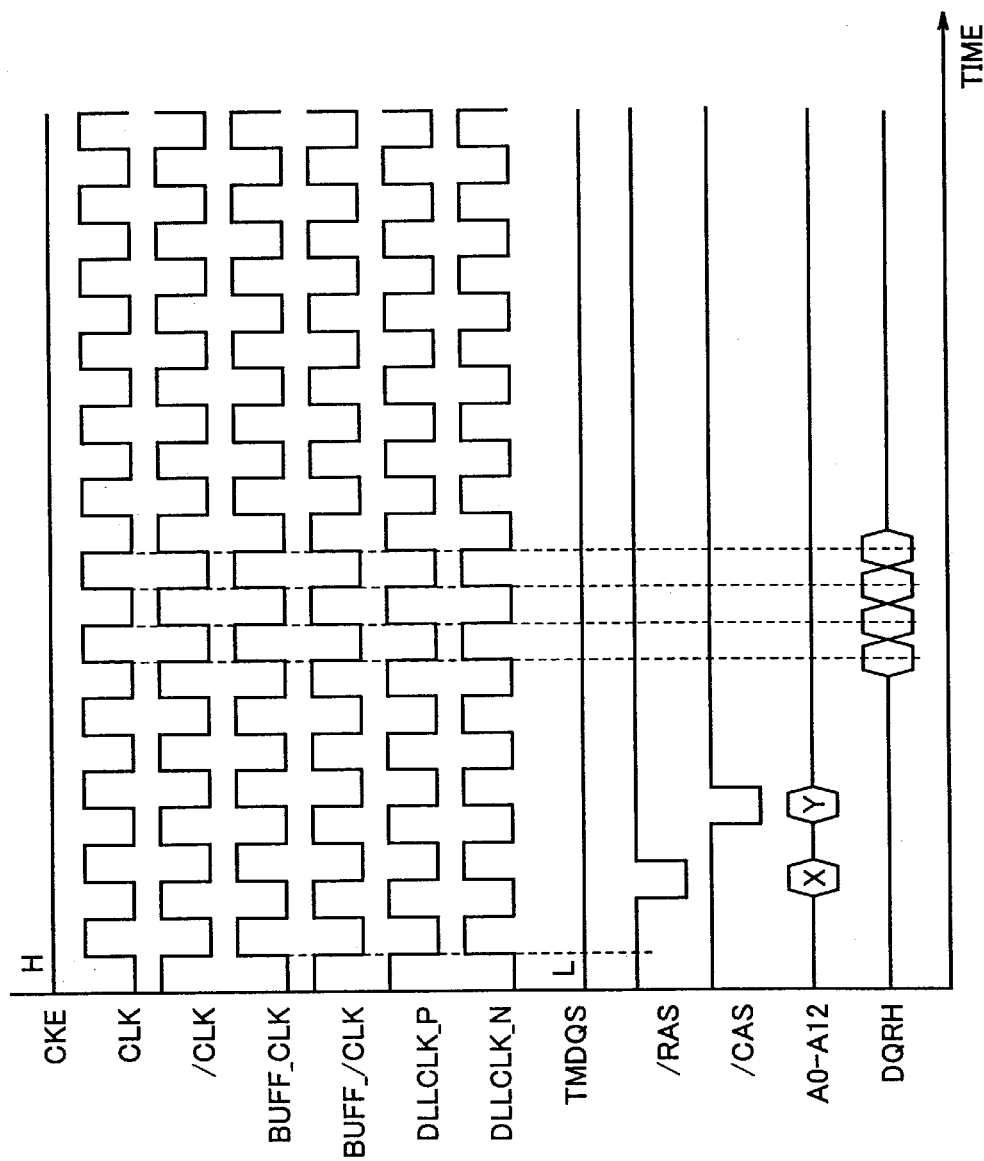
FIG. 8 is a timing chart of signals for illustrating a data read operation in the normal operation mode of the semiconductor memory device shown in FIG. 1.

Referring to FIGS. 7 and 8, description will now be given on operations of semiconductor memory device 100 in the normal operation mode. The normal operation mode means the normal operation mode of the DDR-SDRAM.

When semiconductor memory device 100 operates in the normal operation mode, mode register 50 provides signal TMDQS at L-level to signal select circuit 70. Therefore, signal select circuit 70 selects data strobe signal DQS, which is supplied from I/O terminal DQS, in accordance with signal TMDQS at L-level, and provides the same to QS buffer 110.

Referring to FIG. 7, description will now be given on the data write operation in the normal operation mode. It is assumed that semiconductor memory device 100 is externally supplied with reference voltage VREF, and clock buffer 20, control signal buffer 30 and QS buffer 110 receive internal reference voltage INTVREF having the same voltage level as reference voltage VREF.

When the data write operation starts, semiconductor memory device 100 is externally supplied with clocks CLK and /CLK as well as clock enable signal CKE. Clock buffer 20 buffers clocks CLK and /CLK by differential amplifier circuit DFA2, and provides buffered clocks BUFF_CLK and BUFF_/CLK to address buffer 10, control signal buffer 30, control circuit 40 and DLL 80. Clock buffer 20 buffers clock enable signal CKE by differential amplifier circuit DFA1, and provides buffered clock enable signal CKE to control circuit 40.

Semiconductor memory device 100 is also supplied with chip select signal /CS at L-level. Control signal buffer 30 buffers chip select signal /CS at L-level with internal reference voltage INTVREF, and provides buffered chip select signal /CS at L-level to control circuit 40 in synchronization with clocks BUFF_CLK and BUFF_/CLK.

Control circuit 40 determines whether clock enable signal CKE is at H-level or L-level when certain rising of clock BUFF_CLK or BUFF_/CLK occurs. In this case, clock enable signal CKE is at H-level so that control circuit 40 determines chip select signal /CS at L-level as valid when next rising of clock BUFF_CLK or BUFF_/CLK occurs, and sets semiconductor memory device 100 to the selected state.

Thereafter, semiconductor memory device 100 is externally supplied with write enable signal /WE at L-level, row address strobe signal /RAS at H-level and column address strobe signal /CAS at L-level, and control signal buffer 30 buffers write enable signal /WE at L-level, row address strobe signal /RAS at H-level and column address strobe signal /CAS at L-level with internal reference voltage INTVREF. Control signal buffer 30 provides write enable signal /WE at L-level, row address strobe signal /RAS at H-level and column address strobe signal /CAS at L-level thus buffered to control circuit 40.

Thereby, control circuit 40 recognizes the data write mode in accordance with write enable signal /WE at L-level, row address strobe signal /RAS at H-level and column address strobe signal /CAS at L-level sent from control signal buffer 30.

In the write mode, mode register 50 instructs control circuit 40 to deactivate the output of DLL 80, and control circuit 40 deactivates the output of DLL 80 in accordance with the instruction of mode register 50.

Thereafter, semiconductor memory device 100 is externally supplied with bank addresses BA0 and BA1. Address buffer 10 buffers bank addresses BA0 and BA1, and provides buffered bank addresses BA0 and BA1 to control circuit 40 in synchronization with clocks BUFF_CLK and BUFF_/CLK.

Control circuit 40 selects one bank from banks 61–64 included in memory cell array 60 based on bank addresses BA0 and BA1 sent from address buffer 10.

In synchronization with the switching of row address strobe signal /RAS from H-level to L-level, semiconductor memory device 100 is externally supplied with addresses A0–A12, and address buffer 10 buffers addresses A0–A12, and provides buffered addresses A0–A12 to control circuit 40 in synchronization with clocks BUFF_CLK and BUFF_/CLK. Semiconductor memory device 100 is externally supplied with row address strobe signal /RAS at L-level, and control signal buffer 30 performs the foregoing operations to buffer row address strobe signal /RAS at L-level, and to provide buffered row address strobe signal /RAS at L-level to control circuit 40 in synchronization with clock BUFF_CLK.

In accordance with the same timing as the operation of recognizing row address strobe signal /RAS at L-level, column address strobe signal /CAS at H-level and write enable signal /WE at H-level by an internal command decoder (not shown), control circuit 40 determines addresses A0–A12 received from address buffer 10 as a row address X, and provides row address X to the bank selected from banks 61–64 in memory cell array 60 in synchronization with clock BUFF_CLK.

Thereafter, semiconductor memory device 100 is externally supplied with addresses A0–A12 in synchronization with the switching of column address strobe signal /CAS from H-level to L-level, and address buffer 10 buffers addresses A0–A12, and provides buffered addresses A0–A12 to control circuit 40 in synchronization with clocks BUFF_CLK and BUFF_/CLK.

Column address strobe signal /CAS at L-level is externally supplied, and control signal buffer 30 buffers column address strobe signal /CAS at L-level with internal reference voltage INTVREF, and provides buffered column address strobe signal /CAS at L-level to control circuit 40 in synchronization with clock BUFF_CLK.

In accordance with the same timing as the operation of recognizing row address strobe signal /RAS at H-level and column address strobe signal /CAS at L-level by the internal command decoder (not shown), control circuit 40 determines addresses A0–A12 received from address buffer 10 as a column address Y, and provides column address Y to the bank selected from banks 61–64 in memory cell array 60 in synchronization with clocks BUFF_CLK and BUFF_/CLK.

QS buffer 110 receives data strobe signal DQS from signal select circuit 70, and buffers received data strobe signal DQS with internal reference voltage INTVREF. QS buffer 110 provides buffered internal data strobe signal INTDQS to I/O buffer 90.

I/O buffer 90 receives write data DQWH from I/O terminals DQ0–DQ7 in synchronization with the rising and falling of data strobe signal DQS, and buffers received write data DQWH. I/O buffer 90 provides buffered data DQWH to the bank selected from banks 61–64 in memory cell array 60 in synchronization with the rising and falling of internal data strobe signal INTDQS sent from QS buffer 110.

In memory cell array 60, row decoder 610 decodes row address X sent from control circuit 40, and provides decoded row address X to word line driver 620. Word line driver 620 activates word line WLi ($1 \leq i \leq n$) designated by decoded row address X.

Column decoder 630 decodes column address Y sent from control circuit 40, and activates bit line pair BLj and /BLj ($1 \leq j \leq$) designated by decoded column address Y. Write data DQWH is written through sense amplifier 640 into memory cell MC designated by activated word line WLi and activated bit line pair BLj and /BLj.

In the normal operation mode, as described above, write data DQWH is supplied to semiconductor memory device 100 in synchronization with the rising and falling of data strobe signal DQS, and is written into memory cell MC in synchronization with the rising and falling of internal data strobe signal INTDQS.

Referring to FIG. 8, description will now be given on the operation of reading data from memory cell MC in the normal operation mode. In the read operation, it is likewise assumed that semiconductor memory device 100 is externally supplied with reference voltage VREF, and clock buffer 20, control signal buffer 30 and QS buffer 110 receive internal reference voltage INTVREF having the same voltage level as reference voltage VREF.

When the read operations starts, semiconductor memory device 100 is externally supplied with clocks CLK and /CLK, clock enable signal CKE and chip select signal /CS at L-level, and control circuit 40 sets semiconductor memory device 100 to the selected state. Until this setting, the operations are performed in the same manner as those for the data writing.

When semiconductor memory device 100 enters the selected state, semiconductor memory device 100 is externally supplied with write enable signal /WE at H-level, row address strobe signal /RAS at H-level and column address strobe signal /CAS at L-level, and buffers write enable signal /WE at H-level, row address strobe signal /RAS at H-level and column address strobe signal /CAS at L-level with internal reference voltage INTVREF. Control signal buffer 30 provides buffered write enable signal /WE at H-level, row address strobe signal /RAS at H-level and column address strobe signal /CAS at L-level to control circuit 40.

Thereby, control circuit 40 recognizes the data read mode in accordance with write enable signal /WE at H-level, row address strobe signal /RAS at H-level and column address strobe signal /CAS at L-level sent from control signal buffer 30.

In the read mode, mode register 50 instructs control circuit 40 to activate the output of DLL 80, and control circuit 40 activates the output of DLL 80 in accordance with the instruction sent from mode register 50. Mode register 50 determines CAS latency CL, and control circuit 40 controls I/O buffer 90 to provide the read data to I/O terminals DQ0–DQ7 in accordance with the timing corresponding to CAS latency CL determined by mode register 50.

DLL 80 produces period signals DLLCLK_P and DLLCLK_N having a predetermined phase with respect to clocks CLK and /CLK based on clocks BUFF_CLK and BUFF_/CLK sent from clock buffer 20, and provides period signals DLLCLK_P and DLLCLK_N thus produced to I/O buffer 90 and QS buffer 110.

Semiconductor memory device 100 is externally supplied with bank addresses BA0 and BA1, and the bank designated by bank addresses BA0 and BA1 is selected from banks 61–64 in the same manner as that in the write operation.

Further, semiconductor memory device 100 is externally supplied with addresses A0–A12, and the same operations as those for the data writing are performed to provide row and column addresses X and Y to the bank selected from banks 61–64 in memory cell array 60, and to activate memory cell MC designated by row and column addresses X and Y.

The data is read from activated memory cell MC, and sense amplifier 640 included in memory cell array 60 amplifies read data DQRH to provide it to I/O buffer 90 via data bus BS2.

Thereby, I/O buffer 90 provides read data DQRH to I/O terminals DQ0–DQ7 at each rising of period signals DLLCLK_P and DLLCLK_N sent from DLL 80 in accordance with the timing corresponding to CAS latency CL (CAL=2.0 in FIG. 8) determined by mode register 50. Further, QS buffer 110 directly provides period signals DLLCLK_P and DLLCLK_N sent from DLL 80 to I/O terminal DQS.

In the normal operation mode of semiconductor memory device 100, the data is read from the memory cell in synchronization with clocks BUFF_CLK and BUFF_/CLK, and read data DQRH is externally provided in synchronization with period signals DLLCLK_P and DLLCLK_N produced inside semiconductor memory device 100.

Therefore, when mode register 50 provides signal TMDQS at L-level to signal select circuit 70, semiconductor memory device 100 writes or reads the data into or from memory cell MC in synchronization with the rising and falling of data strobe signal DQS or in synchronization with the rising of period signals DLLCLK_P and DLLCLK_N.

Figure 9:
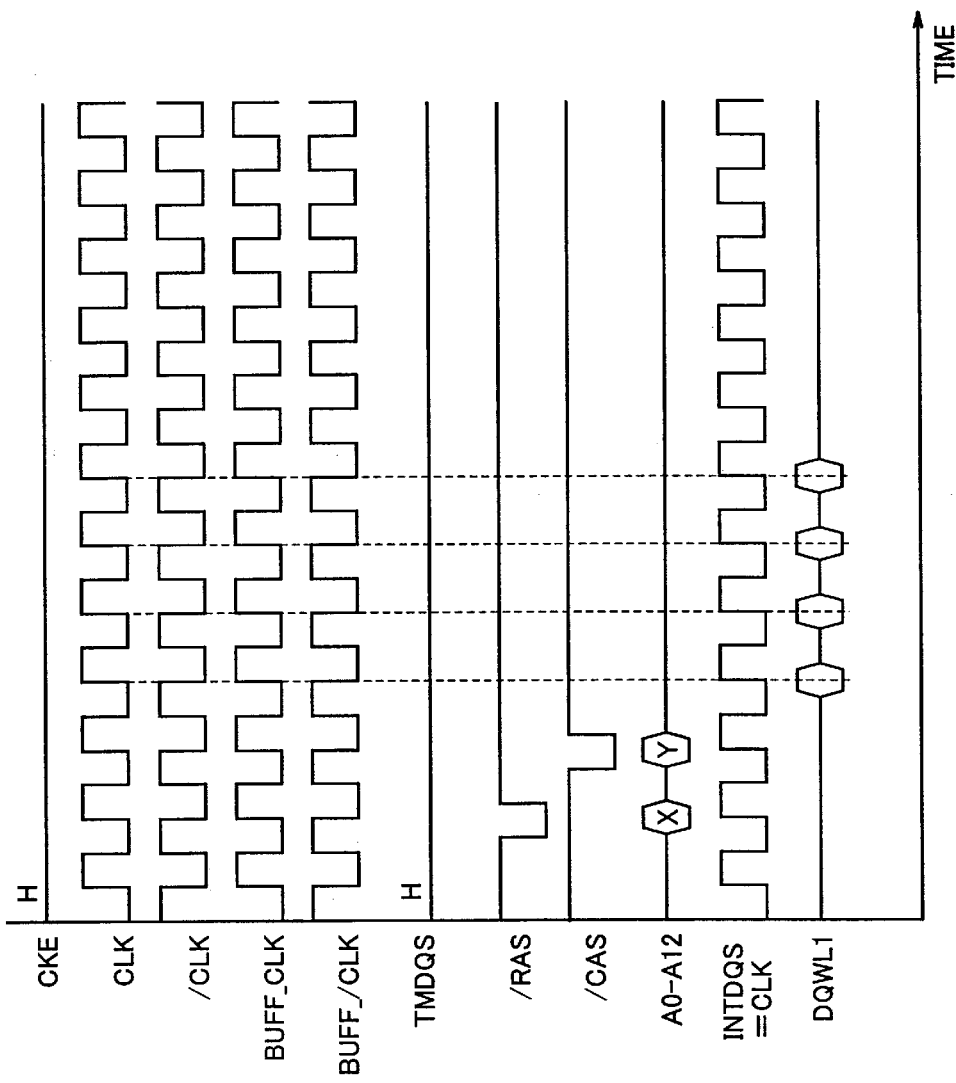
FIG. 9 is a timing chart of signals for illustrating a data write operation in a slow operation mode of the semiconductor memory device shown in FIG. 1.
Figure 10:
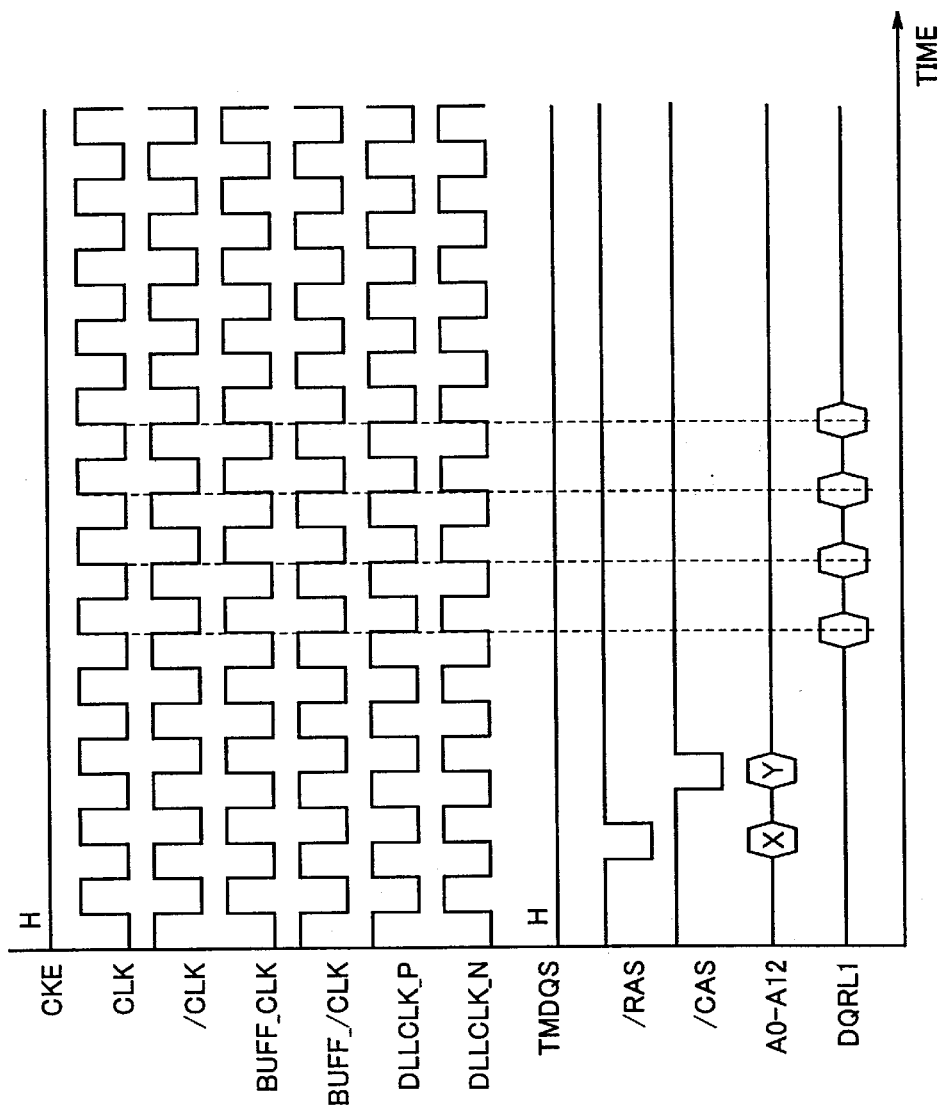
FIG. 10 is a timing chart of signals for illustrating a data read operation in the slow operation mode of the semiconductor memory device shown in FIG. 1.

Referring to FIGS. 9 and 10, description will now be given on the operation of semiconductor memory device 100 in a slow operation mode. The slow operation mode means a mode, in which the operation is performed more slowly than that in the normal operation mode of the DDR-SDRAM.

When semiconductor memory device 100 operates in the slow operation mode, mode register 50 provides signal TMDQS at H-level to signal select circuit 70. Therefore, signal select circuit 70 selects clock CLK sent from I/O terminal CLK in accordance with signal TMDQS at H-level, and provides it to QS buffer 110.

Referring to FIG. 9, the data write operation in a slow operation mode will now be described. It is assumed that semiconductor memory device 100 is externally supplied with reference voltage VREF, and clock buffer 20, control signal buffer 30 and QS buffer 110 are supplied with internal reference voltage INTVREF having the same voltage level as reference voltage VREF.

When the write operation starts, one of banks 61–64 included in memory cell array 60 is selected, and word line WLi and bit line pair BLj and /BLj are activated in the selected bank. Until this activation, the operations are performed in the same manner as those for the foregoing data writing in the normal operation mode.

Thereafter, QS buffer 110 receives clock CLK from signal select circuit 70, and buffers received clock CLK with internal reference voltage INTVREF. QS buffer 110 provides buffered clock CLK to I/O buffer 90 as internal data strobe signal INTDQS.

I/O buffer 90 receives write data DQWL1 from I/O terminals DQ0–DQ7 in synchronization with the rising of clock CLK, and buffers received write data DQWL1. I/O buffer 90 provides buffered write data DQWL1 to the bank selected from banks 61–64 in memory cell array 60 in synchronization with the rising of internal data strobe signal INTDQS (equal to CLK) sent from QS buffer 110.

Thereafter, the operations are performed in the same manner as those for the data writing in the normal operation mode.

In the slow operation mode, as described above, write data DQWL1 is supplied to semiconductor memory device 100 in synchronization with the rising of clock CLK, and is written into memory cell MC in synchronization with the rising of internal data strobe signal INTDQS (=CLK).

Referring to FIG. 10, description will now be given on the operation of reading data from memory cell MC in the slow operation mode. In the read operation, it is likewise assumed that semiconductor memory device 100 is externally supplied with reference voltage VREF, and clock buffer 20, control signal buffer 30 and QS buffer 110 receive internal reference voltage INTVREF having the same voltage level as reference voltage VREF.

When the read operation starts, one of banks 61–64 is selected in memory cell array 60, and word line WLi and bit line pair BLj and /BLj are activated in the selected bank (one of banks 61–64). Until this activation, the operations are performed in the same manner as those for the foregoing data reading in the normal operation mode.

Thereafter, data is read from active memory cell MC, and sense amplifier 640 included in memory cell array 60 amplifies read data DQRL1 to provide it to I/O buffer 90 via data bus BS2.

Control circuit 40 controls I/O buffer 90 to provide read data DQRL1 to I/O terminals DQ0–DQ7 in synchronization with the rising of period signal DLLCLK_P sent from DLL 80.

Thereby, I/O buffer 90 operates in accordance with timing corresponding to CAS latency CL (CAL=2.0 in the example illustrated in FIG. 10) determined by mode register 50, and provides read data DQRL1 to I/O terminals DQ0–DQ7 in synchronization with the rising of period signal DLLCLK_P sent from DLL 80. QS buffer 110 directly provides period signal DLLCLK_P sent from DLL 80 to I/O terminal DQS.

In the normal operation mode of semiconductor memory device 100, as described above, the data is read from memory cell MC in synchronization with clock BUFF_CLK, and read data DQRL1 is externally provided in synchronization with period signal DLLCLK_P produced inside semiconductor memory device 100.

Accordingly, when mode register 50 provides signal TMDQS at H-level to signal select circuit 70, semiconductor memory device 100 writes or reads the data into or from memory cell MC in synchronization with the rising of clock CLK or period signal DLLCLK_P. Thus, the data is written into and read from semiconductor memory device 100 more slowly than the normal operation mode.

In semiconductor memory device 100, as described above, when mode register 50 provides signal TMDQS at L-level to signal select circuit 70, signal select circuit 70 selects data strobe signal DQS, which is sent from I/O terminal DQS, in accordance with signal TMDQS at L-level instead of clock CLK sent from I/O terminal CLK, and provides it to QS buffer 110. Semiconductor memory device 100 is set to the normal operation mode in the DDR-SDRAM.

When mode register 50 provides signal TMDQS at H-level to signal select circuit 70, signal select circuit 70 selects clock CLK sent from I/O terminal CLK in accordance with signal TMDQS at H-level instead of data strobe signal DQS sent from I/O terminal DQS, and provides it to QS buffer 110. Semiconductor memory device 100 is set to the slow operation mode for operating more slowly than the normal operation mode in the DDR-SDRAM.

In the first embodiment, data strobe signal DQS corresponds to the first signal received from the I/O terminal (I/O terminal DQS), which is used only in the normal operation mode, and clock CLK corresponds to the second signal received from the I/O terminal (I/O terminal CLK), which is used in both the slow and normal operation modes.

Signal TMDQS at L-level corresponds to the "first select signal", and signal TMDQS at H-level corresponds to the "second select signal".

Further, address buffer 10, clock buffer 20, control signal buffer 30, control circuit 40, DLL 80, I/O buffer 90, QS buffer 110, row decoder 610, word line driver 620, column decoder 630 and sense amplifier 640 form the "peripheral circuit", which performs writing and/or reading of the data into and/or from the plurality of memory cells in accordance with the slow operation mode or the normal operation mode by using the signal, which is selected by signal select circuit 70.

Clocks CLK, /CLK, BUFF_CLK and BUFF_/CLK, data strobe signal DQS and period signals DLLCLK_P and DLLCLK_N have the same frequency. Clocks BUFF_CLK and BUFF_/CLK may be referred to as "internal period signals".

Further, in the factory-shipped state of semiconductor memory device 100, signal TMDQS at H-level or L-level is set in mode register 50. For semiconductor memory device 100 to be used in the normal operation mode, signal TMDQS at L-level is preset in mode register 50. For semiconductor memory device 100 to be used in the slow operation mode, signal TMDQS at H-level is preset in mode register 50.

Figure 11:
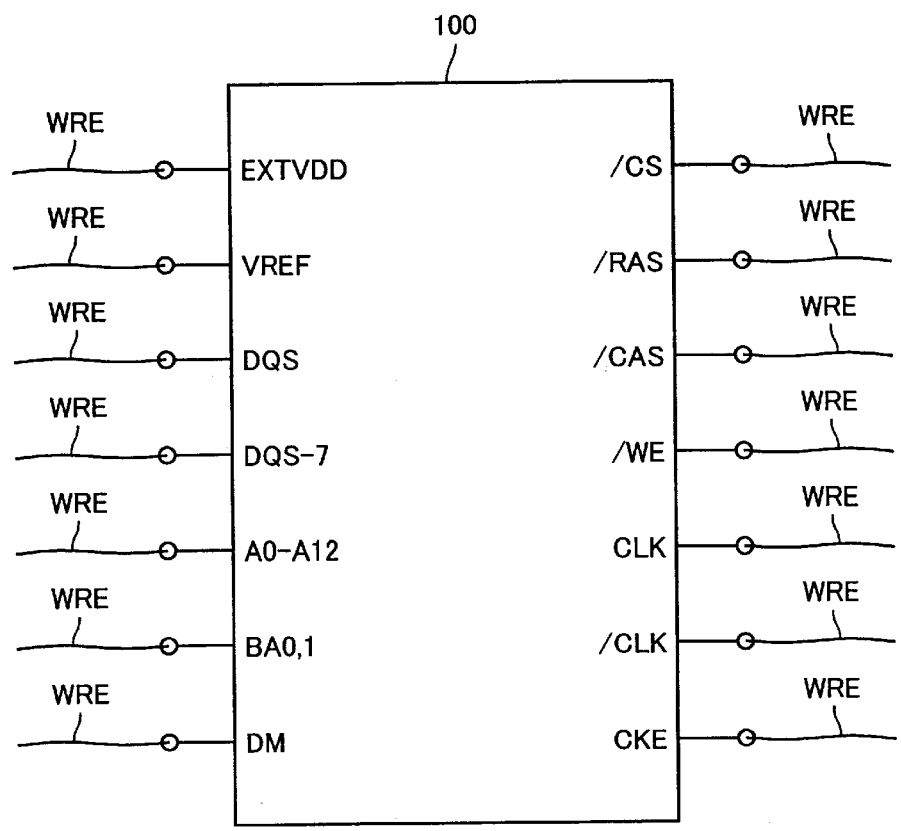
FIG. 11 is a plan showing a state of use in the normal operation mode of the semiconductor memory device shown in FIG. 1.

For semiconductor memory device 100 to be operated in the normal operation mode, all the I/O terminals for input or for input/output of control signals such as chip select signal /CS as well as addresses A0–A12, bank addresses BA0 and BA1, external power supply voltage EXTVDD, reference voltage VREF and others are connected to wires WRE and are used as shown in FIG. 11.

Figure 12:
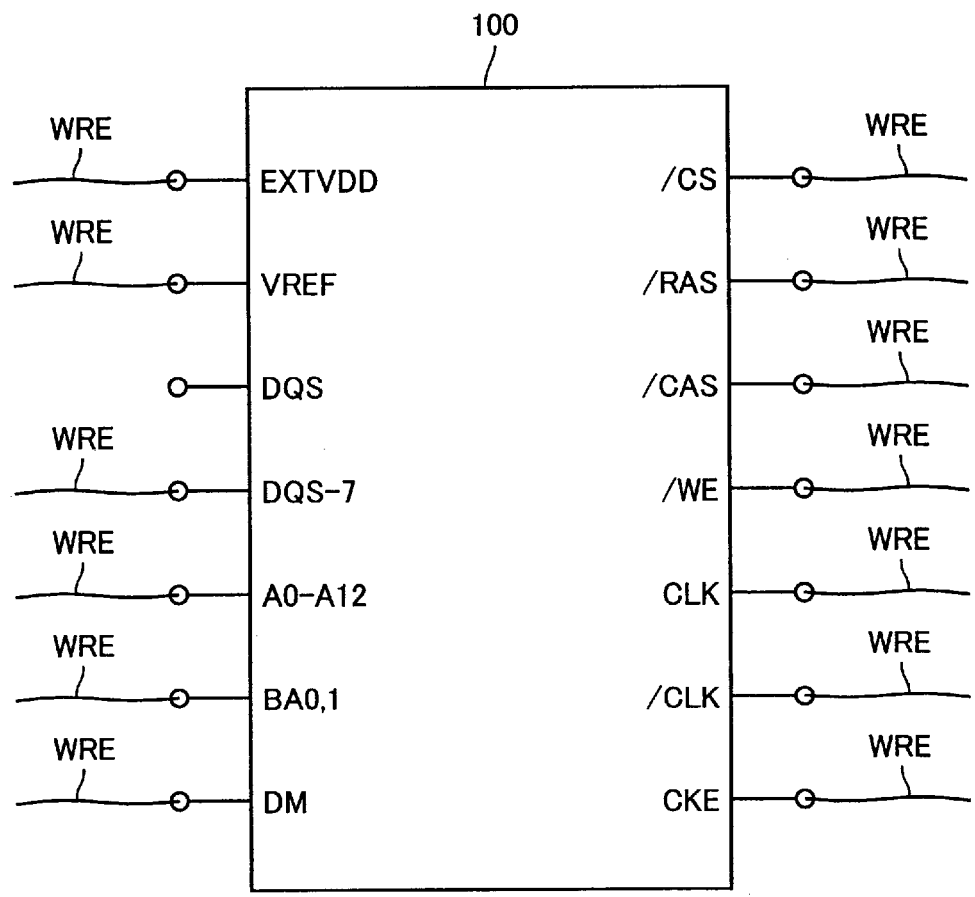
FIG. 12 is a plan showing a state of use in the slow operation mode of the semiconductor memory device shown in FIG. 1.

For semiconductor memory device 100 to be operated in the slow operation mode, the I/O terminals for input or for input/output of signals or the like except for data strobe signal DQS are connected to wires WRE and are used as shown in FIG. 12. Thus, the I/O terminal for data strobe signal DQS is not used in the slow operation mode. Consequently, when semiconductor memory device 100 is to be used in the slow operation mode, the external pins can be reduced in number so that more chips can be simultaneously tested.

According to the first embodiment, the semiconductor memory device includes the signal select circuit selecting clock CLK instead of data strobe signal DQS in the slow operation mode, and does not use the I/O terminal for the data strobe signal in the slow operation mode. Therefore, it is possible to increase the number of the semiconductor memory devices, which can be simultaneously tested for or in the slow tester evaluation, production test and slow system, as compared with conventional structures. The user using the semiconductor memory device in the slow operation mode can reduce the cost as compared with the conventional structure.

Second Embodiment

Figure 13:
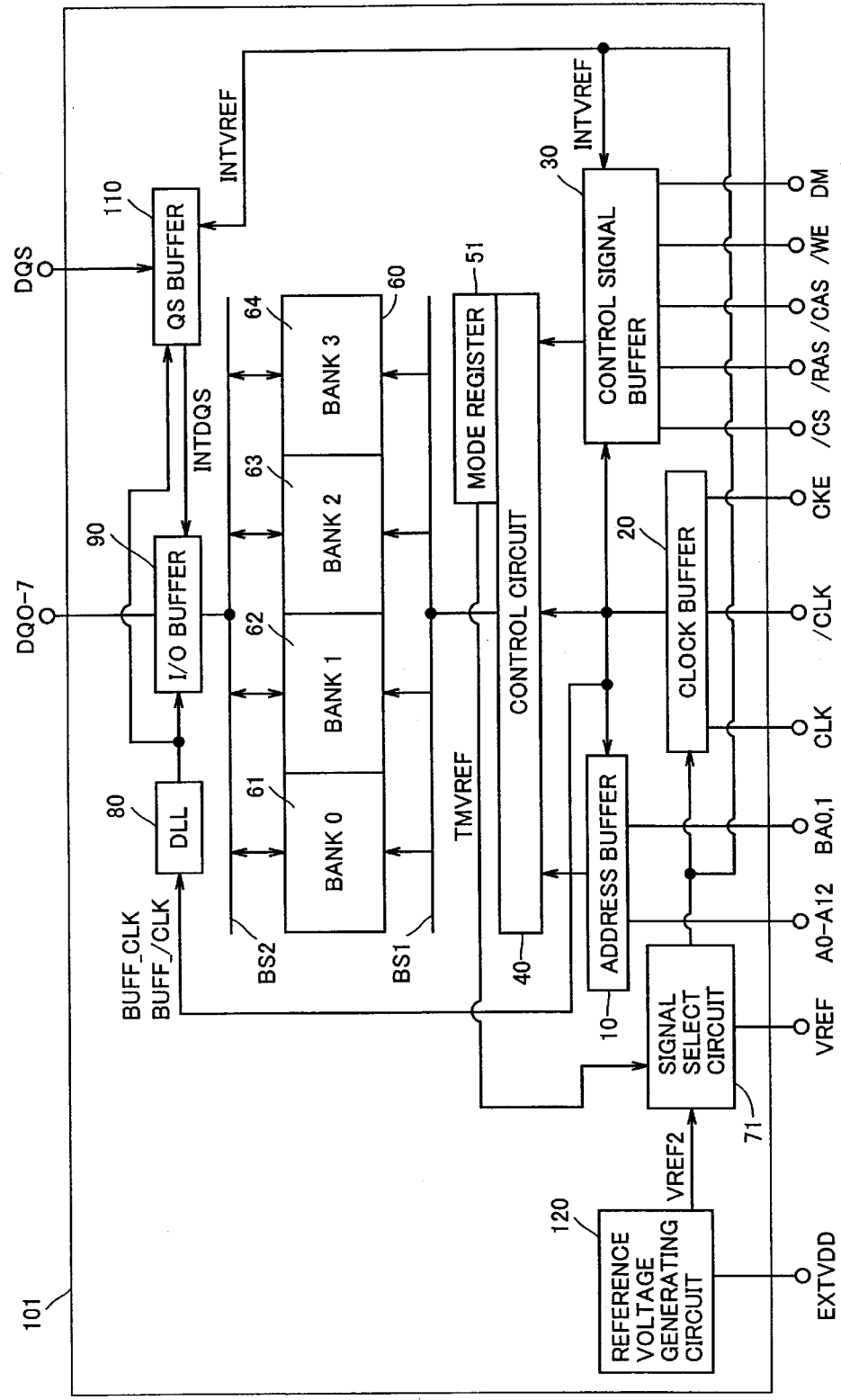
FIG. 13 is a schematic block diagram of a semiconductor memory device according to a second embodiment.

Referring to FIG. 13, a semiconductor memory device 101 according to a second embodiment is the same as semiconductor memory device 100 except for that mode register 50 in semiconductor memory device 100 is replaced with a mode register 51, signal select circuit 70 is replaced with signal select circuit 71 and a reference voltage generating circuit 120 is added.

Mode register 51 differs from mode register 50 only in such a function that a signal TMVREF is issued to signal select circuit 71 instead of signal TMDQS.

Reference voltage generating circuit 120 externally receives external power supply voltage EXTVDD, and divides received external power supply voltage EXTVDD to produce half the original voltage as an internal reference voltage VREF2. Reference voltage generating circuit 120 provides reference voltage VREF2 thus generated to signal select circuit 71.

Signal select circuit 71 externally receives reference voltage VREF, and also receives internal reference voltage VREF2 from reference voltage generating circuit 120. Signal select circuit 71 selects one of reference voltage VREF and internal reference voltage VREF2 in accordance with the logical level of signal TMVREF sent from mode register 51, and provides selected reference voltage VREF or internal reference voltage VREF2 to clock buffer 20, control signal buffer 30 and QS buffer 110 as internal reference voltage INTVREF.

Figure 14:
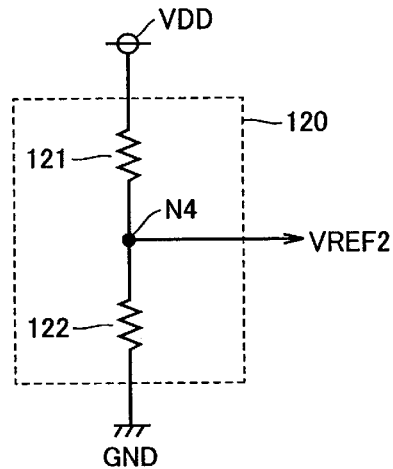
FIG. 14 is a circuit diagram of a reference voltage generating circuit shown in FIG. 13.

Referring to FIG. 14, reference voltage generating circuit 120 includes resistances 121 and 122. Resistances 121 and 122 are connected in series between power supply node VDD and ground node GND. Power supply node VDD externally receives external power supply voltage EXTVDD. Resistances 121 and 122 have the same resistance value.

Therefore, reference voltage generating circuit 120 divides external power supply voltage EXTVDD by two, and provides the divided voltage as internal reference voltage VREF2 from node N4.

Figure 15:
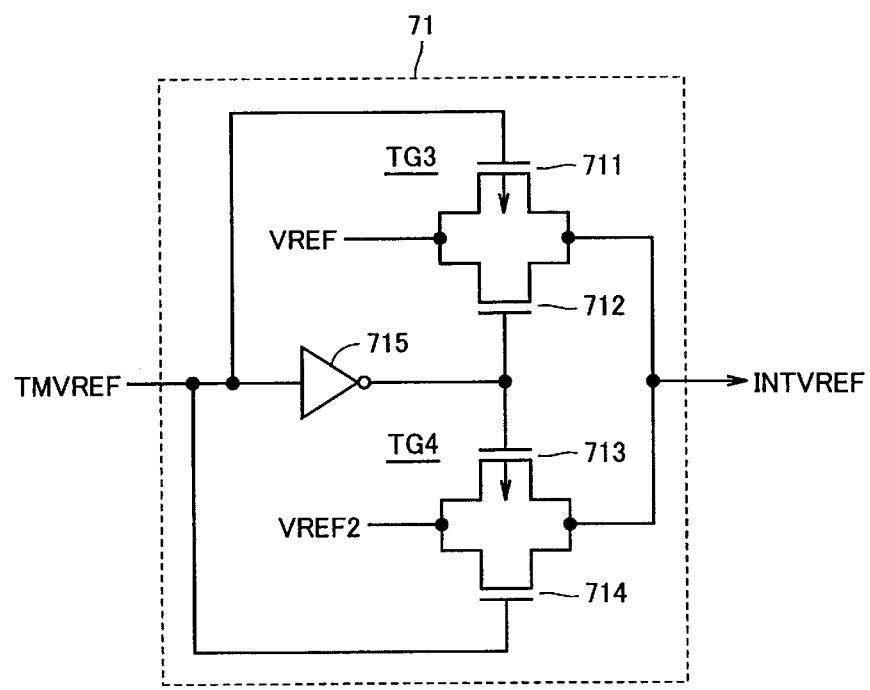
FIG. 15 is a circuit diagram of a signal select circuit shown in FIG. 13.

Referring to FIG. 15, signal select circuit 71 includes P-channel MOS transistors 711 and 713, N-channel MOS transistors 712 and 714, and an inverter 715.

P-channel MOS transistor 711 has source and drain terminals connected to source and drain terminals of N-channel MOS transistor 712, respectively. P-channel MOS transistor 711 receives signal TMVREF sent from mode register 51 on its gate terminal. N-channel MOS transistor 712 receives the output signal of inverter 715 on its gate terminal.

P- and N-channel MOS transistors 711 and 712 form a transfer gate TG3. Transfer gate TG3 receives externally supplied reference voltage VREF.

P-channel MOS transistor 713 has source and drain terminals connected to source and drain terminals of N-channel MOS transistor 714, respectively. P-channel MOS transistor 713 receives the output signal of inverter 715 on its gate terminal. N-channel MOS transistor 714 receives signal TMVREF sent from mode register 51 on its gate terminal.

P- and N-channel MOS transistors 713 and 714 form a transfer gate TG4. Transfer gate TG4 receives internal reference voltage VREF2 from signal select circuit 71.

When mode register 51 provides signal TMVREF at L-level to signal select circuit 71, inverter 715 inverts signal TMVREF at L-level to provide a signal at H-level to the gate terminals of N- and P-channel MOS transistors 712 and 713. P- and N-channel MOS transistors 711 and 714 receive signal TMVREF at L-level on their gate terminals.

Thereby, P- and N-channel MOS transistors 711 and 712 are turned on, and P- and N-channel MOS transistors 713 and 714 are turned off. Transfer gate TG3 provides reference voltage VREF, which is externally supplied, as internal reference voltage INTVREF.

When mode register 51 provides signal TMVREF at H-level to signal select circuit 71, inverter 715 inverts signal TMVREF at H-level to provide a signal at L-level to the gate terminals of N- and P-channel MOS transistors 712 and 713. P- and N-channel MOS transistors 711 and 714 receive signal TMVREF at H-level on their gate terminals.

Thereby, P- and N-channel MOS transistors 711 and 712 are turned off, and P- and N-channel MOS transistors 713 and 714 are turned on. Transfer gate TG4 provides, as internal reference voltage INTVREF, internal reference voltage VREF2 generated by reference voltage generating circuit 120.

As described above, signal select circuit 71 selects externally supplied reference voltage VREF or internal reference voltage VREF2 generated by reference voltage generating circuit 120 in accordance with the logical level of signal TMVREF sent from mode register 51, and provides selected reference voltage VREF or internal reference voltage VREF2 as internal reference voltage INTVREF.

Each of clock buffer 20, control signal buffer 30 and QS buffer 110 buffers the received signal based on reference voltage VREF serving as reference level LV (see FIG. 6) when signal select circuit 71 selects reference voltage VREF as internal reference voltage INTVREF.

Each of clock buffer 20, control signal buffer 30 and QS buffer 110 buffers the received signal based on reference voltage VREF2 serving as reference level LV (see FIG. 6) when signal select circuit 71 selects reference voltage VREF2 as internal reference voltage INTVREF.

Reference voltage VREF has the same voltage level as internal reference voltage VREF2, and is suitable to the normal operation mode of the DDR-SDRAM. Thus, reference voltage VREF has a small variation width of about ±2%. This is because the DDR-SDRAM performs fast input/output of data at 100 MHz or more, and therefore reference voltage VREF of a small variation width must be used for buffering various control signals such as write enable signal /WE and clocks CLK and /CLK. Therefore, reference voltage VREF having a reduced variation width is externally supplied to semiconductor memory device 101.

Internal reference voltage VREF2 has the same voltage level as reference voltage VREF, but is produced by dividing external power supply voltage EXTVDD as already described. Therefore, internal reference voltage VREF2 is liable to be affected by the variation width of external power supply voltage EXTVDD. Thus, external power supply voltage EXTVDD has a large variation width of about 10%, and internal reference voltage VREF2 produced by dividing external power supply voltage EXTVDD of the large variation width likewise has a large variation width as compared with reference voltage VREF.

In this case, it is difficult for clock buffer 20, control signal buffer 30 and QS buffer 110 to buffer accurately and rapidly the supplied signals or the like based on reference level LV formed of internal reference voltage VREF2 having a large variation.

In the invention, therefore, reference voltage VREF is used when semiconductor memory device 101 operates in the normal operation mode, and internal reference voltage VREF2 is used when semiconductor memory device 101 operates in the slow operation mode.

Accordingly, if mode register 51 is to be operated in the normal operation mode, signal TMVREF at L-level is supplied to signal select circuit 71. In accordance with signal TMVREF at L-level, signal select circuit 71 selects externally supplied reference voltage VREF, and provides selected reference voltage VREF as internal reference voltage INTVREF to clock buffer 20, control signal buffer 30 and QS buffer 110.

When semiconductor memory device 101 is to be operated in the slow operation mode, mode register 51 provides signal TMVREF at H-level to signal select circuit 71. In accordance with signal TMVREF at H-level, signal select circuit 71 selects internal reference voltage VREF2 sent from reference voltage generating circuit 120, and provides selected internal reference voltage VREF2 as internal reference voltage INTVREF to clock buffer 20, control signal buffer 30 and QS buffer 110.

The operation of semiconductor memory device 101 in the normal operation mode is the same as that already described in connection with the first embodiment except for that signal TMDQS is replaced with signal TMVREF, and the operation of signal select circuit 70 is replaced with the foregoing operation of signal select circuit 71.

The operation of semiconductor memory device 101 in the slow operation mode is the same as that already described in connection with the first embodiment except for that signal TMDQS is replaced with signal TMVREF, and the operation of signal select circuit 70 is replaced with the foregoing operation of select circuit 71.

In the second embodiment, reference voltage VREF corresponds to the first signal received from the I/O terminal (I/O terminal VREF) used only in the normal operation mode, and internal reference voltage VREF2 corresponds to the second signal received from the I/O terminal (I/O terminal EXTVDD) used in both the slow and normal operation modes.

Signal TMVREF at L-level corresponds to the "first select signal", and signal TMVREF at H-level corresponds to the "second select signal".

In the factory-shipped state of semiconductor memory device 101, signal TMVREF at H- or L-level is set in mode register 51. When semiconductor memory device 101 is to be used in the normal operation mode, signal TMVREF at L-level is preset in mode register 51. When semiconductor memory device 101 is to be used in the slow operation mode, signal TMVREF at H-level is preset in mode register 51.

For semiconductor memory device 101 to be operated in the normal operation mode, all the I/0 terminals for input or for input/output of control signals such as chip select signal /CS as well as addresses A0–A12, bank addresses BA0 and BA1, external power supply voltage EXTVDD, reference voltage VREF and others are connected to wires WRE and are used as shown in FIG. 11.

Figure 16:
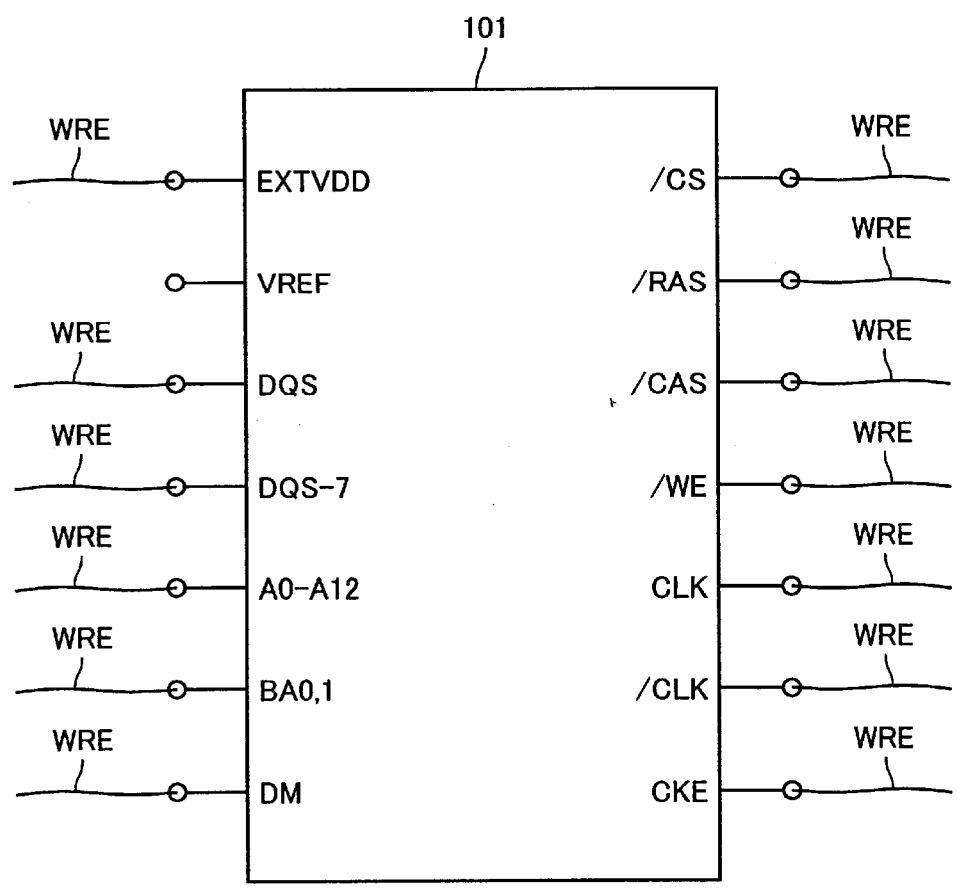
FIG. 16 is a plan showing a state of use in the slow operation mode of the semiconductor memory device shown in FIG. 13.

For semiconductor memory device 101 to be operated in the slow operation mode, the I/O terminals for input or for input/output of signals or the like except for reference voltage VREF are connected to wires WRE and are used as shown in FIG. 16. Thus, I/O terminal VREF for reference voltage VREF is not used in the slow operation mode.

According to the second embodiment, the semiconductor memory device for the slow operation mode includes the signal select circuit selecting internal reference voltage VREF2 instead of reference voltage VREF, and does not use the I/O terminal for reference voltage VREF. Therefore, it is possible to increase the number of the semiconductor memory devices, which can be simultaneously tested for or in the slow tester evaluation, production test and slow system, as compared with conventional structures. The user using the semiconductor memory device in the slow operation mode can reduce the cost as compared with the conventional structure.

Third Embodiment

Figure 17:
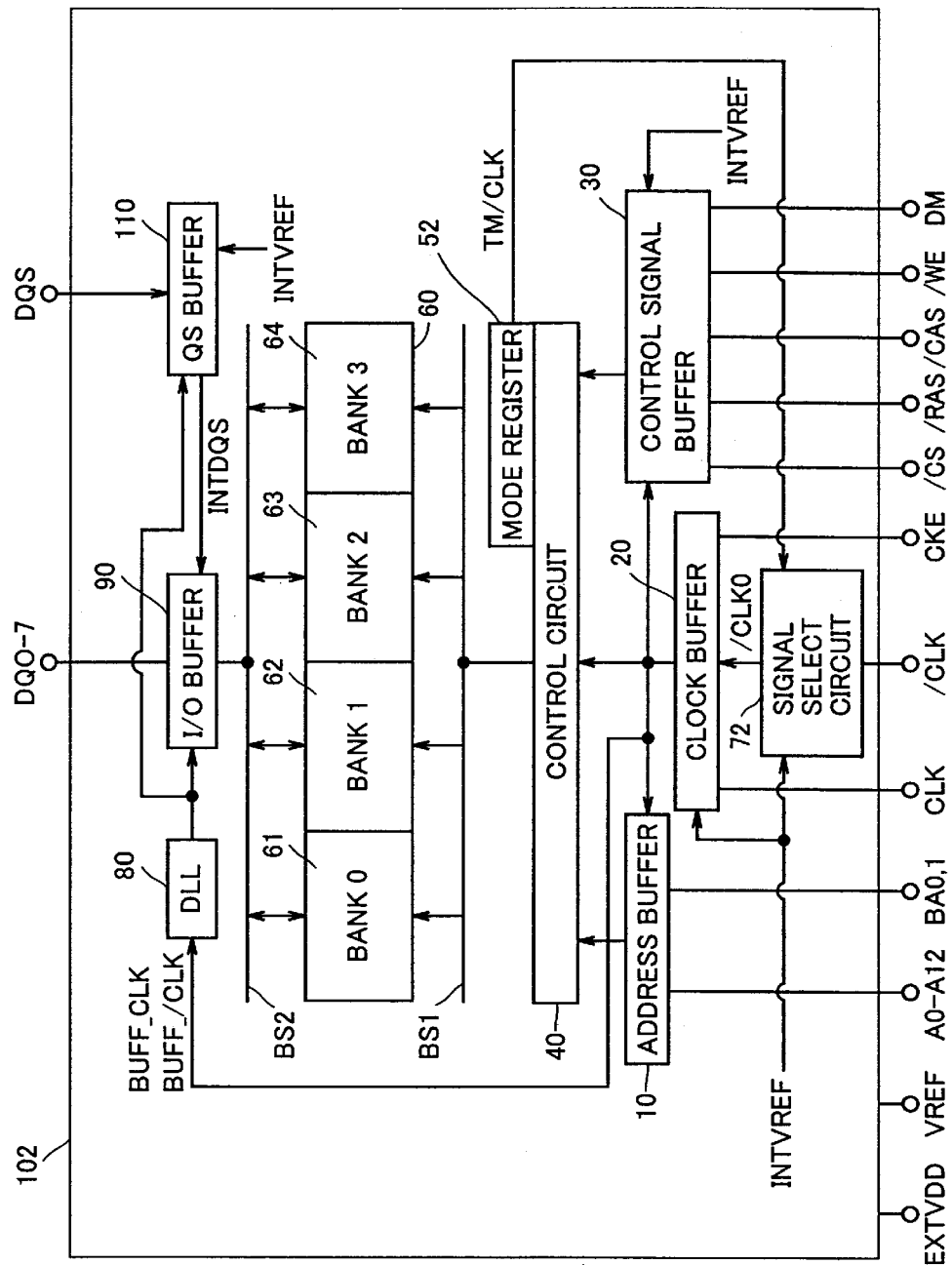
FIG. 17 is a schematic block diagram of a semiconductor memory device according to a third embodiment.

Referring to FIG. 17, a semiconductor memory device 102 according to a third embodiment differs from semiconductor memory device 100 in that mode register 50 in semiconductor memory device 100 is replaced with a mode register 52, and signal select circuit 70 is replaced with a signal select circuit 72.

Mode register 52 differs from mode register 50 only in that mode register 52 provides a signal TM/CLK to signal select circuit 72 instead of signal TMDQS.

Signal select circuit 72 selects one of internal reference voltage INTVREF and clock /CLK in accordance with the logical level of signal TM/CLK sent from mode register 52, and provides selected internal reference voltage INTVREF or clock /CLK to clock buffer 20 as a signal /CLK0.

Figure 18:
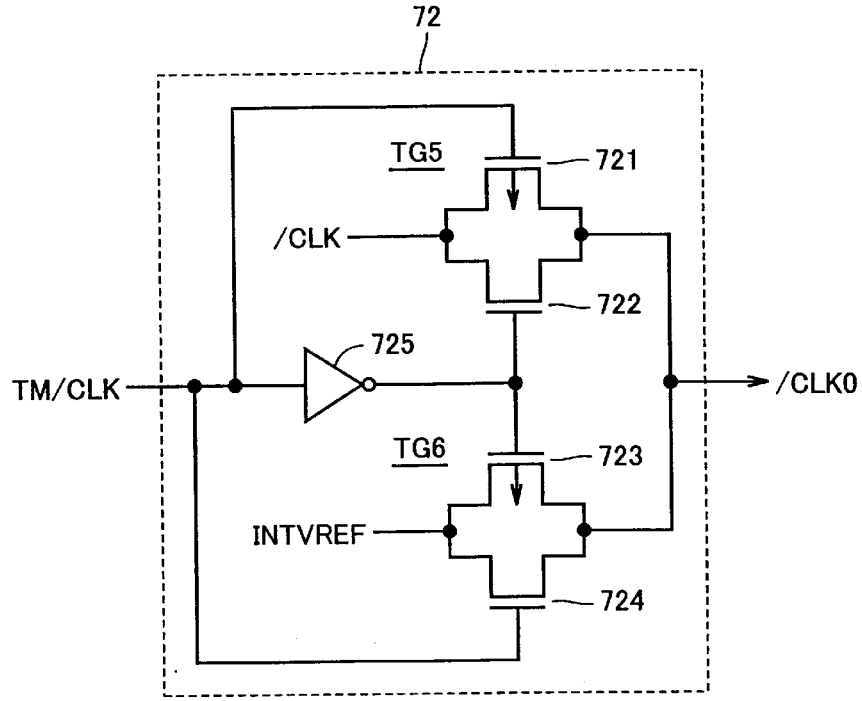
FIG. 18 is a circuit diagram of a signal select circuit shown in FIG. 17.

Referring to FIG. 18, signal select circuit 72 includes P-channel MOS transistors 721 and 723, N-channel MOS transistors 722 and 724, and an inverter 725.

P-channel MOS transistor 721 has source and drain terminals connected to source and drain terminals of N-channel MOS transistor 722, respectively. P-channel MOS transistor 721 receives signal TM/CLK sent from mode register 52 on its gate terminal. N-channel MOS transistor 722 receives the output signal of inverter 725 on its gate terminal.

P- and N-channel MOS transistors 721 and 722 form a transfer gate TG5. Transfer gate TG5 receives externally supplied clock /CLK.

P-channel MOS transistor 723 has source and drain terminals connected to source and drain terminals of N-channel MOS transistor 724, respectively. P-channel MOS transistor 723 receives the output signal of inverter 725 on its gate terminal. N-channel MOS transistor 724 receives signal TM/CLK sent from mode register 52 on its gate terminal.

P- and N-channel MOS transistors 723 and 724 form a transfer gate TG6. Transfer gate TG6 receives internal reference voltage INTVREF.

When mode register 52 provides signal TM/CLK at L-level to signal select circuit 72, inverter 725 inverts signal TM/CLK to provide a signal at H-level to the gate terminals of N- and P-channel MOS transistors 722 and 723. P- and N-channel MOS transistors 721 and 724 receive signal TM/CLK at L-level on their gate terminals.

Thereby, P- and N-channel MOS transistors 721 and 722 are turned on, and P- and N-channel MOS transistors 723 and 724 are turned off. Transfer gate TG5 provides clock /CLK as signal /CLK0.

When mode register 52 provides signal TM/CLK at H-level to signal select circuit 72, inverter 725 inverts signal TM/CLK at H-level to provide a signal at L-level to the gate terminals of N- and P-channel MOS transistors 722 and 723. P- and N-channel MOS transistors 721 and 724 receive signal TM/CLK at H-level on their gate terminals.

Thereby, P- and N-channel MOS transistors 721 and 722 are turned off, and P- and N-channel MOS transistors 723 and 724 are turned on. Transfer gate TG6 provides internal reference voltage INTVREF as signal /CLK0.

As described above, signal select circuit 72 selects clock /CLK or internal reference voltage INTVREF in accordance with the logical level of signal TM/CLK sent from mode register 52, and provides clock /CLK or internal reference voltage INTVREF as signal /CLK0 to clock buffer 20.

Figure 19:
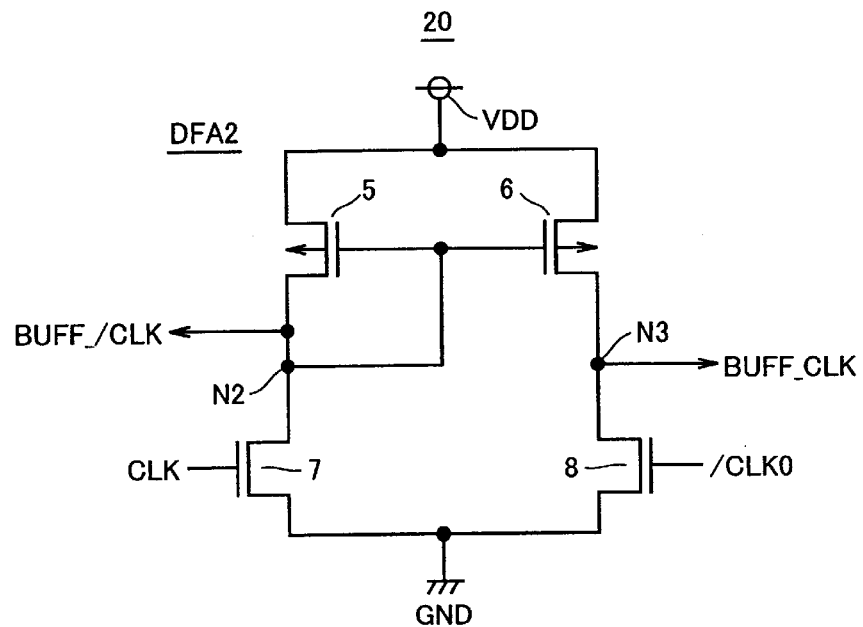
FIG. 19 is a circuit diagram of a differential amplifier circuit included in a clock buffer shown in FIG. 17.

In the third embodiment, a differential amplifier circuit DFA2 included in clock buffer 20 receives signal /CLK0 on the gate terminal of N-channel MOS transistor 8, as shown in FIG. 19.

Therefore, when N-channel MOS transistor 8 receives clock /CLK on its gate terminal as signal /CLK0, differential amplifier circuit DFA2 provides clocks BUFF_CLK and BUFF_/CLK in accordance with the operations already described. When N-channel MOS transistor 8 receives internal reference voltage INTVREF as signal /CLK0, differential amplifier circuit DFA2 provides clock BUFF_/CLK having the logical level, which changes in accordance with a relationship in magnitude between the voltage forming clock CLK and internal reference voltage INTVREF, from node N2, and provides clock BUFF_CLK having a uniform logical level from node N3.

The logical level of clock BUFF_CLK is uniform because internal reference voltage INTVREF forms a reference for determining H- or L-level of the output signal of differential amplifier circuit DFA2, and also forms signal /CLK0 supplied to the gate terminal of N-channel MOS transistor 8.

Accordingly, clock buffer 20 provides only clock BUFF_/CLK as a period signal when it receives internal reference voltage INTVREF as signal /CLK0 from signal select circuit 72.

As described above, clock buffer 20 provides mutually complementary two clocks BUFF_CLK and BUFF_/CLK when signal select circuit 72 selects clock /CLK, and provides one clock BUFF_/CLK when signal select circuit 72 selects internal reference voltage INTVREF.

Thereby, DLL 80 produces period signal DLLCLK_N based on clock BUFF_/CLK sent from clock buffer 20, and provides period signal DLLCLK_N thus produced to I/O buffer 90 and QS buffer 110.

Therefore, mode register 52 provides signal TM/CLK at L-level to signal select circuit 72 when semiconductor memory device 102 operates in the normal operation mode. Signal select circuit 72 selects externally supplied clock /CLK in accordance with signal TM/CLK at L-level, and provides selected clock /CLK to clock buffer 20.

Mode register 52 provides signal TM/CLK at H-level to signal select circuit 72 when semiconductor memory device 102 operates in the slow operation mode. Signal select circuit 72 selects internal reference voltage INTVREF in accordance with signal TM/CLK at H-level, and provides selected internal reference voltage INTVREF to clock buffer 20.

The operations of semiconductor memory device 102 in the normal operation mode are the same as those already described in connection with the first embodiment except for that signal TMDQS in FIGS. 7 and 8 is replaced with signal TM/CLK, and the operation of signal select circuit 70 is replaced with the foregoing operation of signal select circuit 72.

Figure 20:
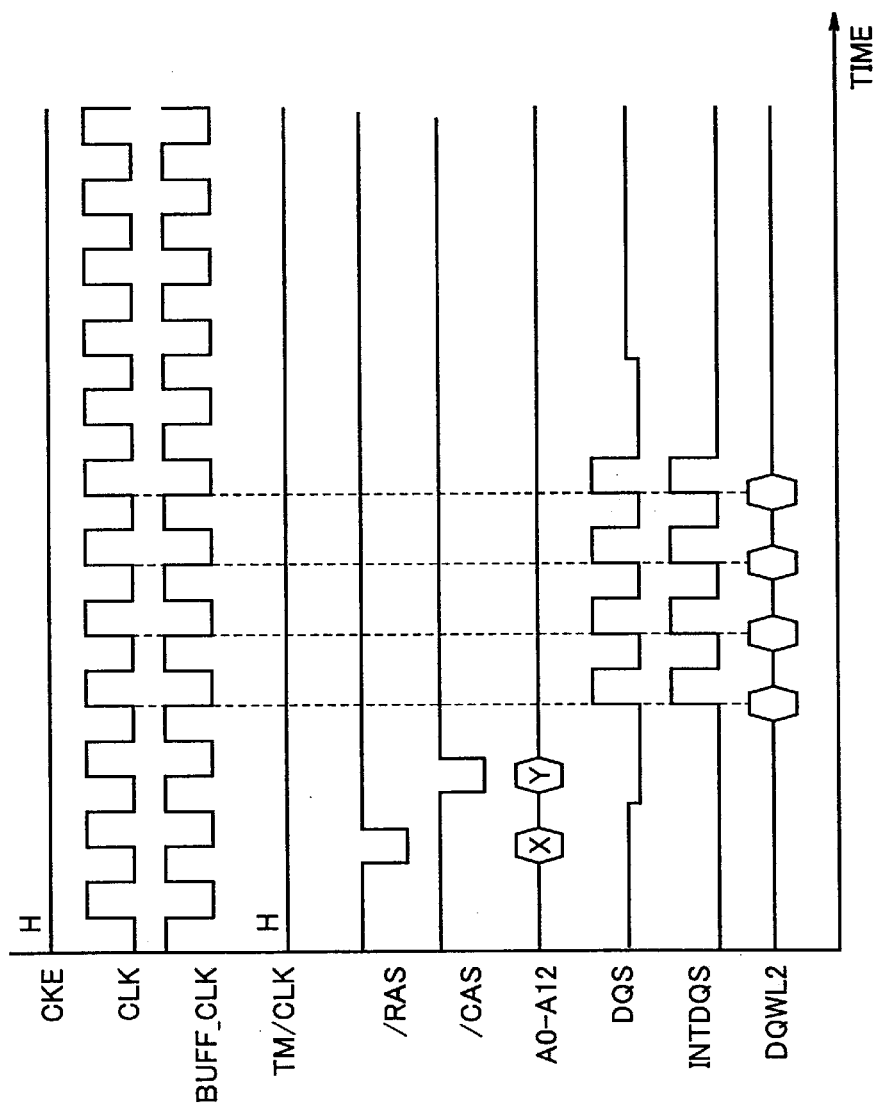
FIG. 20 is a timing chart of signals for illustrating a data write operation in the slow operation mode of the semiconductor memory device shown in FIG. 17.
Figure 21:
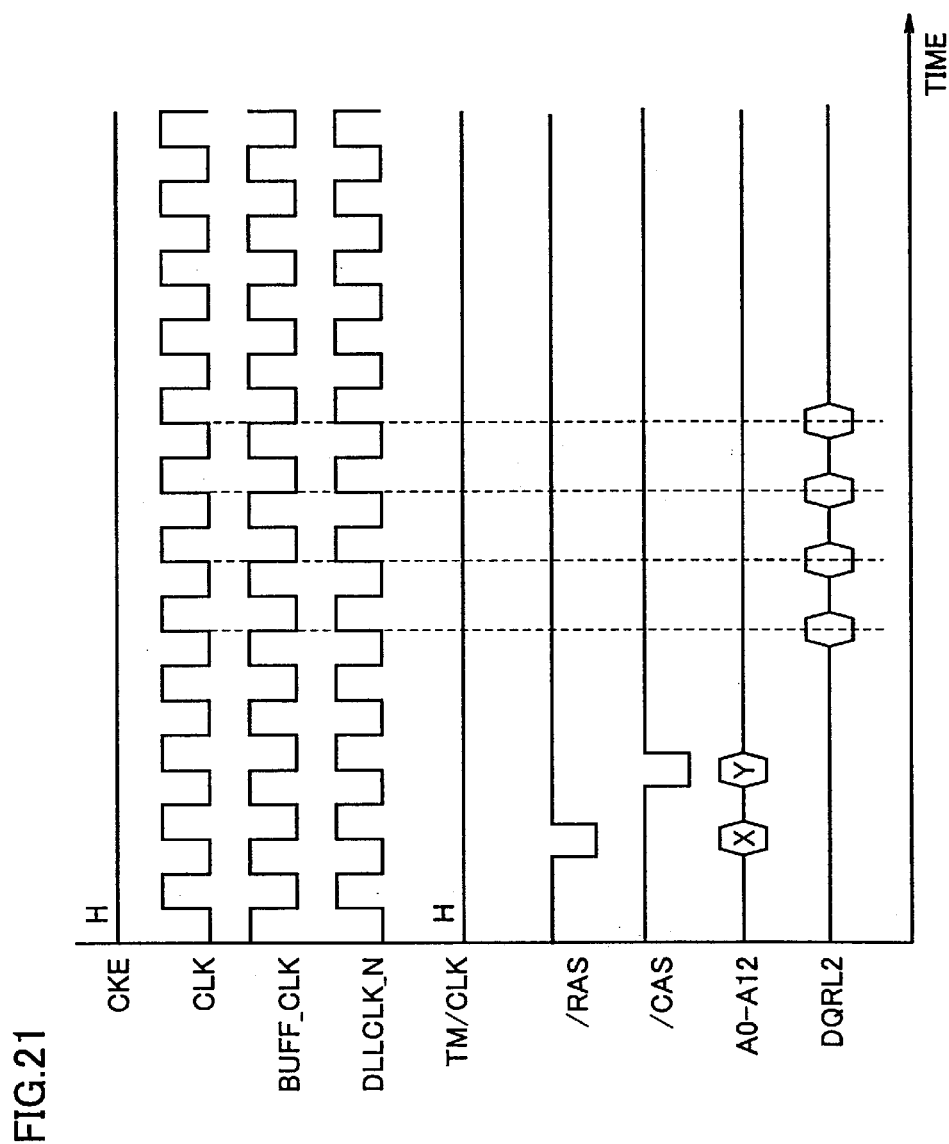
FIG. 21 is a timing chart of signals for illustrating a data read operation in the slow operation mode of the semiconductor memory device shown in FIG. 17.

Referring to FIGS. 20 and 21, description will now be given on the operations of semiconductor memory device 102 in the slow operation mode.

When semiconductor memory device 102 operates in the slow operation mode, mode register 52 provides signal TM/CLK at H-level to signal select circuit 72. Therefore, signal select circuit 72 selects internal reference voltage INTVREF, which has the same voltage level as reference voltage VREF supplied from I/O terminal VREF, in accordance with signal TM/CLK at H-level, and provides it to clock buffer 20.

Referring to FIG. 20, the data write operation in the slow operation mode will now be described. It is assumed that semiconductor memory device 102 is externally supplied with reference voltage VREF, and clock buffer 20, control signal buffer 30, signal select circuit 72 and QS buffer 110 are supplied with internal reference voltage INTVREF having the same voltage level as reference voltage VREF.

When the data write operation starts, semiconductor memory device 102 is externally supplied with clock CLK and clock enable signal CKE. Mode register 52 provides signal TM/CLK at H-level to signal select circuit 72.

Thereby, signal select circuit 72 selects internal reference voltage INTVREF in accordance with signal TM/CLK at H-level, and provides it to clock buffer 20. Clock buffer 20 buffers clock CLK, and provides buffered clock BUFF_/CLK to address buffer 10, control signal buffer 30, control circuit 40 and DLL 80. Clock buffer 20 buffers clock enable signal CKE by differential amplifier circuit DFA1, and provides buffered clock enable signal CKE to control circuit 40.

Also, semiconductor memory device 102 is externally supplied with chip select signal /CS at L-level. Control signal buffer 30 buffers chip select signal /CS at L-level with internal reference voltage INTVREF, and provides buffered chip select signal /CS at L-level to control circuit 40 in synchronization with clock BUFF_/CLK.

Control circuit 40 determines at the time of certain rising of clock BUFF_CLK whether clock enable signal CKE is at H-level or L-level. In this case, clock enable signal CKE is at H-level so that control circuit 40 determines chip select signal /CS at L-level as valid at the time of next rising of clock BUFF_CLK, and sets semiconductor memory device 102 to the selected state.

Thereafter, semiconductor memory device 102 is externally supplied with write enable signal /WE at L-level, row address strobe signal /RAS at H-level and column address strobe signal /CAS at L-level, and control signal buffer 30 buffers write enable signal /WE at L-level, row address strobe signal /RAS at H-level and column address strobe signal /CAS at L-level with internal reference voltage INTVREF. Control signal buffer 30 provides buffered write enable signal /WE at L-level, row address strobe signal /RAS at H-level and column address strobe signal /CAS at L-level to control circuit 40.

Thereby, control circuit 40 recognizes the data write mode in accordance with write enable signal /WE at L-level, row address strobe signal /RAS at H-level and column address strobe signal /CAS at L-level sent from control signal buffer 30.

In the write mode, mode register 52 instructs control circuit 40 to deactivate the output of DLL 80, and control circuit 40 deactivates the output of DLL 80 in accordance with the instruction sent from mode register 52.

Thereafter, bank addresses BA0 and BA1 are externally supplied to semiconductor memory device 102. Address buffer 10 buffers bank addresses BA0 and BA1, and provides buffered bank addresses BA0 and BA1 to control circuit 40 in synchronization with clock BUFF_/CLK.

Control circuit 40 selects one bank from banks 61–64 included in memory cell array 60 based on bank addresses BA0 and BA1 sent from address buffer 10.

Semiconductor memory device 102 is externally supplied with addresses A0–A12 in synchronization with switching of row address strobe signal /RAS from H-level to L-level, and address buffer 10 buffers addresses A0–A12, and provides buffered addresses A0–A12 to control circuit 40 in synchronization with clock BUFF_/CLK. Semiconductor memory device 102 is externally supplied with row address strobe signal /RAS at L-level, and control signal buffer 30 performs the foregoing operations to buffer row address strobe signal /RAS at L-level, and to provide buffered row address strobe signal /RAS at L-level to control circuit 40 in synchronization with clock BUFF_/CLK.

Control circuit 40 determines addresses A0–A12 sent from address buffer 10 as row address X in accordance with the timing of recognition of row address strobe signal /RAS at L-level, column address strobe signal /CAS at H-level and write enable signal /WE at H-level by an internal command decoder (not shown), and provides row address X to the bank selected from banks 61–64 in memory cell array 60 in synchronization with clock BUFF_/CLK.

Thereafter, semiconductor memory device 102 is externally supplied with addresses A0–A12 in synchronization with the switching of column address strobe signal /CAS from H-level to L-level, and address buffer 10 buffers addresses A0–A12, and provides buffered addresses A0–A12 to control circuit 40 in synchronization with clock BUFF_/CLK.

Further, column address strobe signal /CAS at L-level is externally supplied, and control signal buffer 30 buffers column address strobe signal /CAS at L-level with internal reference voltage INTVREF, and provides buffered column address strobe signal /CAS at L-level to control circuit 40 in synchronization with clock BUFF_/CLK.

Control circuit 40 determines addresses A0–A12 received from address buffer 10 as column address Y in accordance with the timing of recognition of row address strobe signal /RAS at H-level and column address strobe signal /CAS at L-level by the command decoder, and provides column address Y to the bank selected from banks 61–64 in memory cell array 60 in synchronization with clock BUFF_/CLK.

QS buffer 110 buffers data strobe signal DQS with internal reference voltage INTVREF. QS buffer 110 provides buffered internal data strobe signal INTDQS to I/O buffer 90.

I/O buffer 90 receives write data DQWL2 from I/O terminals DQ0–DQ7 in synchronization with the rising of data strobe signal DQS, and buffers received write data DQWL2. I/O buffer 90 provides buffered write data DQWL2 to the bank selected from banks 61–64 in memory cell array 60 in synchronization with the rising of internal data strobe signal INTDQS sent from QS buffer 110.

In memory cell array 60, row decoder 610 decodes row address X sent from control circuit 40, and provides decoded row address X to word line driver 620. Word line driver 620 activates word line WLi designated by decoded row address X.

Column decoder 630 decodes column address Y sent from control circuit 40, and activates bit line pair BLj and /BLj designated by decoded column address Y. Write data DQWL2 is written via sense amplifier 640 into memory cell MC designated by word line WLi and bit line pair BLj and /BLj thus activated.

In the slow operation mode, write data DQWL2 is supplied to semiconductor memory device 102 in synchronization with rising of data strobe signal DQS, and is written into memory cell MC in synchronization with rising of internal data strobe signal INTDQS.

Referring to FIG. 21, the operation of reading data from memory cell MC in the slow operation mode will now be described. In the read operation, it is likewise assumed that semiconductor memory device 102 is externally supplied with reference voltage VREF, and clock buffer 20, control signal buffer 30, signal select circuit 72 and QS buffer 110 receive internal reference voltage INTVREF having the same voltage level as reference voltage VREF.

When the read operation starts, one of banks 61–64 is selected in memory cell array 60, and word line WLi and bit line pair BLj and /BLj are activated in the selected bank (one of banks 61–64). Until this activation, the operations are performed in the same manner as those for the data writing.

Thereafter, data is read from active memory cell MC, and sense amplifier 640 included in memory cell array 60 amplifies read data DQRL2 to provide it to I/O buffer 90 via data bus BS2.

Control circuit 40 controls I/O buffer 90 to provide read data DQRL2 to I/O terminals DQ0–DQ7 in synchronization with the rising of period signal DLLCLK_N sent from DLL 80.

Thereby, I/O buffer 90 operates in accordance with timing corresponding to CAS latency CL (CAL=2.0 in the example illustrated in FIG. 21) determined by mode register 52, and provides read data DQRL2 to I/O terminals DQ0–DQ7 in synchronization with the rising of period signal DLLCLK_N sent from DLL 80. QS buffer 110 directly provides period signal DLLCLK_N sent from DLL 80 to I/O terminal DQS.

In the slow operation mode of semiconductor memory device 102, as described above, the data is read from memory cell MC in synchronization with clock BUFF_/CLK, and read data DQRL2 is externally provided in synchronization with period signal DLLCLK_N produced inside semiconductor memory device 102.

In semiconductor memory device 102, when mode register 52 provides signal TM/CLK at H-level to signal select circuit 72, writing or reading of the data into or from memory cell MC is performed in synchronization with the rising of data strobe signal DQS or period signal DLLCLK_N. Thus, the data is written into and read from semiconductor memory device 102 more slowly than the normal operation mode.

In the third embodiment, clock /CLK corresponds to the first signal received from the I/O terminal (I/O terminal /CLK), which is used only in the normal operation mode, and internal reference voltage INTVREF corresponds to the second signal received from the I/O terminal (I/O terminal VREF), which is used in both the slow and normal operation modes.

Signal TM/CLK at L-level corresponds to the "first select signal", and signal TM/CLK at H-level corresponds to the "second select signal".

In the factory-shipped state of semiconductor memory device 102, signal TM/CLK at H- or L-level is set in mode register 52. When semiconductor memory device 102 is to be used in the normal operation mode, signal TM/CLK at L-level is preset in mode register 52. When semiconductor memory device 102 is to be used in the slow operation mode, signal TM/CLK at H-level is preset in mode register 52.

For semiconductor memory device 102 to be operated in the normal operation mode, all the I/O terminals for input or for input/output of control signals such as chip select signal /CS as well as addresses A0–A12, bank addresses BA0 and BA1, external power supply voltage EXTVDD, reference voltage VREF and others are connected to wires WRE and are used as shown in FIG. 11.

Figure 22:
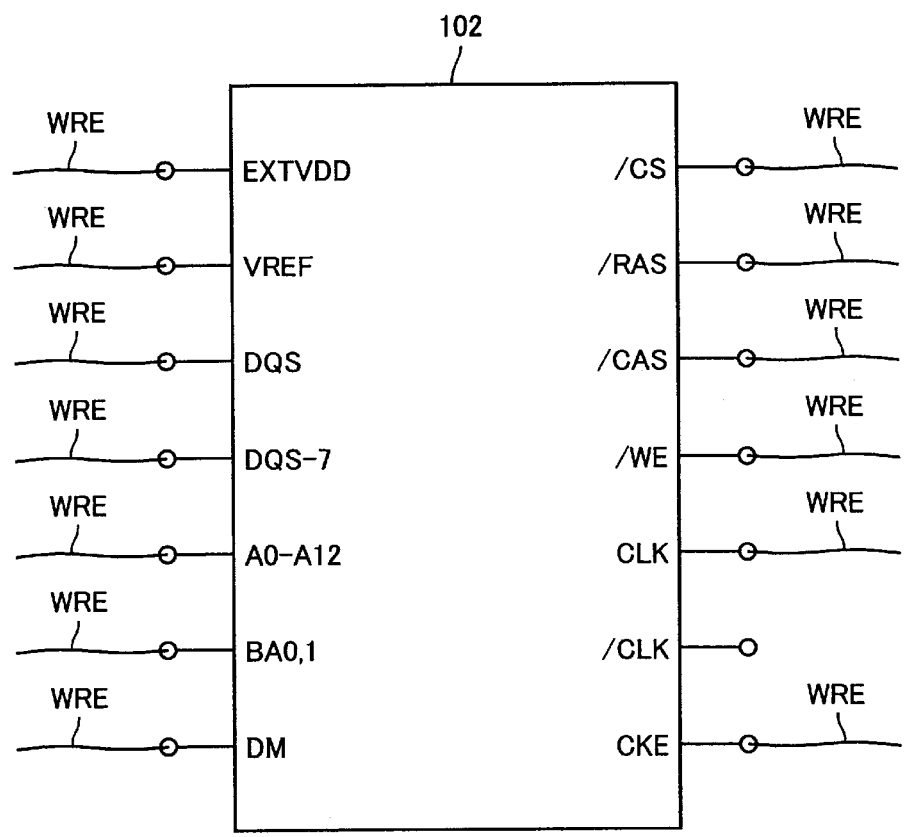
FIG. 22 is a plan showing a state of use in the slow operation mode of the semiconductor memory device shown in FIG. 17.

For semiconductor memory device 102 to be operated in the slow operation mode, the I/O terminals for signals or the like except for clock /CLK are connected to wires WRE and are used as shown in FIG. 22. Thus, the I/O terminal for complementary clock /CLK is not used in the slow operation mode.

Structures and operations other than the above are the same as those of the first embodiment.

According to the third embodiment, the semiconductor memory device for the slow operation mode includes the signal select circuit selecting internal reference voltage INTVREF instead of clock /CLK, and does not use the I/O terminal for clock /CLK. Therefore, it is possible to increase the number of the semiconductor memory devices, which can be simultaneously tested for or in the slow tester evaluation, production test and slow system, as compared with conventional structures. The user using the semiconductor memory device in the slow operation mode can reduce the cost as compared with the conventional structure.

Fourth Embodiment

Figure 23:
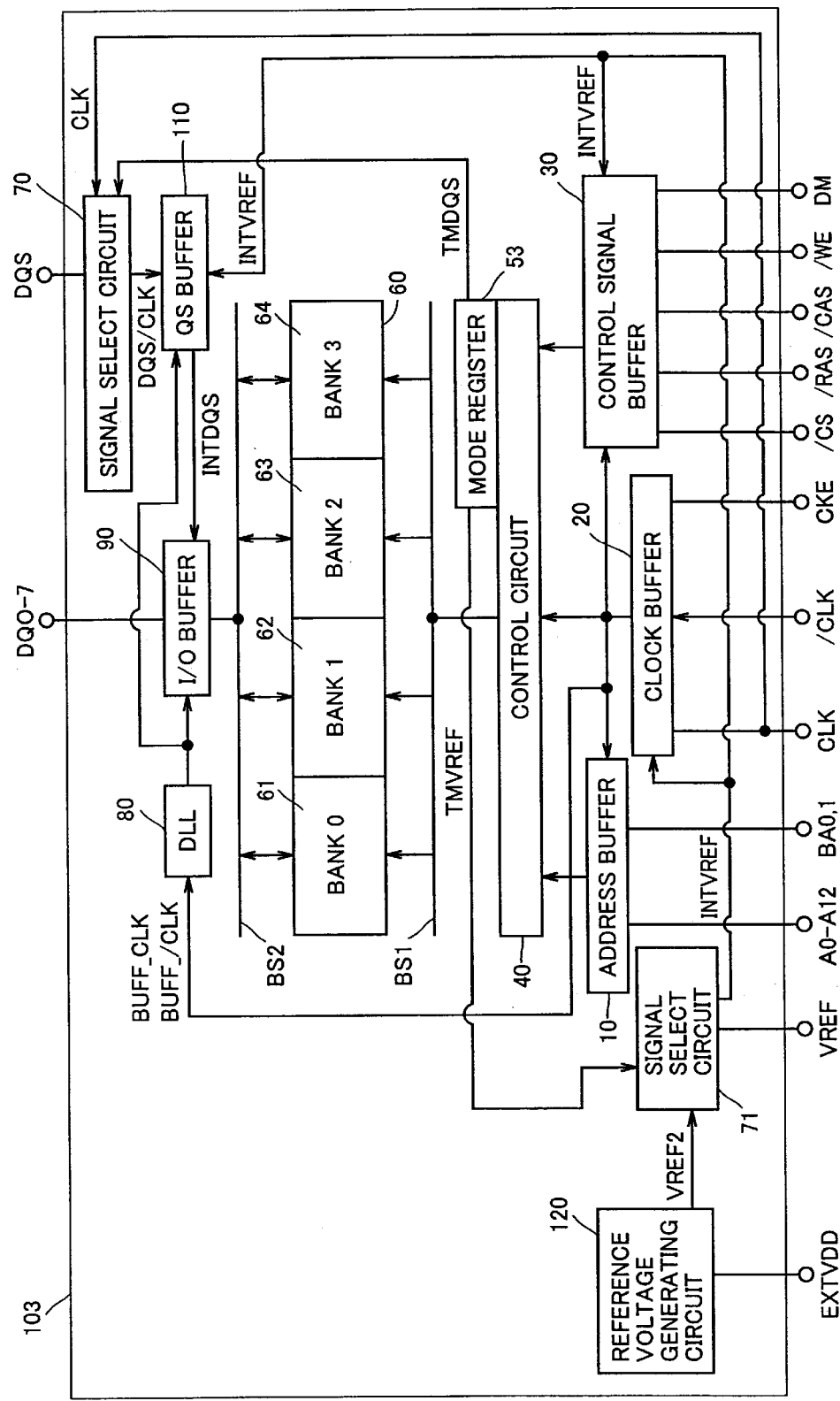
FIG. 23 is a schematic block diagram of a semiconductor memory device according to a fourth embodiment.

Referring to FIG. 23, a semiconductor memory device 103 according to a fourth embodiment is the same as semiconductor memory device 100 except for that mode register 50 of semiconductor memory device 100 is replaced with a mode register 53, and signal select circuit 71 and reference voltage generating circuit 120 are added.

Mode register 53 has the same function as mode register 50, and additionally has a function of providing signal TMVREF to signal select circuit 71.

Signal select circuit 71 and reference voltage generating circuit 120 are already described in connection with the second embodiment.

When semiconductor memory device 103 operates in the normal operation mode, mode register 53 provides signal TMDQS at L-level to signal select circuit 70, and provides signal TMVREF at L-level to signal select circuit 71.

Signal select circuit 70 selects data strobe signal DQS sent from I/O terminal DQS in accordance with signal TMDQS at L-level, and provides it to QS buffer 110. Signal select circuit 71 selects reference voltage VREF sent from I/O terminal VREF in accordance with signal TMVREF at L-level, and provides selected reference voltage VREF as internal reference voltage INTVREF to clock buffer 20, control signal buffer 30 and QS buffer 110.

When semiconductor memory device 103 operates in the slow operation mode, mode register 53 provides signal TMDQS at H-level to signal select circuit 70, and provides signal TMVREF at H-level to signal select circuit 71.

Signal select circuit 70 selects clock CLK sent from I/O terminal CLK in accordance with signal TMDQS at H-level, and provides it to QS buffer 110. Signal select circuit 71 selects internal reference voltage VREF2 sent from reference voltage generating circuit 120 in accordance with signal TMVREF at H-level, and provides selected internal reference voltage VREF2 as internal reference voltage INTVREF to clock buffer 20, control signal buffer 30 and QS buffer 110.

The operation of semiconductor memory device 103 in the normal operation mode is performed in accordance with timing charts, which are the same as those of FIGS. 7 and 8 except for that signal TMVREF holding the L-level is added. Thus, the operation of semiconductor memory device 103 in the normal operation mode is the same as the operation in the normal operation mode of the first embodiment except for that the operations of reference voltage generating circuit 120 and signal select circuit 71 in the normal operation mode of the second embodiment are added.

The operation of semiconductor memory device 103 in the slow operation mode is performed in accordance with timing charts, which are the same as those of FIGS. 9 and 10 except for that signal TMVREF holding the H-level is added. Thus, the operation of semiconductor memory device 103 in the slow operation mode is the same as the operation in the slow operation mode of the first embodiment except for that the operations of reference voltage generating circuit 120 and signal select circuit 71 in the slow operation mode of the second embodiment are added.

In the fourth embodiment, data strobe signal DQS corresponds to the first signal received from the I/O terminal (I/O terminal DQS)used only in the normal operation mode, reference voltage VREF corresponds to the first signal received from the I/O terminal (I/O terminal VREF) used only in the normal operation mode, clock CLK corresponds to the second signal received from the I/O terminal (I/O terminal CLK) used in both the slow and normal operation modes, and internal reference voltage VREF2 corresponds to the second signal received from the I/O terminal (I/O terminal EXTVDD) used in both the slow and normal operation modes.

Signals TMDQS and TMVREF at L-level correspond to the "first select signals", and signals TMDQS and TMVREF at H-level correspond to the "second select signals".

As described above, the fourth embodiment has such a distinctive feature that semiconductor memory device 103 in the slow operation mode selects two signals received from the I/O terminals used in both the slow and normal operation modes instead of two signals received from the I/O terminals used in only the normal operation mode.

Further, in the factory-shipped state of semiconductor memory device 103, signals TMDQS and TMVREF both at H-level or L-level are set in mode register 53. For semiconductor memory device 103 to be used in the normal operation mode, signals TMDQS and TMVREF at L-level are preset in mode register 53. For semiconductor memory device 103 to be used in the slow operation mode, signals TMDQS and TMVREF at H-level are preset in mode register 53.

For semiconductor memory device 103 to be operated in the normal operation mode, all the I/O terminals for input or for input/output of control signals such as chip select signal /CS as well as addresses A0–A12, bank addresses BA0 and BA1, external power supply voltage EXTVDD, reference voltage VREF and others are connected to wires WRE and are used as shown in FIG. 11.

Figure 24:
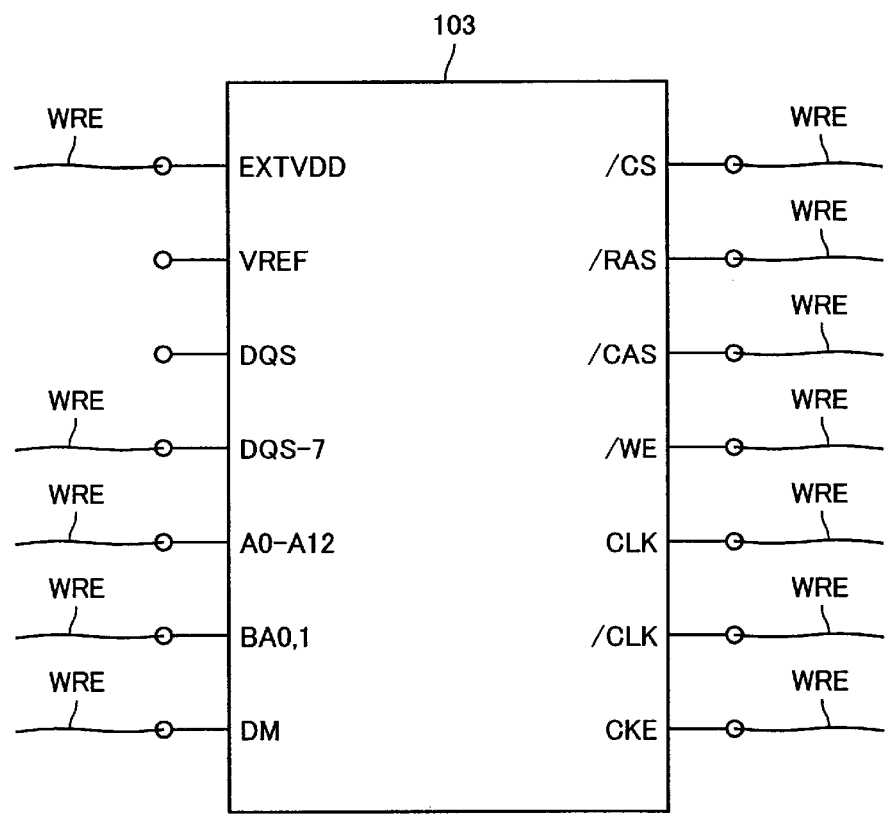
FIG. 24 is a plan showing a state of use in the slow operation mode of the semiconductor memory device shown in FIG. 23.

For semiconductor memory device 103 to be operated in the slow operation mode, the I/O terminals for signals or the like except for data strobe signal DQS and reference voltage VREF are connected to wires WRE and are used as shown in FIG. 24. Thus, the two I/O terminals for data strobe signal DQS and reference voltage VREF are not used in the slow operation mode.

Signal select circuits 70 and 71 form a signal select circuit selecting either the first signal received from the I/O terminal used only in the normal operation mode or the second signal received from the I/O terminal used in both the slow and normal operation modes.

Further, signal select circuits 70 and 71 form a signal select circuit selecting a plurality of first signals received from the I/O terminals used only in the normal operation mode or a plurality of second signals received from the I/O terminals used in both the slow and normal operation modes.

Structures and operations other than the above are the same as those of the first embodiment.

According to the fourth embodiment, the semiconductor memory device for the slow operation mode includes the signal select circuit selecting clock CLK in stead of data strobe signal DQS and the signal select circuit selecting internal reference voltage INTVREF generated inside the semiconductor memory device instead of reference voltage VREF, and does not use the I/O terminal for the data strobe signal and the I/O terminal for the reference voltage. Therefore, it is possible to increase further the number of the semiconductor memory devices, which can be simultaneously tested for or in the slow tester evaluation, production test and slow system. The user using the semiconductor memory device in the slow operation mode can further reduce the cost.

Fifth Embodiment

Figure 25:
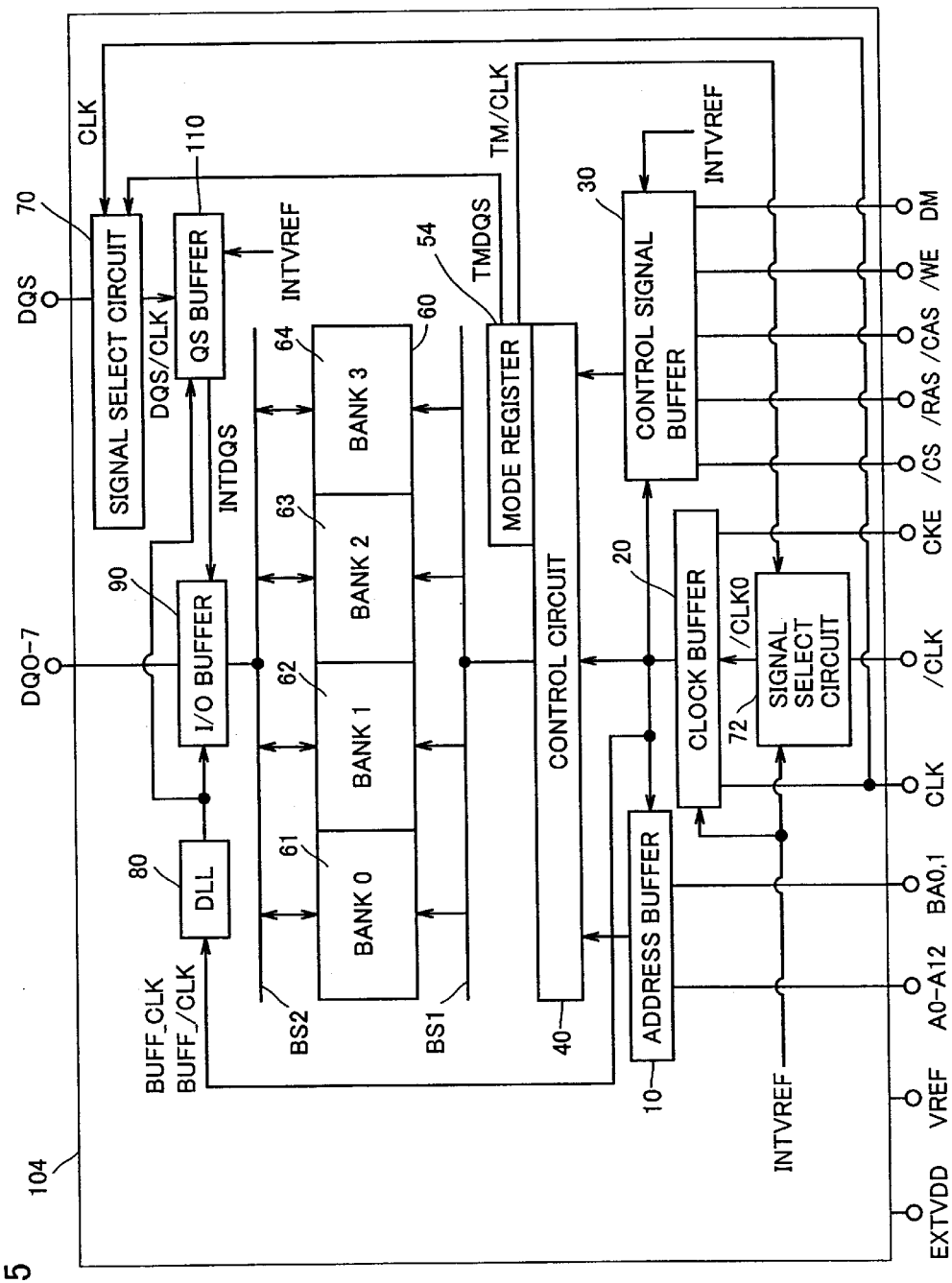
FIG. 25 is a schematic block diagram of a semiconductor memory device according to a fifth embodiment.

Referring to FIG. 25, a semiconductor memory device 104 of a fifth embodiment is the same as semiconductor memory device 100 except for that mode register 50 of semiconductor memory device 100 is replaced with a mode register 54, and signal select circuit 72 is added.

Mode register 54 has the same function as mode register 50, and additionally has a function of providing signal TM/CLK to signal select circuit 72.

Signal select circuit 72 is already described in connection with the third embodiment.

When semiconductor memory device 104 operates in the normal operation mode, mode register 54 provides signal TMDQS at L-level to signal select circuit 70, and provides signal TM/CLK at L-level to signal select circuit 72.

Signal select circuit 70 selects data strobe signal DQS sent from I/O terminal DQS in accordance with signal TMDQS at L-level, and provides it to QS buffer 110. Signal select circuit 72 selects clock /CLK sent from I/O terminal /CLK in accordance with signal TM/CLK at L-level, and provides it to clock buffer 20.

When semiconductor memory device 104 operates in the slow operation mode, mode register 54 provides signal TMDQS at H-level to signal select circuit 70, and provides signal TM/CLK at H-level to signal select circuit 72.

Signal select circuit 70 selects clock CLK sent from I/O terminal CLK in accordance with signal TMDQS at H-level, and provides it to QS buffer 110. Signal select circuit 72 selects internal reference voltage INTVREF in accordance with signal TM/CLK at H-level, and provides it to clock buffer 20.

The operation of semiconductor memory device 104 in the normal operation mode is performed in accordance with timing charts, which are the same as those of FIGS. 7 and 8 except for that signal TM/CLK holding the L-level is added. Thus, the operation of semiconductor memory device 104 in the normal operation mode is the same as the operation in the normal operation mode of the first embodiment except for that the operation of signal select circuit 72 in the normal operation mode of the third embodiment is added.

Figure 26:
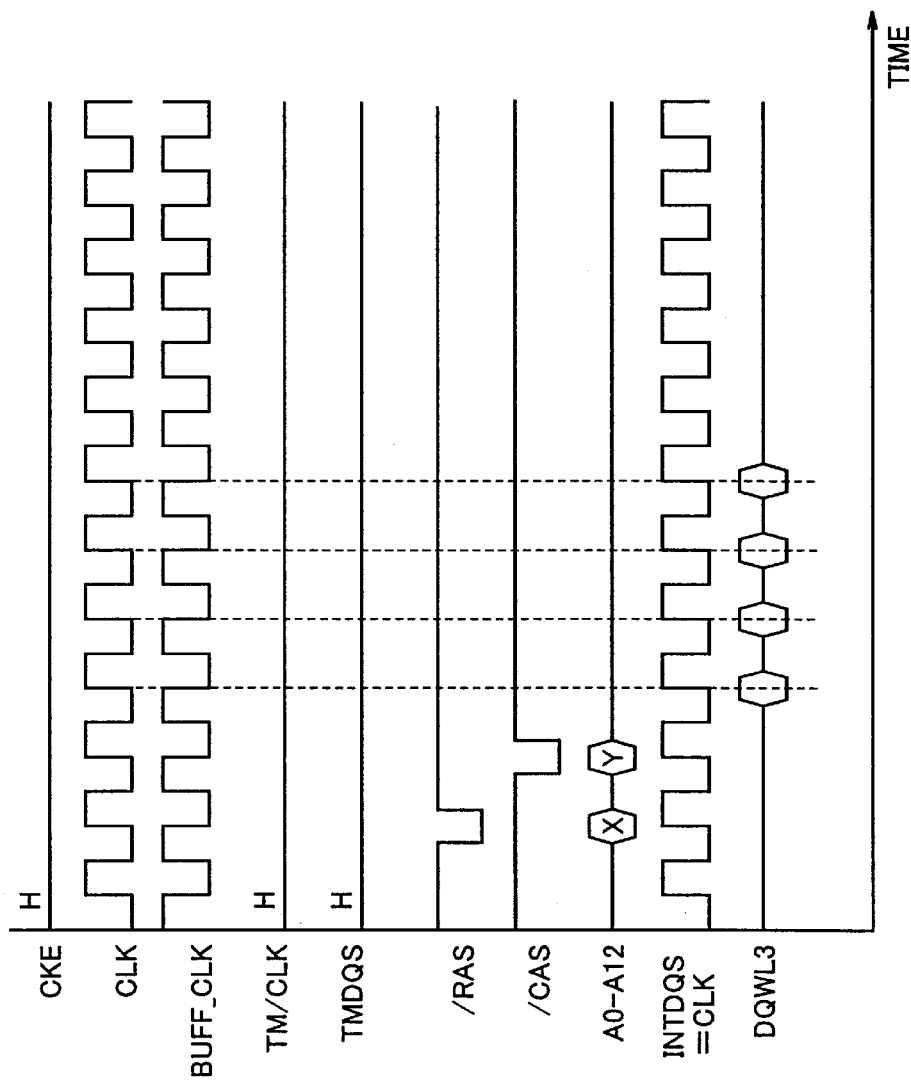
FIG. 26 is a timing chart of signals for illustrating a data write operation in the slow operation mode of the semiconductor memory device shown in FIG. 25.

The write operation of semiconductor memory device 104 in the slow operation mode is performed in accordance with a timing chart illustrated in FIG. 26. The timing chart of FIG. 26 is the same as that of FIG. 9 except for that signal TM/CLK holding the H-level is added, and clocks /CLK and BUFF_/CLK are eliminated.

Thus, the data write operation of semiconductor memory device 104 in the slow operation mode is the same as the operation in the slow operation mode of the first embodiment except for that the operation of signal select circuit 72 in the slow operation mode of the third embodiment is added.

Figure 27:
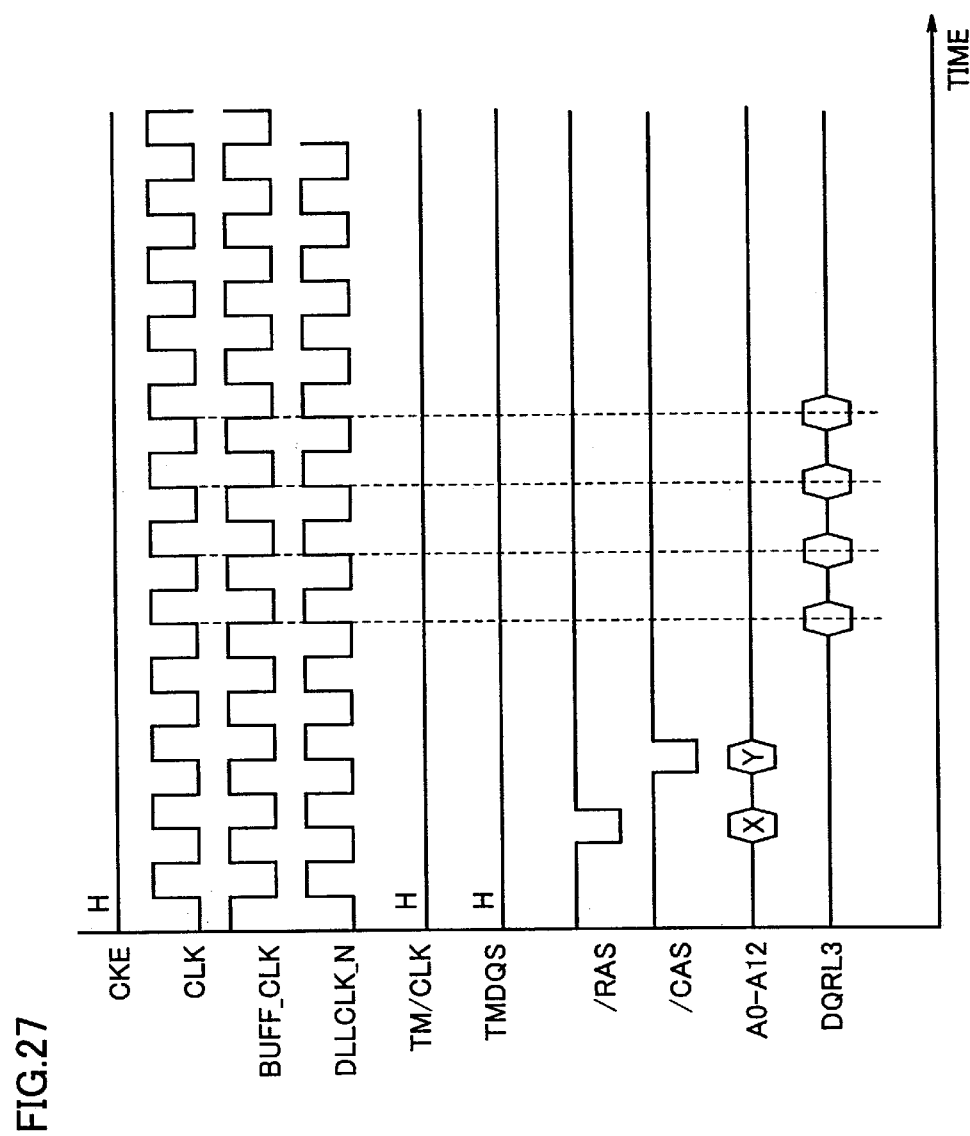
FIG. 27 is a timing chart of signals for illustrating a data read operation in the slow operation mode of the semiconductor memory device shown in FIG. 25.

The data read operation of semiconductor memory device 104 in the slow operation mode is performed in accordance with a timing chart illustrated in FIG. 27. The timing chart of FIG. 27 is the same as that of FIG. 10 except for that signal TM/CLK holding the H-level is added, and clocks /CLK and BUFF_/CLK are eliminated.

Thus, the read operation of semiconductor memory device 104 in the slow operation mode is the same as the operation in the slow operation mode of the first embodiment except for that the operation of I/O buffer 90 in the slow operation mode of the first embodiment is replaced with the operation of I/O buffer 90 in the third embodiment, and the operation of signal select circuit 72 in the slow operation mode of the third embodiment is added.

In the fifth embodiment, data strobe signal DQS corresponds to the first signal received from the I/O terminal (I/O terminal DQS) used only in the normal operation mode, clock /CLK corresponds to the first signal received from the I/O terminal (I/O terminal /CLK) used only in the normal operation mode, clock CLK corresponds to the second signal received from the I/O terminal (I/O terminal CLK) used in both the slow and normal operation modes, and internal reference voltage INTVREF corresponds to the second signal received from the I/O terminal (I/O terminal VREF) used in both the slow and normal operation modes.

Signals TMDQS and TM/CLK at L-level correspond to the "first select signals", and signals TMDQS and TM/CLK at H-level correspond to the "second select signals".

As described above, the fifth embodiment has such a distinctive feature that semiconductor memory device 104 in the slow operation mode selects two signals received from the I/O terminals used in both the slow and normal operation modes instead of two signals received from the I/O terminals used in only the normal operation mode.

Further, in the factory-shipped state of semiconductor memory device 104, signals TMDQS and TM/CLK both at H-level or L-level are set in mode register 54. For semiconductor memory device 104 to be used in the normal operation mode, signals TMDQS and TM/CLK at L-level are preset in mode register 54. For semiconductor memory device 104 to be used in the slow operation mode, signals TMDQS and TM/CLK at H-level are preset in mode register 54.

For semiconductor memory device 104 to be operated in the normal operation mode, all the I/O terminals for input or for input/output of control signals such as chip select signal /CS as well as addresses A0–A12, bank addresses BA0 and BA1, external power supply voltage EXTVDD, reference voltage VREF and others are connected to wires WRE and are used as shown in FIG. 11.

Figure 28:
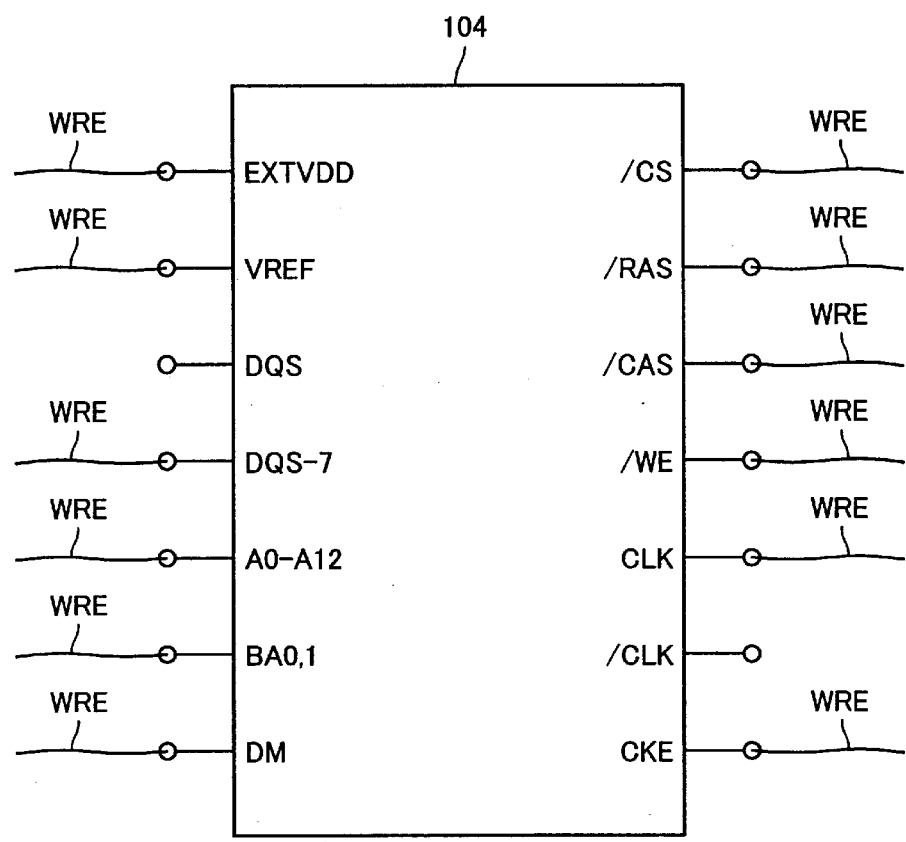
FIG. 28 is a plan showing a state of use in the slow operation mode of the semiconductor memory device shown in FIG. 25.

For semiconductor memory device 104 to be operated in the slow operation mode, the I/O terminals for signals or the like except for data strobe signal DQS and clock /CLK are connected to wires WRE and are used as shown in FIG. 28. Thus, the two I/O terminals for data strobe signals DQS and complementary clock /CLK are not used in the slow operation mode.

Signal select circuits 70 and 72 form a signal select circuit selecting either the first signal received from the I/O terminal used only in the normal operation mode or the second signal received from the I/O terminal used in both the slow and normal operation modes.

Further, signal select circuits 70 and 72 form a signal select circuit selecting a plurality of first signals received from the I/O terminals used only in the normal operation mode or a plurality of second signals received from the I/O terminals used in both the slow and normal operation modes.

Structures and operations other than the above are the same as those of the first and third embodiments.

According to the fifth embodiment, the semiconductor memory device for the slow operation mode includes the signal select circuit selecting clock CLK in stead of data strobe signal DQS and the signal select circuit selecting internal reference voltage INTVREF instead of clock /CLK, and does not use the I/O terminal for the data strobe signal and the I/O terminal for the complementary clock. Therefore, it is possible to increase further the number of the semiconductor memory devices, which can be simultaneously tested for or in the slow tester evaluation, production test and slow system. The user using the semiconductor memory device in the slow operation mode can further reduce the cost.

Sixth Embodiment

Figure 29:
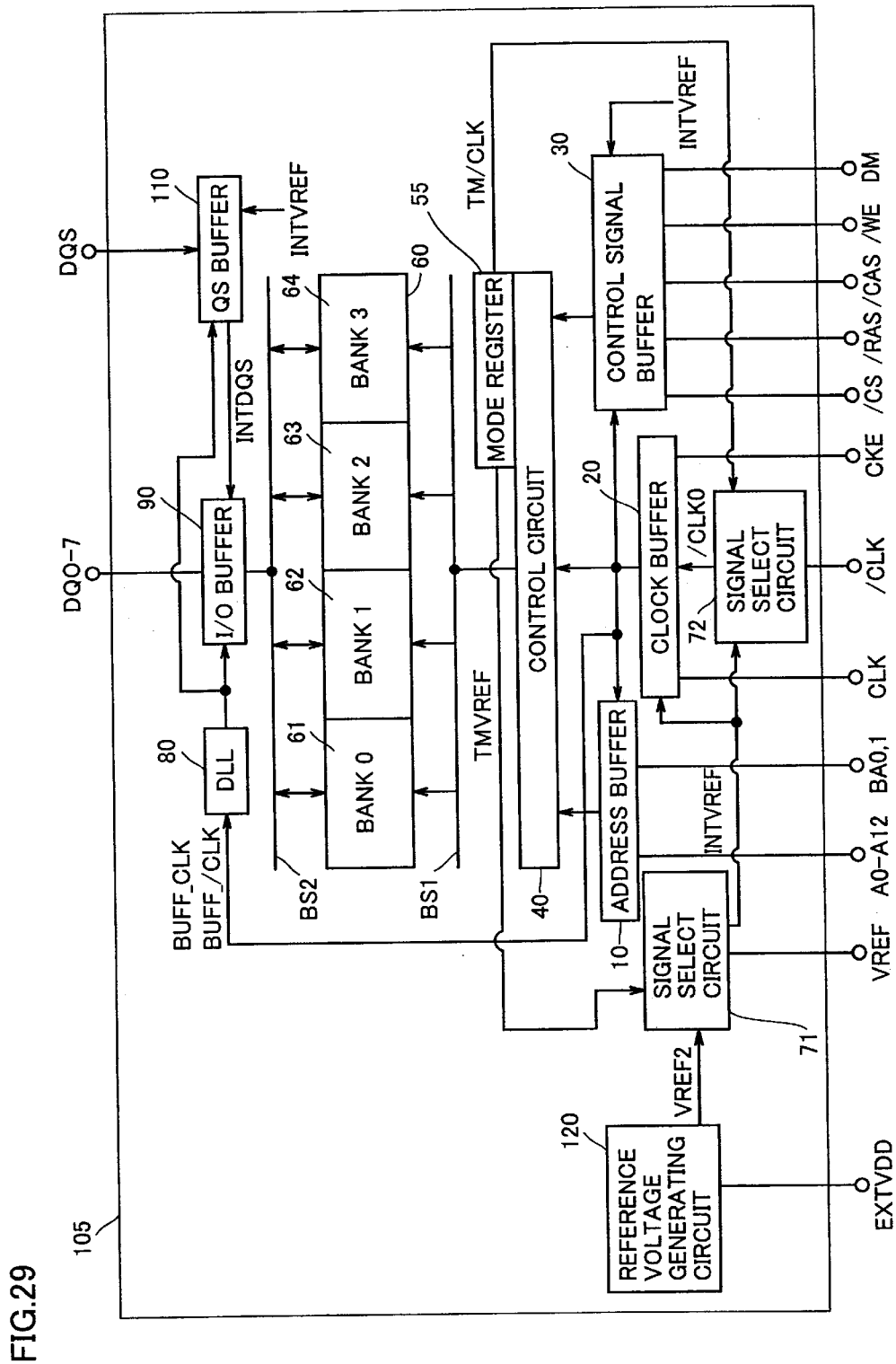
FIG. 29 is a schematic block diagram of a semiconductor memory device according to a sixth embodiment.

Referring to FIG. 29, a semiconductor memory device 105 according to a sixth embodiment is the same as semiconductor memory device 101 except for that mode register 51 of semiconductor memory device 101 is replaced with a mode register 55, and signal select circuit 72 is added.

Mode register 55 has the same function as mode register 51, and additionally has a function of providing signal TM/CLK to signal select circuit 72. Signal select circuit 72 is already described in connection with the third embodiment.

Thus, semiconductor memory device 105 corresponds to a combination of semiconductor memory device 101 of the second embodiment and semiconductor memory device 102 of the third embodiment.

When semiconductor memory device 105 operates in the normal operation mode, mode register 55 provides signal TMVREF at L-level to signal select circuit 71, and provides signal TM/CLK at L-level to signal select circuit 72.

Signal select circuit 71 selects reference voltage VREF sent from I/O terminal VREF in accordance with signal TMVREF at L-level, and provides it as internal reference voltage INTVREF to clock buffer 20, control signal buffer 30 and QS buffer 110. Signal select circuit 72 selects clock /CLK sent from I/O terminal /CLK in accordance with signal TM/CLK at L-level, and provides it to clock buffer 20.

When semiconductor memory device 105 operates in the slow operation mode, mode register 55 provides signal TMVREF at H-level to signal select circuit 72, and provides signal TM/CLK at H-level to signal select circuit 72.

Signal select circuit 71 selects internal reference voltage VREF2 sent from reference voltage generating circuit 120 in accordance with signal TMVREF at H-level, and provides it as internal reference voltage INTVREF to clock buffer 20, control signal buffer 30 and QS buffer 110. Signal select circuit 72 selects internal reference voltage INTVREF in accordance with signal TM/CLK at H-level, and provides it to clock buffer 20.

The operation of semiconductor memory device 105 in the normal operation mode is performed in accordance with timing charts, which are the same as those of FIGS. 7 and 8 except for that signal TM/CLK holding the L-level is replaced with signals TM/CLK and TMVREF holding the L-level. Thus, the operation of semiconductor memory device 105 in the normal operation mode is the same as the operation in the normal operation mode of the first embodiment except for that the operation of signal select circuit 70 is replaced with the operation of signal select circuit 71 in the normal operation mode of the second embodiment and the operation of signal select circuit 72 in the normal operation mode of the third embodiment.

The operation of semiconductor memory device 105 in the slow operation mode is performed in accordance with a timing chart, which is the same as those illustrated in FIGS. 20 and 21 except for that signal TMVREF holding the L-level is added. Thus, the operation of semiconductor memory device 105 in the slow operation mode is the same as the operation in the slow operation mode of the third embodiment except for that the operation of signal select circuit 71 in the slow operation mode of the second embodiment is added.

In the sixth embodiment, clock /CLK corresponds to the first signal received from the I/O terminal (I/O terminal /CLK) used only in the normal operation mode, reference voltage VREF corresponds to the first signal received from the I/O terminal (I/O terminal VREF) used only in the normal operation mode, and internal reference voltages VREF2 and INTVREF correspond to the second signals received from the I/O terminal (I/O terminal EXTVDD) used in both the slow and normal operation modes.

Signals TMVREF and TM/CLK at L-level correspond to the "first select signals", and signals TMVREF and TM/CLK at H-level correspond to the "second select signals".

As described above, the sixth embodiment has such a distinctive feature that semiconductor memory device 105 in the slow operation mode selects two signals received from the I/O terminal used in both the slow and normal operation modes instead of two signals received from the I/O terminals used in only the normal operation mode.

Further, in the factory-shipped state of semiconductor memory device 105, signals TMVREF and TM/CLK both at H-level or L-level are set in mode register 55. For semiconductor memory device 105 to be used in the normal operation mode, signals TMVREF and TM/CLK at L-level are preset in mode register 55. For semiconductor memory device 105 to be used in the slow operation mode, signals TMVREF and TM/CLK at H-level are preset in mode register 55.

For semiconductor memory device 105 to be operated in the normal operation mode, all the I/O terminals for input or for input/output of control signals such as chip select signal /CS as well as addresses A0–A12, bank addresses BA0 and BA1, external power supply voltage EXTVDD, reference voltage VREF and others are connected to wires WRE and are used as shown in FIG. 11.

Figure 30:
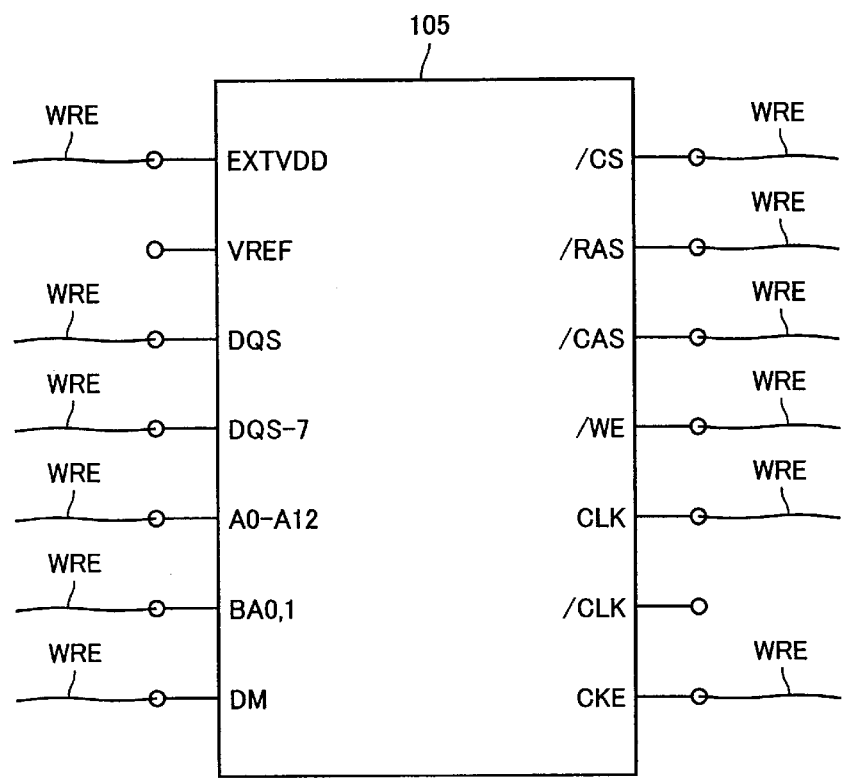
FIG. 30 is a plan showing a state of use in the slow operation mode of the semiconductor memory device shown in FIG. 29.

For semiconductor memory device 105 to be operated in the slow operation mode, the I/O terminals for signals or the like except for reference voltage VREF and clock /CLK are connected to wires WRE and are used as shown in FIG. 30. Thus, the two I/O terminals for reference voltage VREF and complementary clock /CLK are not used in the slow operation mode.

Signal select circuits 71 and 72 form a signal select circuit selecting either the first signal received from the I/O terminal used only in the normal operation mode or the second signal received from the I/O terminal used in both the slow and normal operation modes.

Further, signal select circuits 71 and 72 form a signal select circuit selecting a plurality of first signals received from the I/O terminals used only in the normal operation mode or a plurality of second signals received from the I/O terminals used in both the slow and normal operation modes.

Structures and operations other than the above are the same as those of the first to third embodiments.

According to the sixth embodiment, the semiconductor memory device for the slow operation mode includes the signal select circuit selecting internal reference voltage VREF2 in stead of reference voltage VREF and the signal select circuit selecting internal reference voltage INTVREF instead of clock /CLK, and does not use the I/O terminals for the reference voltage and the complementary clock in the slow operation mode. Therefore, it is possible to increase further the number of the semiconductor memory devices, which can be simultaneously tested for or in the slow tester evaluation, production test and slow system. The user using the semiconductor memory device in the slow operation mode can further reduce the cost.

Seventh Embodiment

Figure 31:
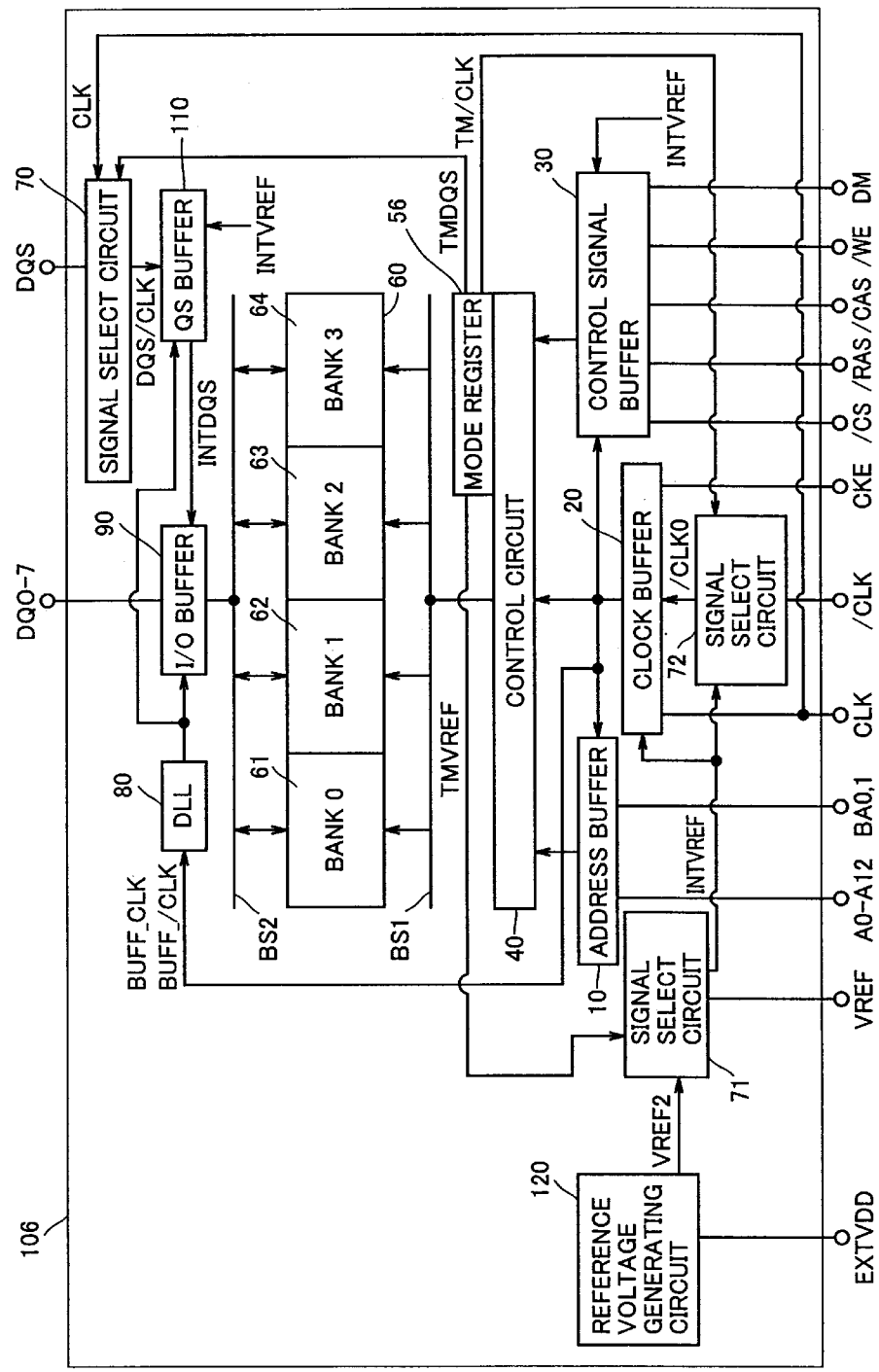
FIG. 31 is a schematic block diagram of a semiconductor memory device according to a seventh embodiment.

Referring to FIG. 31, a semiconductor memory device 106 according to a seventh embodiment is the same as semiconductor memory device 100 except for that mode register 50 of semiconductor memory device 100 is replaced with a mode register 56, and signal select circuits 71 and 72 as well as reference voltage generating circuit 120 are added.

Mode register 56 has the same function as mode register 50, and additionally has a function of providing signals TMVREF and TM/CLK to signal select circuits 71 and 72, respectively.

Signal select circuit 71 and reference voltage generating circuit 120 are already described in connection with the second embodiment. Signal select circuit 72 is already described in connection with the third embodiment.

When semiconductor memory device 106 operates in the normal operation mode, mode register 56 provides signals TMDQS, TMVREF and TM/CLK, all of which are at L-level, to signal select circuits 70, 71 and 72, respectively.

Signal select circuit 70 selects data strobe signal DQS sent from I/O terminal DQS in accordance with signal TMDQS at L-level, and provides it to QS buffer 110. Signal select circuit 71 selects reference voltage VREF sent from I/O terminal VREF in accordance with signal TMVREF at L-level, and provides it to clock buffer 20, control signal buffer 30 and QS buffer 110. Signal select circuit 72 selects clock /CLK sent from I/O terminal /CLK in accordance with signal TM/CLK at L-level, and provides it to clock buffer 20.

When semiconductor memory device 106 operates in the slow operation mode, mode register 56 provides signals TMDQS, TMVREF and TM/CLK, all of which are at H-level, to signal select circuits 70, 71 and 72, respectively.

Signal select circuit 70 selects clock CLK sent from I/O terminal CLK in accordance with signal TMDQS at H-level, and provides it to QS buffer 110. Signal select circuit 71 selects internal reference voltage VREF2 sent from reference voltage generating circuit 120 in accordance with signal TMVREF at H-level, and provides it to clock buffer 20, control signal buffer 30 and QS buffer 110. Signal select circuit 72 selects internal reference voltage INTVREF sent from signal select circuit 71 in accordance with signal TM/CLK at H-level, and provides it to clock buffer 20.

The operation of semiconductor memory device 106 in the normal operation mode is performed in accordance with timing charts, which are the same as those of FIGS. 7 and 8 except for that signals TMVREF and TM/CLK holding the L-level are added. Thus, the operation of semiconductor memory device 106 in the normal operation mode is the same as the operation in the normal operation mode of the first embodiment except for that the operations of reference voltage generating circuit 120 and signal select circuit 71 in the normal operation mode of the second embodiment as well as the operation of signal select circuit 72 in the normal operation mode of the third embodiment are added.

The operation of semiconductor memory device 106 in the slow operation mode is performed in accordance with a timing chart, which is the same as those illustrated in FIGS. 26 and 27 except for that signal TMVREF holding the H-level is added. Thus, the operation of semiconductor memory device 106 in the slow operation mode is the same as the operation in the slow operation mode of the first embodiment except for that the operations of reference voltage generating circuit 120 and signal select circuit 71 in the slow operation mode of the second embodiment as well as the operation of signal select circuit 72 in the normal operation mode of the third embodiment are added.

In the seventh embodiment, data strobe signal DQS corresponds to the first signal received from the I/O terminal (I/O terminal DQS) used only in the normal operation mode, reference voltage VREF corresponds to the first signal received from the I/O terminal (I/O terminal VREF) used only in the normal operation mode, clock /CLK corresponds to the first signal received from the I/O terminal (I/O terminal /CLK) used only in the normal operation mode, clock CLK corresponds to the second signal received from the I/O terminal (I/O terminal CLK) used in both the slow and normal operation modes, and internal reference voltages VREF2 and INTVREF correspond to the second signal received from the I/O terminal (I/O terminal EXTVDD) used in both the slow and normal operation modes.

Signals TMDQS, TMVREF and TM/CLK at L-level correspond to the "first select signals", and signals TMDQS, TMVREF and TM/CLK at H-level correspond to the "second select signals".

As described above, the seventh embodiment has such a distinctive feature that semiconductor memory device 106 in the slow operation mode selects three signals received from the I/O terminals used in both the slow and normal operation modes instead of three signals received from the I/O terminals used in only the normal operation mode.

Further, in the factory-shipped state of semiconductor memory device 106, signals TMDQS, TMVREF and TM/CLK at the same level (i.e., H-level or L-level) are set in mode register 56. For semiconductor memory device 106 to be used in the normal operation mode, signals TMDQS, TMVREF and TM/CLK at L-level are preset in mode register 56. For semiconductor memory device 106 to be used in the slow operation mode, signals TMDQS, TMVREF and TM/CLK at H-level are preset in mode register 56.

For semiconductor memory device 106 to be operated in the normal operation mode, all the I/O terminals for input or for input/output of control signals such as chip select signal /CS as well as addresses A0–A12, bank addresses BA0 and BA1, external power supply voltage EXTVDD, reference voltage VREF and others are connected to wires WRE and are used as shown in FIG. 11.

Figure 32:
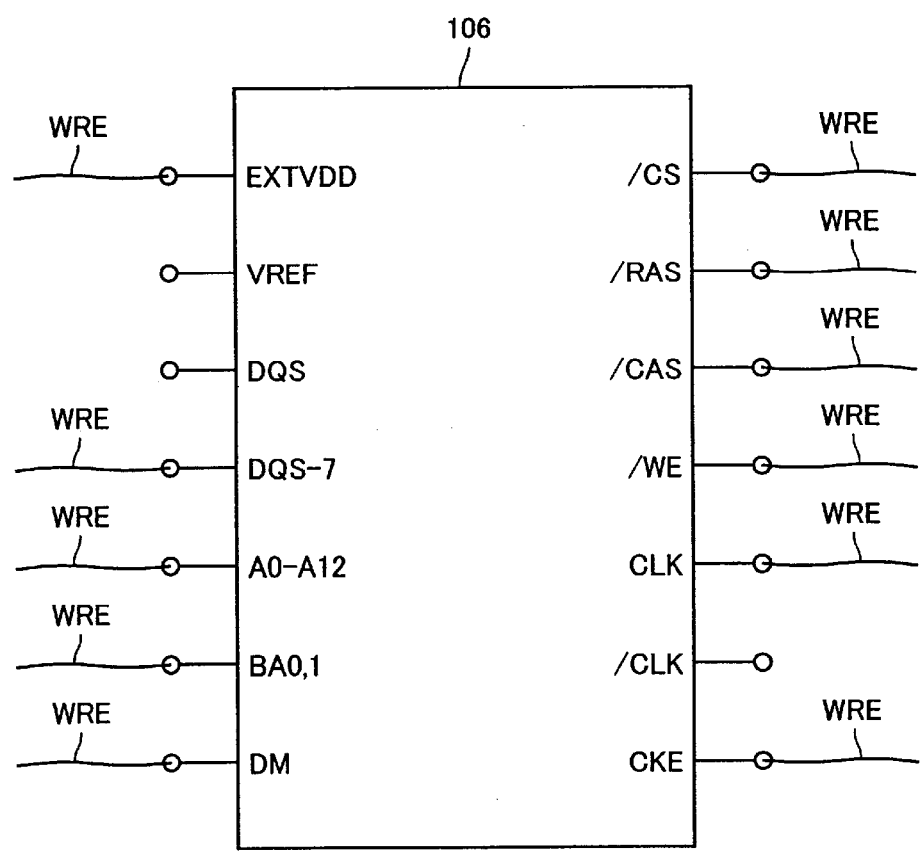
FIG. 32 is a plan showing a state of use in the slow operation mode of the semiconductor memory device shown in FIG. 31.
Figure 33:
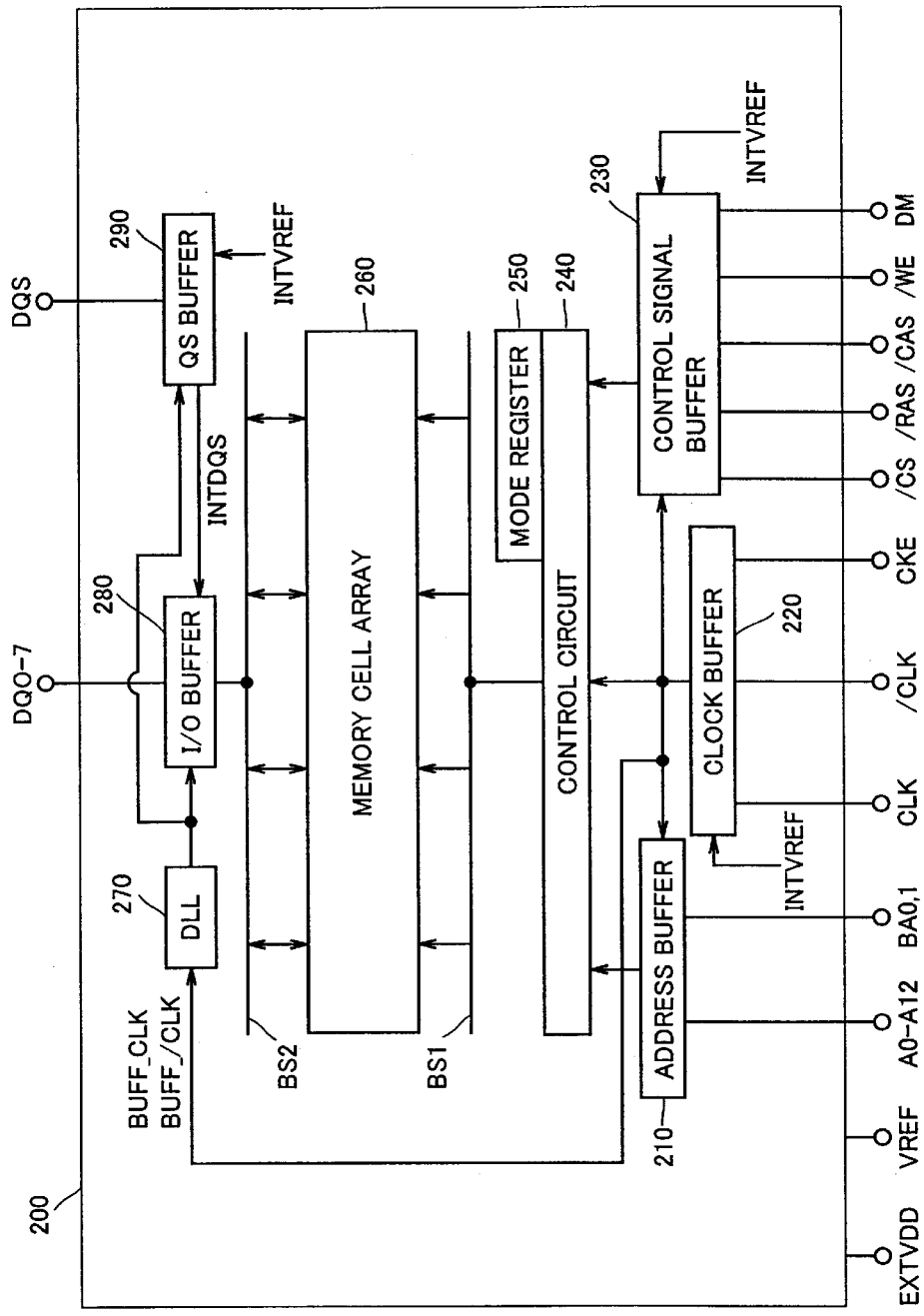
FIG. 33 is a schematic block diagram of a conventional DDR-SDRAM.
Figure 34:
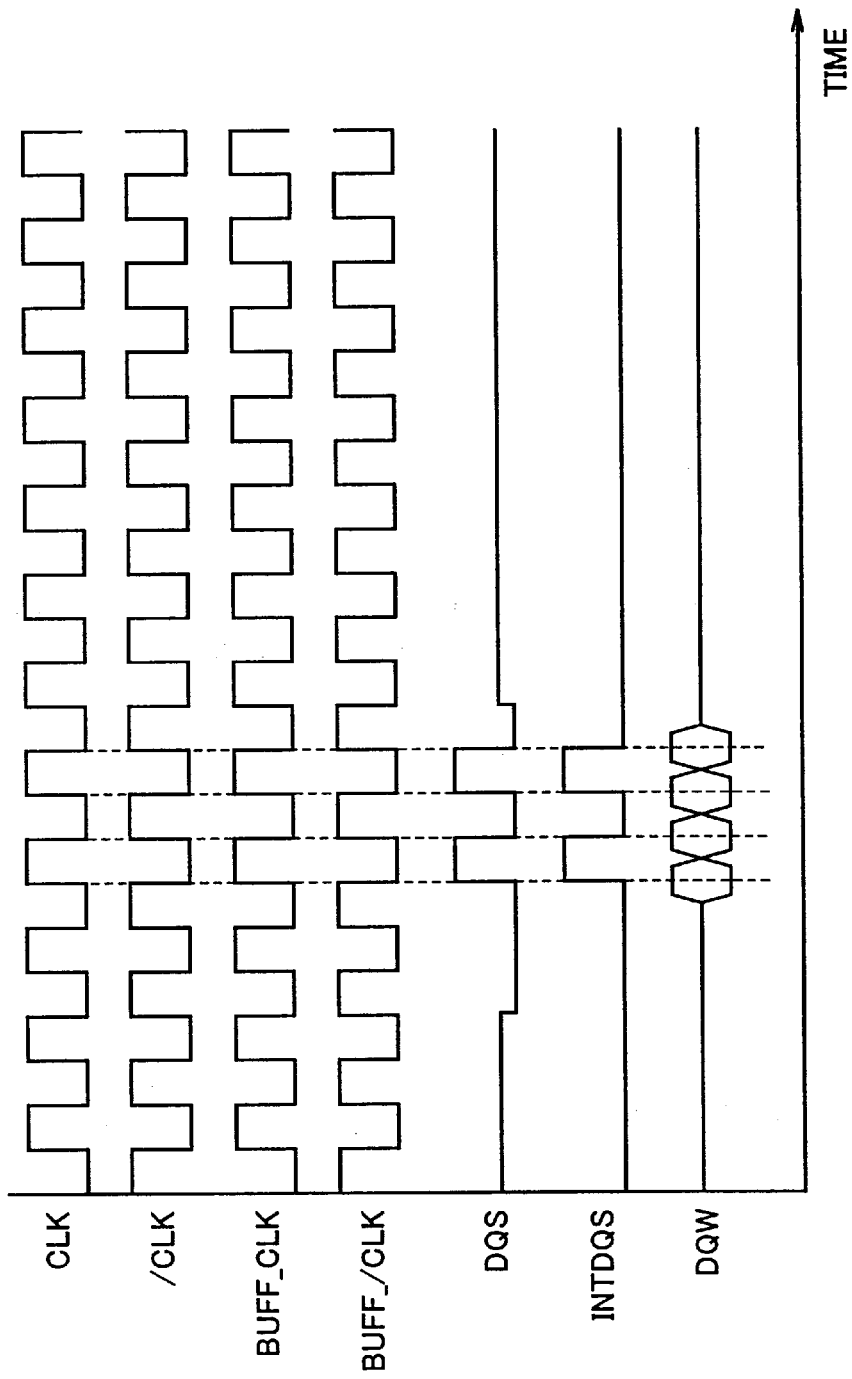
FIG. 34 is a timing chart of signals for illustrating a data write operation of the DDR-SDRAM shown in FIG. 33.

For semiconductor memory device 106 to be operated in the slow operation mode, the I/O terminals for signals or the like except for data strobe signal DQS, reference voltage VREF and clock /CLK are connected to wires WRE and are used as shown in FIG. 32. Thus, the three I/O terminals for data strobe signal DQS, reference voltage VREF and complementary clock /CLK are not used in the slow operation mode.

Signal select circuits 70, 71 and 72 form a signal select circuit selecting either the first signal received from the I/O terminal used only in the normal operation mode or the second signal received from the I/O terminal used in both the slow and normal operation modes.

Further, signal select circuits 70, 71 and 72 form a signal select circuit selecting a plurality of first signals received from the I/O terminals used only in the normal operation mode or a plurality of second signals received from the I/O terminals used in both the slow and normal operation modes.

Structures and operations other than the above are the same as those of the first to third embodiments.

According to the seventh embodiment, the semiconductor memory device for the slow operation mode includes the signal select circuit selecting clock CLK instead of data strobe signal DQS, the signal select circuit selecting internal reference voltage INTVREF generated inside the semiconductor memory device in stead of reference voltage VREF and the signal select circuit selecting internal reference voltage INTVREF instead of clock /CLK, and does not use the I/O terminals provided for the data strobe signal, the reference voltage, the complementary clock in the slow operation mode. Therefore, it is possible to increase further the number of the semiconductor memory devices, which can be simultaneously tested for or in the slow tester evaluation, production test and slow system. The user using the semiconductor memory device in the slow operation mode can further reduce the cost.

The first to seventh embodiments have been described in connection with the DDR-SDRAM, in which data strobe signal DQS, externally supplied reference voltage VREF and complementary clock /CLK used in the normal operation mode are replaced with clock CLK, internal reference voltage VREF2 and internal reference voltage INTVREF for the operations in the slow operation mode, respectively. However, the invention is not restricted to this, and may be applied various structures, in which a signal(s) and/or a voltage(s) used in the normal operation mode are to be replaced with a different signal(s) and/or a different voltage (s) for the slow operation mode. The signal(s) and/or voltage (s) to be used in the slow operation mode are not restricted to one, two or three in number, and may be four or more.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for operating selectively in a normal operation mode for periodically performing writing and reading of data, and in a slow operation mode for periodically performing writing and reading of said data at a lower speed than that in said normal operation mode, comprising:

a plurality of memory cells for storing the data;

a signal select circuit for selecting either a first signal received from an I/O terminal used only in said normal operation mode or a second signal received from an I/O terminal used in both of said slow and normal operation modes; and a peripheral circuit for performing the writing and/or reading of said data into and/or from said plurality of memory cells in said slow operation mode by using said second signal when said signal select circuit selects said second signal, and performing the writing and/or reading of said data into and/or from said plurality of memory cells in said normal operation mode by using said first signal when said signal select circuit selects said first signal, wherein said signal select circuit selects said first signal in said normal operation mode, and selects said second signal in said slow operation mode.

2. The semiconductor memory device according to claim 1, further comprising:

a mode setting circuit for providing a first select signal to said signal select circuit in said normal operation mode, and providing a second select signal to said signal select circuit in said slow operation mode, wherein said signal select circuit selects said first signal based on said first select signal, and selects said second signal based on said second select signal.

3. The semiconductor memory device according to claim 2, wherein one of said first and second select signals is preset in said mode setting circuit.

4. The semiconductor memory device according to claim 2, wherein said signal select circuit receives a first plurality of signals to be used only in said normal operation mode and receives a second plurality of signals to be used in both of said slow and normal operation modes, and selects one of said first plurality of signals as said first signal in response to said first select signal and selects one of said second plurality of signals as said second signal in response to said second select signal.

5. The semiconductor memory device according to claim 4, wherein said signal select circuit receives a first period signal for taking write data into said semiconductor memory device and a second period signal for producing an internal period signal having the same frequency as said first period signal, selects said second period signal instead of said first period signal in accordance with said second select signal sent from said mode setting circuit, and selects said first period signal instead of said second period signal in accordance with said first select signal sent from said mode setting circuit; and said peripheral circuit operates such that:

when said signal select circuit selects said second period signal, said peripheral circuit writes said write data into said plurality of memory cells in synchronization with rising of said second period signal, and reads the data from said plurality of memory cells in synchronization with rising of said internal period signal, and when said signal select circuit selects said first period signal, said peripheral circuit writes said write data into said plurality of memory cells in synchronization with rising and falling of said first period signal, and reads the data from said plurality of memory cells in synchronization with rising and falling of said internal period signal.

6. The semiconductor memory device according to claim 4, wherein said signal select circuit receives an external reference voltage and an internal reference voltage, selects said internal reference voltage instead of said external reference voltage in accordance with said second select signal sent from said mode setting circuit, and selects said external reference voltage instead of said internal reference voltage in accordance with said first select signal sent from said mode setting circuit; and said peripheral circuit operates such that:

when said signal select circuit selects said internal reference voltage, said peripheral circuit takes signals required for writing and reading said data into and from said plurality of memory cells into said semiconductor memory device by using said internal reference voltage, and performs writing and reading of said data into and from said plurality of memory cells by using said taken signals, and when said signal select circuit selects said external reference voltage, said peripheral circuit takes signals required for writing and reading said data into and from said plurality of memory cells into said semiconductor memory device by using said external reference voltage, and performs writing and reading of said data into and from said plurality of memory cells by using said taken signals.

7. The semiconductor memory device according to claim 6, further comprising:

a reference voltage generating circuit for generating said internal reference voltage based on an external power supply voltage, and providing the generated internal reference voltage to said signal select circuit.

8. The semiconductor memory device according to claim 4, wherein said signal select circuit receives a second period signal complementary to a first period signal and a reference signal formed of a reference voltage, selects said reference signal instead of said second period signal in accordance with said second select signal sent from said mode setting circuit, and selects said second period signal instead of said reference signal in accordance with said first select signal sent from said mode setting circuit; and said peripheral circuit operates such that:

when said signal select circuit selects said reference signal, said peripheral circuit performs writing and reading of said data into and from said plurality of memory cells in synchronization with the rising of said first period signal, and when said signal select circuit selects said second period signal, said peripheral circuit performs writing and reading of said data into and from said plurality of memory cells in synchronization with the rising of said first and second period signals.

9. The semiconductor memory device according to claim 2, wherein said signal select circuit receives a first plurality of signals to be used only in said normal operation mode and receives a second plurality of signals to be used in both of said slow and normal operation modes, and selects said first plurality of signals as said first signal in response to said first select signal and selects said second plurality of signals as said second signal in response to said second select signal.

10. The semiconductor memory device according to claim 9, wherein said signal select circuit includes:

a first signal select circuit for receiving a first period signal for taking write data into said semiconductor memory device and a second period signal for producing an internal period signal having the same frequency as said first period signal, selecting said second period signal instead of said first period signal in accordance with said second select signal sent from said mode setting circuit, and selecting said first period signal instead of said second period signal in accordance with said first select signal sent from said mode setting circuit, and a second signal select circuit for receiving an external reference voltage and an internal reference voltage, selecting said internal reference voltage instead of said external reference voltage in accordance with said second select signal sent from said mode setting circuit, and selecting said external reference voltage instead of said internal reference voltage in accordance with said first select signal sent from said mode setting circuit; and said peripheral circuit operates such that:

when said first signal select circuit selects said second period signal and said second signal select circuit selects said internal reference voltage, said peripheral circuit takes signals required for writing and reading said data into and from said plurality of memory cells into said semiconductor memory device by using said internal reference voltage, and performs writing of said write data into said plurality of memory cells in synchronization with rising of said second period signal and reading of said data from said plurality of memory cells in synchronization with rising of said internal period signal by using said taken signals, and when said first signal select circuit selects said first period signal and said second signal select circuit selects said external reference voltage, said peripheral circuit takes signals required for writing and reading said data into and from said plurality of memory cells into said semiconductor memory device by using said external reference voltage, and performs writing of said write data into said plurality of memory cells in synchronization with rising and falling of said first period signal and reading of said data from said plurality of memory cells in synchronization with rising and falling of said internal period signal by using said taken signals.

11. The semiconductor memory device according to claim 10, further comprising:

a reference voltage generating circuit for generating said internal reference voltage based on an external power supply voltage, and providing the generated internal reference voltage to said second signal select circuit.

12. The semiconductor memory device according to claim 9, wherein said signal select circuit includes:

a first signal select circuit for receiving a first period signal for taking write data into said semiconductor memory device and a second period signal for producing an internal period signal having the same frequency as said first period signal, selecting said second period signal instead of said first period signal in accordance with said second select signal sent from said mode setting circuit, and selecting said first period signal instead of said second period signal in accordance with said first select signal sent from said mode setting circuit, and a second signal select circuit for receiving a third period signal complementary to said second period signal and a reference signal formed of a reference voltage, selecting said reference signal instead of said third period signal in accordance with said second select signal sent from said mode setting circuit, and selecting said third period signal instead of said reference signal in accordance with said first select signal sent from said mode setting circuit; and said peripheral circuit operates such that:

when said first signal select circuit selects said second period signal and said second signal select circuit selects said reference signal, said peripheral circuit writes said write data into said plurality of memory cells in synchronization with rising of said second period signal, and reads the data from said plurality of memory cells in synchronization with rising of said second period signal, and when said first signal select circuit selects said first period signal and said second signal select circuit selects said third period signal, said peripheral circuit writes said write data into said plurality of memory cells in synchronization with rising and falling of said first period signal, and reads the data from said plurality of memory cells in synchronization with rising of said second and third period signals.

13. The semiconductor memory device according to claim 9, wherein said signal select circuit includes:

a first signal select circuit for receiving an external reference voltage and an internal reference voltage, selecting said internal reference voltage instead of said external reference voltage in accordance with said second select signal sent from said mode setting circuit, and selecting said external reference voltage instead of said internal reference voltage in accordance with said first select signal sent from said mode setting circuit, and a second signal select circuit for receiving a second period signal complementary to a first period signal and a reference signal formed of a reference voltage, selecting said reference signal instead of said second period signal in accordance with said second select signal sent from said mode setting circuit, and selecting said second period signal instead of said reference signal in accordance with said first select signal sent from said mode setting circuit; and said peripheral circuit operates such that:

when said first signal select circuit selects said internal reference voltage and said second signal select circuit selects said reference signal, said peripheral circuit takes in signals required for writing and reading said data into and from said plurality of memory cells by using said internal reference voltage, and performs writing and reading of said data into and from said plurality of memory cells in synchronization with rising of said first period signal by using said taken signals, and when said first signal select circuit selects said external reference voltage and said second signal select circuit selects said second period signal, said peripheral circuit takes in signals required for writing and reading said data into and from said plurality of memory cells by using said external reference voltage, and performs writing and reading of said data into and from said plurality of memory cells in synchronization with rising of said first and second period signals by using said taken signals.

14. The semiconductor memory device according to claim 13, further comprising:

a reference voltage generating circuit for generating said internal reference voltage based on an external power supply voltage, and providing the generated internal reference voltage to said first signal select circuit.

15. The semiconductor memory device according to claim 9, wherein said signal select circuit includes:

a first signal select circuit for receiving a first period signal for taking write data into said semiconductor memory device and a second period signal for producing an internal period signal having the same frequency as said first period signal, selecting said second period signal instead of said first period signal in accordance with said second select signal sent from said mode setting circuit, and selecting said first period signal instead of said second period signal in accordance with said first select signal sent from said mode setting circuit, a second signal select circuit for receiving an external reference voltage and an internal reference voltage, selecting said internal reference voltage instead of said external reference voltage in accordance with said second select signal sent from said mode setting circuit, and selecting said external reference voltage instead of said internal reference voltage in accordance with said first select signal sent from said mode setting circuit, and a third signal select circuit for receiving a third period signal complementary to said second period signal and a reference signal formed of a reference voltage, selecting said reference signal instead of said third period signal in accordance with said second select signal sent from said mode setting circuit, and selecting said third period signal instead of said reference signal in accordance with said first select signal sent from said mode setting circuit; and said peripheral circuit operates such that:

when said first signal select circuit selects said second period signal, said second signal select circuit selects said internal reference signal and said third signal select circuit selects said reference signal, said peripheral circuit takes signals required for writing and reading said data into and from said plurality of memory cells into said semiconductor memory device by using said internal reference voltage, and performs writing and reading of said write data into and from said plurality of memory cells in synchronization with rising of said second period signal by using said taken signals, and when said first signal select circuit selects said first period signal, said second signal select circuit selects said external reference voltage and said third signal select circuit selects said third period signal, said peripheral circuit takes signals required for writing and reading said data into and from said plurality of memory cells into said semiconductor memory device by using said external reference voltage, and performs writing of said write data into said plurality of memory cells in synchronization with rising and falling of said first period signal as well as reading of said data from said plurality of memory cells in synchronization with rising of said second and third period signals by using said taken signals.

16. The semiconductor memory device according to claim 15, further comprising:

a reference voltage generating circuit for generating said internal reference voltage based on an external power supply voltage, and providing the generated internal reference voltage to said second signal select circuit.

* * * * *